US007986745B2

(12) United States Patent
Hosaka et al.

(10) Patent No.: US 7,986,745 B2
(45) Date of Patent: Jul. 26, 2011

(54) ENCODER APPARATUS AND DECODER APPARATUS

(75) Inventors: Hajime Hosaka, Kanagawa (JP); Kei Ito, Tokyo (JP)

(73) Assignee: Sony Corporation, Tokyo (JP)

( * ) Notice: Subject to any disclaimer, the term of this patent is extended or adjusted under 35 U.S.C. 154(b) by 1526 days.

(21) Appl. No.: 11/220,854

(22) Filed: Sep. 8, 2005

(65) Prior Publication Data

US 2006/0061494 A1 Mar. 23, 2006

(30) Foreign Application Priority Data

Sep. 22, 2004 (JP) ................................ 2004-275454

(51) Int. Cl.
*H04L 25/34* (2006.01)
*H04L 25/49* (2006.01)

(52) U.S. Cl. .......... 375/288; 375/289; 375/292; 341/58; 341/69; 341/70

(58) Field of Classification Search .......... 375/259–264, 375/284–288, 290–293; 341/50, 58, 68–70
See application file for complete search history.

(56) References Cited

U.S. PATENT DOCUMENTS

| | | | |
|---|---|---|---|
| 5,166,956 A * | 11/1992 | Baltus et al. | 375/286 |
| 5,259,002 A * | 11/1993 | Carlstedt | 375/260 |
| 2005/0105349 A1* | 5/2005 | Dahlberg et al. | 365/201 |

FOREIGN PATENT DOCUMENTS

| | | |
|---|---|---|
| JP | 3360861 | 10/2002 |

* cited by examiner

*Primary Examiner* — Dac V Ha
*Assistant Examiner* — James M Perez
(74) *Attorney, Agent, or Firm* — Oblon, Spivak, McClelland, Maier & Neustadt, L.L.P.

(57) ABSTRACT

An encoding apparatus that converts input digital data and an input clock into three-bit six-state transition encode outputs and outputs them is disclosed. The encoding apparatus has a first state transition control section, second state transition control section, and an output selection section. The first state transition control section changes a state of first data at a positive edge of the input clock. The second state transition control section changes a state of second data at a negative edge of the input clock. The output selection section alternately selects the state of the first state transition control section and the second state transition control section.

6 Claims, 54 Drawing Sheets

10

N100 A102 N102 A103 N103 N134 N154 N187 A121 N127 A131 A134 A141 N147 A151 A154 A181 A187 A122 A127 A182 A123 N128 A132 N135 A142 A143 N148 A152 N155 A183 N188 A135 A155 A188 A128 A124 A144 A148 A184 A125 N129 A133 N136 A136 A145 N149 A153 A156 N156 A185 N189 A189 A129 A149 A126 A146 A186 N112 A116 N116 N117 A117 N113 A118 N118 A119 N119

Related Art

Fig. 2

| CURRENT STATE NUMBER S | MODULATION INPUT Di | NEXT STATE NUMBER S+ |
|---|---|---|
| 1 | H | 6 |
| 2 | H | 1 |
| 3 | H | 2 |
| 4 | H | 3 |
| 5 | H | 4 |
| 6 | H | 5 |

Related Art

*Fig. 3*

| CURRENT STATE NUMBER S | MODULATION INPUT Di | NEXT STATE NUMBER S+ |
|---|---|---|
| 1 | L | 2 |
| 2 | L | 3 |
| 3 | L | 4 |
| 4 | L | 5 |
| 5 | L | 6 |
| 6 | L | 1 |

Related Art

Related Art

Fig. 5

| ONE-CLOCK-PERIOD PRIOR STATE NUMBER S- | CURRENT STATE NUMBER S | DEMODULATION OUTPUT Do |
|---|---|---|
| 2 | 1 | H |
| 3 | 2 | H |
| 4 | 3 | H |
| 5 | 4 | H |
| 6 | 5 | H |
| 1 | 6 | H |
| 6 | 1 | L |
| 1 | 2 | L |
| 2 | 3 | L |
| 3 | 4 | L |
| 4 | 5 | L |
| 5 | 6 | L |

Related Art

*Fig. 6*

| CURRENT STATE NUMBER S | RECEIVER OUTPUT | | | OUTPUT OF CLOCK DEMODULATION LOGIC CIRCUIT |
|---|---|---|---|---|
| | Iu | Iv | Iw | |
| 1 | H | L | H | H |
| 2 | H | L | L | L |
| 3 | H | H | L | H |
| 4 | L | H | L | L |
| 5 | L | H | H | H |
| 6 | L | L | H | L |

Related Art

TRANSMITTING
RECEIVING
ENCODER
DRIVER
RECEIVER
DECODER
1
2
3
4
5
6
7
8
9

Fig. 9

| ENCODER OUTPUT N187,N188,N189 | STATE NUMBER N187S |
|---|---|
| (000) | (0) |
| 001 | 1 |
| 011 | 2 |
| 010 | 3 |
| 110 | 4 |
| 100 | 5 |
| 101 | 6 |
| (111) | (7) |

Fig. 12

| INPUT(t-1) N127,N128,N129 | INPUT(t) N127,N128,N129 | CURRENT OUTPUT N147,N148,N149 |
|---|---|---|
| 100 | 110 | 011 |
| 010 | 110 | 101 |
| 110 | 010 | 101 |
| 011 | 010 | 101 |
| 010 | 011 | 101 |
| 001 | 011 | 110 |
| 011 | 001 | 110 |
| 101 | 001 | 110 |
| 001 | 101 | 110 |
| 100 | 101 | 011 |
| 101 | 100 | 011 |
| 110 | 100 | 011 |

Fig. 13

| INPUT(t-1) N147,N148,N149 | INPUT(t) N147,N148,N149 | CURRENT OUTPUT N154,N155,N156 |
|---|---|---|
| 100 | 110 | 001 |
| 010 | 110 | 001 |
| 110 | 010 | 001 |
| 011 | 010 | 100 |
| 010 | 011 | 100 |
| 001 | 011 | 100 |
| 011 | 001 | 100 |
| 101 | 001 | 010 |
| 001 | 101 | 010 |
| 100 | 101 | 010 |
| 101 | 100 | 010 |
| 110 | 100 | 001 |

500
TEST UNIT
N100
N080
N090
10
ENCODER
N100
N112
N113
N187
N188
N189
510
STATE NUMBER
CONVERSION
CIRCUIT
N187
N188
N189
N187S

*Fig. 18*

| ENCODER OUTPUT N397,N398,N399 | STATE NUMBER N397S |
|---|---|
| (000) | (0) |
| 001 | 1 |
| 011 | 2 |
| 010 | 3 |
| 110 | 4 |
| 100 | 5 |
| 101 | 6 |
| (111) | (7) |

502
TEST UNIT
N100
N081 N082 N092 N093
11
ENCODER
N200 N201 N216 N217 N218 N219
N397 N398 N399
511
STATE NUMBER CONVERSION CIRCUIT
N397 N397S
N398
N399

*Fig. 27*

| DRIVER INPUT | | | DRIVER OUTPUT | | |
|---|---|---|---|---|---|
| Ou | Ov | Ow | Or | Os | Ot |
| H | L | H | + | − | 0 |
| H | L | L | + | 0 | − |
| H | H | L | 0 | + | − |
| L | H | L | − | + | 0 |
| L | H | H | − | 0 | + |
| L | L | H | 0 | − | + |

600
TEST UNIT
N000
N080
N092
N093
601
ENCODER
N100
N112
N113
N187
N189
N188
21
DECODER
N901
N902
N903
N983
N938
N939
602
STATE NUMBER
CONVERSION
CIRCUIT
N901
N901S
N902
N903

Fig. 30A

| ENCODER OUTPUT N901,N902,N903 | STATE NUMBER N901S |
|---|---|
| DATA HOLT OUTPUT N924,N922,N926 | STATE NUMBER N922S |
| (000) | (0) |
| 001 | 1 |
| 011 | 2 |
| 010 | 3 |
| 110 | 4 |
| 100 | 5 |
| 101 | 6 |
| (111) | (7) |

Fig. 30B

| DATA HOLD OUTPUT N921,N925,N923 | STATE NUMBER N921S |
|---|---|
| (111) | (0) |
| 110 | 1 |
| 100 | 2 |
| 101 | 3 |
| 001 | 4 |
| 011 | 5 |
| 010 | 6 |
| (000) | (7) |

Fig. 33

| DATA HOLD OUTPUT N924,N922,N926 | STATE NUMBER N922S | DATA HOLD OUTPUT N921,N925,N923 | STATE NUMBER N921S | EVEN>ODD N937 |
|---|---|---|---|---|
| 011 | 2 | 110 | 1 | 0 |
| 011 | 2 | 101 | 3 | 1 |
| 110 | 4 | 101 | 3 | 0 |
| 110 | 4 | 011 | 5 | 1 |
| 101 | 6 | 011 | 5 | 0 |
| 101 | 6 | 110 | 1 | 1 |

600
TEST UNIT
N080
N000 N092
N093
601
ENCODER
N100 N187
N112
N113 N189
N188
21'
DECODER
N901 N983
N902 N996
N903 N997
602
STATE NUMBER CONVERSION CIRCUIT
N901 N901S
N902
N903 encd10147-Transient-0-Graph
Time (s)
200.000n
210.000n
220.000n
230.000n
240.000n
250.000n
260.000n
270.000n
280.000n
290.000n
v(n100) (V)
v(n112) (V)
v(n893) (V)
v(n113) (V)
v(n997) (V)
v(n996) (V)
TIME
v(n996)
N921S
N952S
N901S
N941S
N922S
N983-204
N983-208
N-983-212
N983-216
N983-220
v(n100) 0.0
D(TIME) 0.0
v(n112) 0.0
D(v(n983)) 0.0
v(n983) 0.0
v(n113) 0.0
v(n997) 0.0

21"
N921
N922
N923
N924
N925
N926
N992
N993
N982
N983
A973
A975
A971
A977
N972
N974
N976
A972
A974
A976
A992
A962
A964
A966
A967
N961
N963
N965
A961
A963
A965
A993
A983
A982
A921
A923
A925
A922
A924
A926
N901
N902
N903
N904
N905
N906
N907
N908
N909
A904
A905
A906
A907
A908
A909 encd0143-Transient-1-Graph
200.000n
210.000n
220.000n
230.000n
240.000n
250.000n
260.000n
270.000n
v(n112)
(V)
0.0
v(n993)
(V)
0.0
v(n992)
(V)
0.0
v(n983)
(V)
0.0
v(n113)
(V)
0.0
TIME
N921S
N901S
N922S
v(n112) 0.0 v(n993) 0.0 v(n992) 0.0 v(n983) 0.0 v(n113) 0.0 D(TIME)
N983-216
N983-212
N983-208
N983-204

Fig. 42

| TRANSMISSION LINE INPUT | | | RECEIVER OUTPUT | | |
|---|---|---|---|---|---|
| Ir | Is | It | Ou | Ov | Ow |
| + | − | 0 | H | L | H |
| + | 0 | − | H | L | L |
| 0 | + | − | H | H | L |
| − | + | 0 | L | H | L |
| − | 0 | + | L | H | H |
| 0 | − | + | L | L | H |

Fig. 45A

| ENCODER OUTPUT N801,N802,N803<br>DATA HOLD OUTPUT N824,N822,N826 | STATE NUMBER N801S<br>STATE NUMBER N822S |
|---|---|
| (000) | (0) |
| 001 | 1 |
| 011 | 2 |
| 010 | 3 |
| 110 | 4 |
| 100 | 5 |
| 101 | 6 |
| (111) | (7) |

Fig. 45B

| DATA HOLD OUTPUT N821,N825,N823 | STATE NUMBER N821S |
|---|---|
| (111) | (0) |
| 110 | 1 |
| 100 | 2 |
| 101 | 3 |
| 001 | 4 |
| 011 | 5 |
| 010 | 6 |
| (000) | (7) |

encq10154-Transient-0-Graph
Time (s)
N801S-220
N801S-216
N801S-212
N801S-208
N801S-204
N822S
N801S
N821S
N872S
N852S
N861S
N841S encql0154-Transient-0-Graph
Time (s)
0.0
50.000n
100.000n
150.000n
200.000n
250.000n
300.000n
350.000n
400.000n
450.000n
500.000n
v(n201) (V)
v(n200) (V)
v(n217) (V)
v(n216) (V)
v(n899) (V)
v(n898) (V)
v(n896) (V)
v(n897) (V)
v(n883) (V)
v(n882) (V)
v(n219) (V)
v(n218) (V)
TIME 0.0
v(n898) 0.0
v(n218) 0.0
v(n201) 0.0
v(n896) 0.0
D(TIME) 0.0
v(n200) 0.0
v(n897) 0.0
D(v(n882)) 0.0
v(n217) 0.0
v(n883) 0.0
v(n216) 0.0
v(n882) 0.0
v(n899) 0.0
v(n219) 0.0

605'
TEST UNIT
N081 N082 N092 N093
N000
602
ENCODER
N200 N201 N216 N217 N218 N219
N397 N398 N399
22'
DECODER
N801 N802 N803
N882 N883 N892 N893
606
STATE NUMBER CONVERSION
N801 N802 N803
N801S

N882=1
N883=0
N893=N877
N847=0
N801S=1
N847=1
N801S=3
N801S=5
N801S
=6
N801S
=2
N801S
=4
N882=1
N883=1
N892=N847
N857=0
N801S=2
N857=1
N801S=4
N801S=6
N801S
=1
N801S
=3
N801S
=5
N882=0
N883=1
N893=N857
N867=0
N867=1
N882=0
N883=0
N892=N867
N877=0
N877=1

ENCODER APPARATUS AND DECODER APPARATUS

CROSS REFERENCES TO RELATED APPLICATIONS

The present invention contains subject matter related to Japanese Patent Application JP 2004-275454 filed in the Japanese Patent Office on Sep. 22, 2004, the entire contents of which being incorporated herein by reference.

BACKGROUND OF THE INVENTION

1. Field of the Invention

The present invention relates to an encoder apparatus and a decoder apparatus suitably used to transmit digital data that represent six types of state transitions through three transmission lines.

2. Description of the Related Art

Generally, when data are transmitted between a computer device and peripheral devices, data are transmitted between multiprocessors, a digital video signal is transmitted, digital data are converted into serial data to decrease the number of transmission lines. This system has been widely used as the serial transmission. When the serial transmission system is used, the reception side uses a clock that represents transmission timing of information bits represented by "0's" and "1's" so that the reception side correctly reproduces the information bits transmitted through a transmission line.

When data and a clock are transmitted by the serial transmission, they may be separately transmitted. Instead, they may be chronologically multiplexed and transmitted. When data and a clock are separately transmitted, at least four transmission lines are used. In contrast, when data and a clock are chronologically multiplexed and transmitted, only two or three transmission lines are used. Thus, the latter method is advantageous over the former method of which data and a clock are separately transmitted.

The system of which data and a clock are chronologically multiplexed and transmitted through two transmission lines (hereinafter this system is referred to as the two-line system) has been practically used for example as a system that encodes a clock together with data according to an encoding system called Manchester encoding and that transmits a multiplexed signal through a common transmission line. In the two-line system of the related art, the clock is reproduced using Phase Locked Loop (PLL). Thus, hardware of the demodulating section becomes complicated. In addition, if a more faster communication speed is desired, the PLL cannot follow the clock frequency, thereby preventing the clock from being reproduced.

In a system that uses three transmission lines (hereinafter this system is referred to as the three-line system), data and a clock are represented by three-bit signals made up of one or two "0's" and one or two "1's". In the three-line system, data and a clock are detected by state transitions of three signals transmitted through the three transmission lines. Since the demodulation side does use the PLL, the three-line system allows data to be communicated at higher rate than the two-line system.

On the other hand, since signals in the transmission lines of the three-line system are not balanced, there is a higher possibility of which a problem such as Electro Magnetic Interference (EMI) takes place at a signal change point. When signals of three bits transmitted through three transmission lines change from "100" to "011", a problem such as the EMI tends to take place. To solve this problem, signals are encoded so that the total of voltages of the signals transmitted through the three transmission lines becomes constant before and after the signals change. This cannot be accomplished with two signal states "0" and "1". Thus, three types of voltages are provided. Hereinafter, these signals are referred to as the three-value three-differential logic signals.

Patent Document 1 describes a data transmission method and a transmission device that transmit data with three-value three-differential logic signals. In Patent Document 1, on the transmission side, a modulator samples input serial digital data, converts them into three binary logic signals, converts them into three-value three-differential logic signals, and outputs them to three transmission lines. Conversely, the reception side converts the three-value three-differential logic signals transmitted through the three transmission lines into three binary logic signals. A demodulator restores the three binary logic signals to the original serial data.

[Patent Document 1] Japanese Patent No. 3360861

FIG. 1 shows an example of the structure of the modulator of Patent Document 1. FIG. 2 and FIG. 3 show state transition tables of a modulation logic circuit 102 used in the modulator. The modulator is made up of three D type flip-flops 101*u*, 101*v*, and 101*w* and a modulation logic circuit 102. The three D type flip-flops 101*u*, 101*v*, and 101*w* each have a clock input terminal to which a clock Ci is input. The modulation logic circuit 102 receives serial digital data Di and latch output data DFu, DFv, and DFw of the D type flip-flops 101*u*, 101*v*, and 101*w*. The modulator has six types of output states from state number 1 to state number 6. When the input serial digital data Di are logic "H", as shown in FIG. 2, whenever the clock Ci goes high, the state number is decremented by 1. When the serial digital data Di is logic "L", as shown in FIG. 3, whenever the clock Ci goes high, the state number is incremented by 1. The modulation logic circuit 102 outputs three binary logic signals corresponding to the state numbers.

FIG. 4 shows an example of the structure of the demodulator of Patent Document 1. The demodulator performs a demodulation operation shown in FIG. 5 corresponding to the modulation operation of the modulator 100 and restores the original serial digital data. In the demodulator, a clock reproduction circuit 31 is made up of a clock demodulation logic circuit 32, a differentiation circuit 33, and an absolute value circuit 34. The clock demodulation logic circuit 32 detects whether the logics of the input transmission data Iu, Iv, and Iw are "H" or "L" and outputs logic values corresponding to the current state numbers shown in FIG. 6. The differentiation circuit 33 differentiates outputs of the clock demodulation logic circuit 32 and obtains a change of the clock. The absolute value circuit 34 obtains an leading edge pulse of the differentiation output of the differentiation circuit 33 as a reproduction clock Co.

The clock reproduction circuit 31 supplies the reproduction clock Co reproduced from the input data Iu, Iv, and Iw to clock input terminals of the flip-flops 35*u*, 35*v*, 35*w*, 36*u*, 36*v*, and 36*w* and outputs the reproduction clock Co to the outside of the demodulator. The flip-flops 35*u*, 35*v*, and 35*w* perform latch operations in synchronization with the reproduction clock Co so as to hold the current transmission data Iu, Iv, and Iw for one clock period. Latch output data QMu, QMv, and QMw of the flip-flops 35*u*, 35*v*, and 35*w* are input to data input terminals of the flip-flops 36*u*, 36*v*, and 36*w* and supplied to a demodulation logic circuit 37.

The flip-flops 36*u*, 36*v*, and 36*w* perform latch operations in synchronization with the reproduction clock Co. The flip-flops 36*u*, 36*v*, and 36*w* holds the latch output data QMu, QMv, and QMw of the flip-flops 35*u*, 35*v*, and 35*w* for one more clock period. Latch output data QLu, QLv, and QLw of the flip-flops 36*u*, 36*v*, and 36*w* are supplied to the demodulation logic circuit 37.

The demodulation logic circuit 37 compares the latch output data QMu, QMv, and QMw of the flip-flop 35*u*, 35*v*, and 35*w*, namely current input transmission data, with the latch output data QLu, QLv, and QLw of the flip-flops 36*u*, 36*v*, and 36*w*, namely one-clock-period prior input transmission data to reproduce serial digital data and output them as output data.

SUMMARY OF THE INVENTION

In recent years, as the operation frequency of the central processing unit (CPU) of for example a computer device has increased, higher data transfer rates of the internal bus that connects each parts of the computer device and the external bus that transfers data from the computer device to external devices have been desired.

The modulator 100 of the related art described in Patent Document 1, namely an encoder apparatus, samples input digital data at only leading edges of the clock. In this case, the clock that is input to the encoder apparatus needs to have a frequency twice as high as the transfer rate of input serial digital data. Thus, the logic circuits and latches of the encoder apparatus cannot be fully used for their upper limits of their operation frequencies. Consequently, the increase of the clock frequency of the encoded output signal is limited.

In addition, the demodulator 30 described in Patent Document 1, namely a decoder apparatus, uses the differentiation circuit 33 to reproduce the clock Co with the input data Iu, Iv, and Iw. Thus, the transmission band of serial digital data is restricted depending on a time constant of the differentiation circuit 33. As a result, the transmission band of data cannot be freely selected.

In addition, in the demodulator 30 of the related art, the flip-flops, which are edge triggered, directly sample input data with a trigger of the reproduced clock Co. Thus, since the minimum inversion period of input data is short, the margins of the setup time and hold time of flip-flops that sample input data are small.

In view of the foregoing, it would be desirable to provide an encoder apparatus and a decoder apparatus that allow the transmission rate to be increased when digital data that represent six types of state transitions are transmitted through three transmission lines.

According to an embodiment of the present invention, there is provided an encoding apparatus that converts input digital data and an input clock into three-bit six-state transition encode outputs and outputs them. The encoding apparatus has a first state transition control section, a second state transition control section, and an output selection section. The first state transition control section changes a state of first data at a positive edge of the input clock. The second state transition control section changes a state of second data at a negative edge of the input clock. The output selection section alternately selects the state of the first state transition control section and the second state transition control section.

According to an embodiment of the present invention, there is provided an encoding apparatus that converts input digital data and an input clock into three-bit six-state transition encode outputs. The encoding apparatus has a first state transition control section, a second state transition control section, a third state transition control section, a fourth state transition control section, and an output selection section. The first state transition control section changes the internal state corresponding to first data at a positive edge of a first input clock added to input data. The second state transition control section changes the internal state corresponding to second data at a positive edge of a second input clock whose phase delays by around 90 degrees against the first input clock. The third state transition control section changes the internal state corresponding to third data at a negative edge of the first input clock. The fourth state transition control section changes the internal state corresponding to fourth data at a negative edge of the second input clock. The output selection section successively changes outputs of the first, second, third, and fourth state transition control section and outputting them to the encode outputs.

According to an embodiment of the present invention, there is provided a decoding apparatus that separates signals of which data and a clock have been encoded corresponding to state transitions of one bit of six states represented by three bits and transmitted through three transmission lines into data and a clock and reproduces them. The decoding apparatus has a clock reproduction section, a data hold section, a state transition determination section, and a decode output section. The clock reproduction section inverts the state of the three-bit input data and outputting the reproduced clock. The data hold section holds an immediately preceding state whenever the state of the input data changes more than one time. The state transition determination section compares a plurality of states with past states held by the data hold section and determining a state transition of the input data corresponding to the compared result. The decode output section that alternately outputs the first and second data updated whenever a state transitions twice corresponding to the determined result of the state transition determination section.

According to an embodiment of the present invention, there is provided a decoding apparatus that separates signals of which data and a clock have been encoded corresponding to state transitions of one bit of six states represented by three bits and transmitted through three transmission lines into data and a clock and reproduces them. The decoding apparatus has a clock reproduction section, a data hold section, and a state transition determination section. The clock reproduction section inverts the state of the three-bit input data and outputting a first reproduced clock and a second reproduced clock whose values are inverted whenever the state of the three-bit input data changes twice. The data hold section that holds an immediately preceding state whenever the state of the input data changes more than one time. The state transition determination section that compares a plurality of states with past states held by the data hold section and determining a state transition of the input data corresponding to the compared result. A plurality of decode outputs are sampled with the first reproduced clock and the second reproduced clock corresponding to the determined result of the state transition determination section.

According to an embodiment of the present invention, since input data are sampled at both positive and negative edges of a clock, even if the maximum operation frequencies of logic circuits and latch circuits are the same, data can be transmitted at higher speed.

In addition, since three-bit latch circuits that are stable in three states are used, an initialization circuit can be omitted. In addition, an improper state transition due to noise or the like can be suppressed.

In addition, since data inputs of two systems are independent, timing margins of latches can be increased.

According to an embodiment of the present invention, input data are sampled at both positive and negative edges of first and second clocks. With the same logic circuits, the logic circuits can be operated at higher speed. Since low speed logic circuits can be used, the power consumption and cost can be reduced.

In addition, since input data are sampled at positive and negative edges of first and second clocks, a period in which signals do not change before and after they are sampled becomes long. Thus, a wider timing margin can be obtained.

According to an embodiment of the present invention, since a decoding apparatus can be made up of only regular digital circuits, it is not necessary to use a differentiation circuit that reproduces a clock and other circuits. Thus, the decode transmission speed becomes wider.

In addition, since encode data are input to data hold circuits before they are sampled, the minimum inversion interval of a signal to be sampled becomes long. As a result, the timing margin increases. When the operation speeds of the logic circuits, latch circuits, and so forth are the same, the maximum transmission band becomes wider. When the maximum transmission band is the same, a decoder can be made up of logic circuits that operate at lower speed. As a result, the power consumption and cost of the decoder can be reduced.

In addition, since intermediate latch circuits that latch outputs of data hold circuits that hold input data with a clock are disposed, the internal timing margin increases. As a result, regardless of whether the delays of combination circuits that determine a state transition are large or small, the decode operation can be stably preformed.

In addition, three-bit three-stable latch circuits that keep stable in three states are used for data hold circuits that input data, an improper state transition due to noise or the like can be suppressed.

Since inputs and outputs of data hold circuits that hold input data, inputs and outputs of combination logic circuits, and inputs and outputs of latch circuits are differential, a decrease of the timing margin due to internal asymmetry of logic circuits and latch circuits (for example, asymmetry of a leading time and a trailing time of the clock, asymmetry of a leading drive performance and a trailing drive performance of the clock) can be minimized.

According to the fourth embodiment and the modification of the fourth embodiment, the decoder 22 and the decoder 22' are made up of only ordinary digital circuits. Thus, it is not necessary to use a differentiation circuit that reproduces a clock and other circuits. As a result, the range of a decodable transmission speed becomes wide.

In addition, since encode data are input to a data hold circuit before they are sampled, the minimum inversion interval of a signal to be sampled becomes long. As a result, the timing margin increases. When the operation speeds of the logic circuits, the latch circuits, and so forth are the same, the maximum transmission band becomes wider. When the maximum transmission band is the same, the decoder can be made up of logic circuits that operate at lower speed. As a result, the power consumption and cost of the decoder can be reduced.

In addition, since intermediate latch circuits that latch outputs of data hold circuits that hold input data with a clock are disposed, the internal timing margin increases. As a result, regardless of whether the delays of combination logic circuits that are necessary to determine a state transition are large or small, the decode operation can be stably performed.

In addition, since three-bit three-stable latch circuits that keep stable in three states are used for data hold circuits that hold input data, an improper state transition due to noise or the like can be suppressed.

Since inputs and outputs of data hold circuits that hold input data, inputs and outputs of combination logic circuits, and inputs and outputs of latch circuits are differential, a decrease of the timing margin due to internal asymmetry of logic circuits and latch circuits (for example, asymmetry of a leading time and a trailing time of the clock, asymmetry of a leading drive performance and a trailing drive performance of the clock) can be minimized.

These and other objects, features and advantages of the present invention will become more apparent in light of the following detailed description of a best mode embodiment thereof, as illustrated in the accompanying drawings.

BRIEF DESCRIPTION OF THE DRAWINGS

The invention will become more fully understood from the following detailed description, taken in conjunction with the accompanying drawing, wherein similar reference numerals denote similar elements, in which:

FIG. 2 is a schematic diagram showing a state transition table of a modulation logic circuit used in the modulator according to the related art;

FIG. 3 is a schematic diagram showing a state transition table of the modulation logic circuit used in the modulator according to the related art;

FIG. 5 is a schematic diagram showing a state transition table of the demodulator according to the related art;

FIG. 6 is a schematic diagram showing a state transition table of the demodulator according to the related art;

FIG. 9 is a schematic diagram showing an example of a truth table of a state number conversion circuit;

FIG. 12 is a schematic diagram showing a truth table of a first three-stable sequential logic circuit made up of NAND gates;

FIG. 13 is a schematic diagram showing a truth table of a second three-stable sequential logic circuit made up of NOR gates;

FIG. 18 is a schematic diagram showing an example of a truth table of a state number conversion circuit;

FIG. 27 is a schematic diagram showing a truth table of inputs and outputs of a differential driver device;

FIG. 30A and FIG. 30B are a schematic diagram showing an example of a truth table of a state number conversion circuit and a schematic diagram showing a truth table that converts a hold output as an internal state of the decoder to a state number;

FIG. 33 is a schematic diagram showing an example of a truth table of a second combination logic circuit;

FIG. 42 is a schematic diagram showing a truth table of inputs and outputs of the differential receiver device;

FIG. 45A and FIG. 45B are schematic diagrams showing examples of truth tables of a state number conversion circuit;

DETAILED DESCRIPTION OF THE PREFERRED EMBODIMENTS

Next, embodiments of the present invention will be described in the following order.

Figure 7:
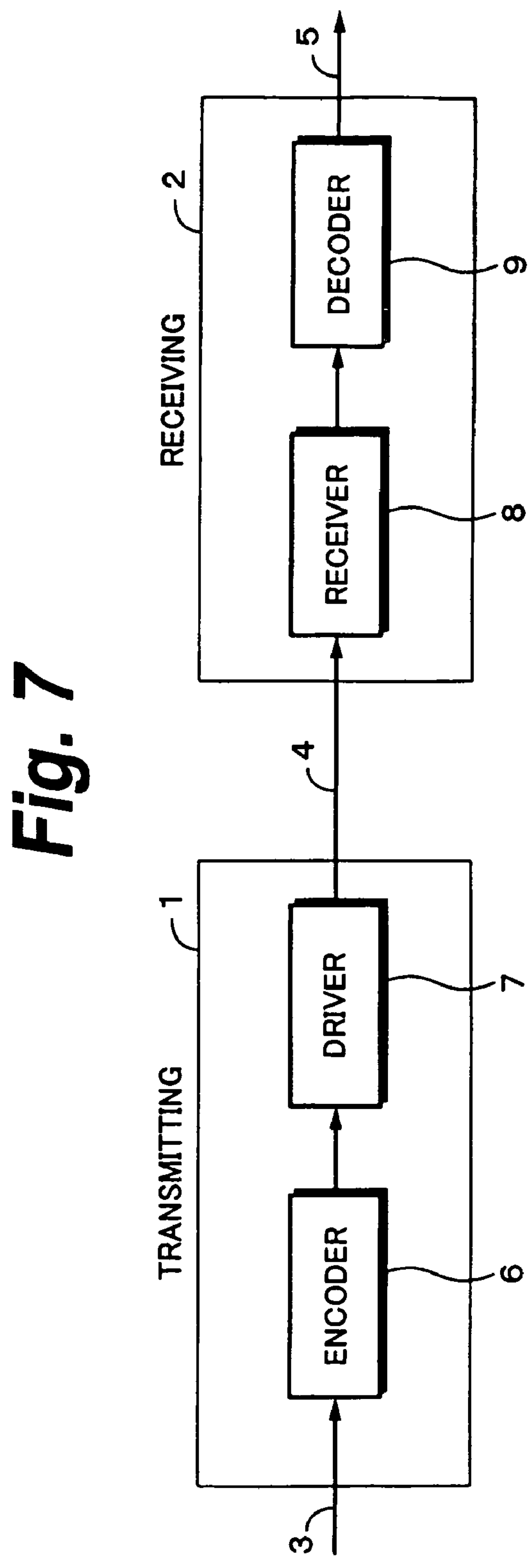
FIG. 7 is a block diagram showing an example of the system structure according to an embodiment of the present invention.

1. Outline of System According to Embodiment of Present Invention 2-1. First Embodiment of Present Invention
- 2-1-1. Simulation Model
- 2-1-2. Structure of Encoder
- 2-1-3. Operation of Encoder 2-2. Modification of First Embodiment of Present Invention 3-1. Second Embodiment
- 3-1-1. Simulation Model
- 3-1-2. Structure of Encoder
- 3-1-3. Operation of Encoder 3-2. Modification of Second Embodiment of Present Invention 3-3. Supplement of First and Second Embodiments 4-1. Third Embodiment of Present Invention
- 4-1-1. Simulation Model
- 4-1-2. Structure of Decoder
- 4-1-3. Operation of Decoder 4-2. Modification of Third Embodiment of Present Invention
- 4-2-1. Structure of Decoder 4-2-2. Operation of Decoder
4-3. Another Modification of Third Embodiment of Present Invention
4-4. Supplement of Third Embodiment of Present Invention
5-1. Fourth Embodiment of Present Invention
5-1-1. Simulation Model
5-1-2. Structure of Decoder
5-1-3. Operation of Decoder
5-2. Modification of Fourth Embodiment of Present Invention
5-2-1. Simulation Model
5-2-2. Structure of Decoder
5-2-3. Operation of Decoder
5-3. Supplement of Fourth Embodiment of Present Invention 1. Outline of System According to Embodiment of Present Invention First, with reference to FIG. 7, an example of the structure of a system according to an embodiment of the present invention will be described. A serial digital signal 3 having a data width of for example one bit is input to a transmitting device 1. The serial digital signal 3 is converted into three sets of binary logic signals by an encoder 6 of the transmitting device 1 of a first embodiment, a modification of the first embodiment and a second embodiment of the present invention. At this point, the encoder 6 converts the serial digital signal 3 into three-bit signals made up of three sets of binary logic signals that are one or two "0's" and one or two "1's" so that the three bits do not become the same values at the same time.

An output of the encoder 6 is supplied to a driver 7. The driver 7 converts the supplied three sets of binary logic signals into three-value three-differential logic signals. The three-value three-differential logic signals are three types of signals having three types of voltages that are a low level, an intermediate level, and a high level that are transmitted through three transmission lines. Whenever the state of an input signal changes, two of the three voltages are replaced.

The three-value three-differential logic signals that are output from the driver 7 are transmitted to a receiving device 2 through a transmission path 4 made up of three transmission lines. The receiving device 2 receives transmitted signals and supplies the received signals to a receiver 8. The receiver 8 removes a common mode voltage that has been variably added to the transmission path 4 from the received signals. The receiver 8 performs the reverse operation of the driver 7. In addition, the receiver 8 extracts a clock from the received three-value three-differential logic signals, converts the three-value three-differential logic signals into three sets of binary logic signals, and outputs them. An output of the receiver 8 is supplied to a decoder 9 of a third embodiment, first and second modifications of the third embodiment, a fourth embodiment, and a modification of the fourth embodiment of the present invention. The decoder 9 decodes the supplied three sets of binary logic signals and obtains original serial digital signal 5 having a data width of one bit and outputs the original serial digital signal 5.

2-1. First Embodiment of Present Invention

Next, the first embodiment of the present invention will be described. According to the first embodiment, an encoder 10 corresponding to the encoder 6 shown in FIG. 7 samples two-phase serial digital data at both leading edges and trailing edges of a clock and transmits the data that represent six types of state transitions through three transmission lines.

2-1-1. Simulation Model

Figure 8:
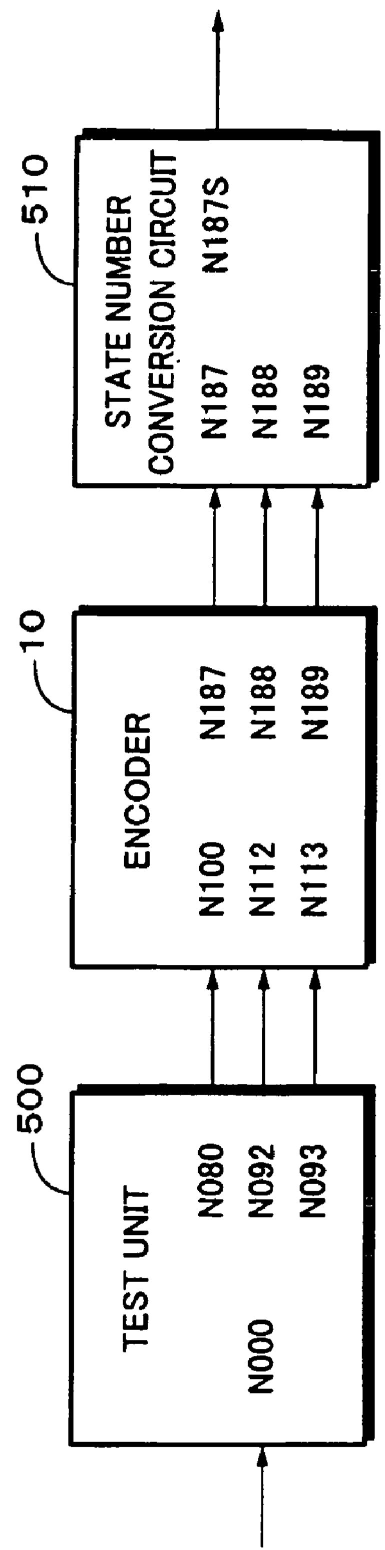
FIG. 8 is a block diagram showing an outline of a simulation model used to verify the operation of an encoder according to a first embodiment of the present invention.

FIG. 8 shows an outline of a simulation model used to verify the operation of the encoder 10 of the first embodiment of the present invention. A test unit 500 generates a clock signal N800 that operates the encoder 10. In addition, the test unit 500 generates data signals N092 and N093 corresponding to pseudo random numbers. The pseudo random numbers are alternately sampled and the data signals N092 and N093 are transmitted in synchronization with reverse edges of a clock N080. The clock N080 is added to a clock input N100 of the encoder 10. The data signals N092 and N093 are added to data inputs N112 and N113 of the encoder 10, respectively.

Since outputs N187 to N189 of the encoder 10 are input to a state number conversion circuit 510 that generates an operation description state number, a state number output N187S of the state number conversion circuit 510 is obtained. As will be described later, the state number is an integer number ranging from "1" to "6". Whenever the state transitions, the state number is incremented or decremented by 1. If the state number is "6", when it is incremented by "1", the state number becomes "1". If the state number is "1", when it is decremented by 1, the state number becomes "6".

FIG. 9 shows an example of a truth table of the state number conversion circuit 510. When three bits (x, x, x), which represent six states, are input to the state number conversion circuit 510, it converts the input six states into state numbers "1" to "6" and outputs them. In this example, when the three bits are (0, 0, 1), they represent state number "1". When the three bits are (0, 1, 1), they represent state number "2". When the three bits are (0, 1, 0), they represent state number "3". When the three bits are (1, 1, 0), they represent state number "4". When the three bits are (1, 0, 0), they represent state number "5". When the three bits are (1, 0, 1), they represent state number "6". In FIG. 9, when the state number is "0", the three bits are (0, 0, 0). When the state number is "7", the three bits are (1, 1, 1). However, states of which these three bits are the same value are not used.

In the description of the embodiments of the present invention, state numbers and state number conversion circuit are used to describe waveforms of simulation results. Operations of each encoder and each decoder are performed corresponding to original three bits that are converted into state numbers.

Figure 10:
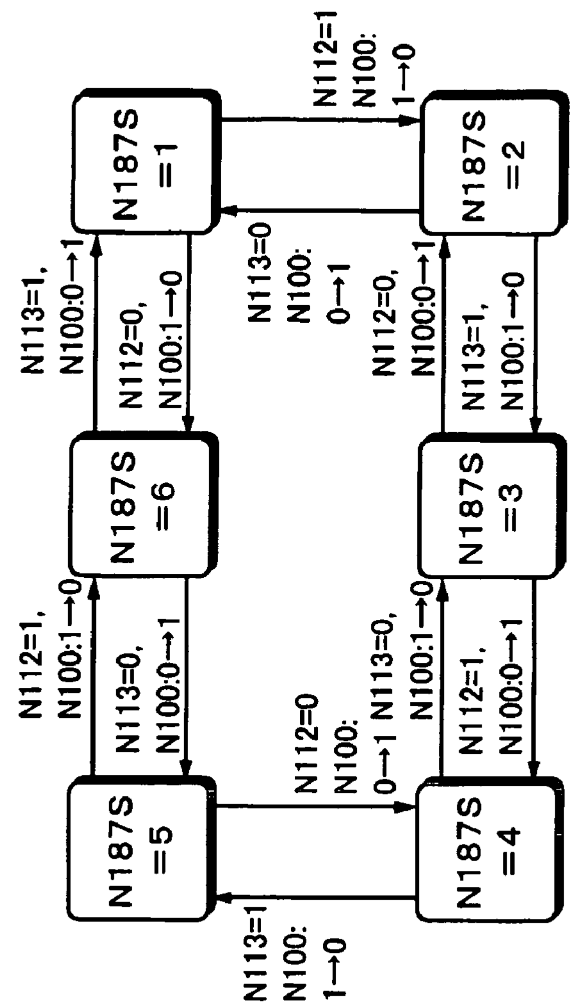
FIG. 10 is a schematic diagram showing a three-bit six-state transition chart according to the first embodiment of the present invention.

FIG. 10 shows a state transition chart showing three bits and six states according to the first embodiment of the present invention. When the clock input N100 goes high (represented by "0→1" in FIG. 10, and this representation applies to other state transition charts) and the data input N112 is sampled, the state number of the output changes from an odd number to an even number. When the data input N112 is "1", the state number is incremented from state number N187S=3 to state number N187S=4. When the data input N112 is "0", the state number is decremented from state number N187S=3 to state number N187S=2 and from state number N187S=5 to state number N187S=4.

When the clock input N100 goes low (represented by "1→0" in FIG. 10, and this representation applies to other state transition charts) and the data input N113 is sampled, the state number changes from an even number to an odd number. When the data input N113 is "1", the state number is incremented from state number N187S=2 to state number N187S=3 and from state number N187S=4 to N187S=5. When the data input N113 is "0", the state number is decremented from state number N187S=4 to state number N187S=3.

2-1-2. Structure of Encoder

Figure 11:
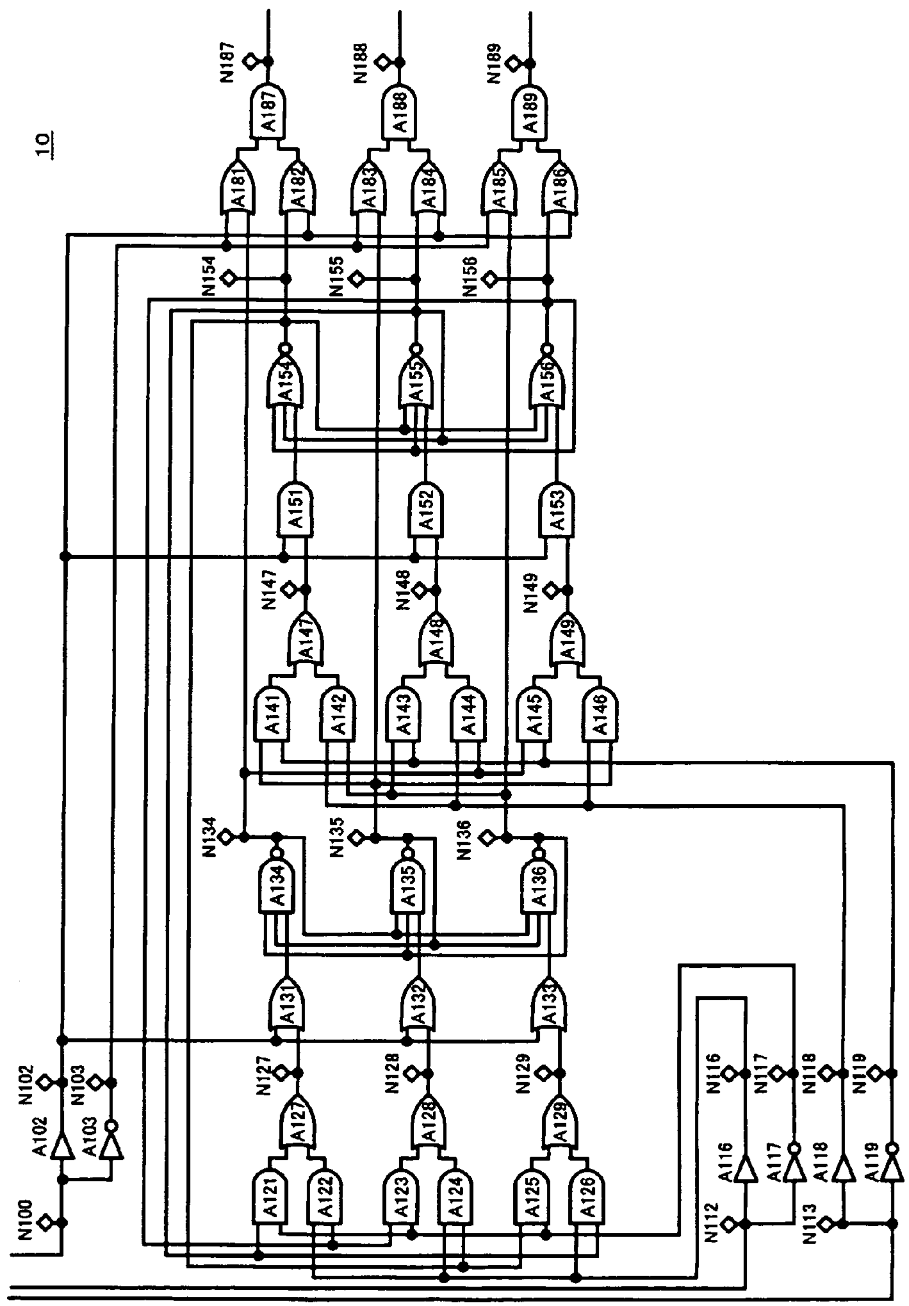
FIG. 11 is a circuit diagram showing an example of the circuit of an encoder according to the first embodiment of the present invention.

FIG. 11 shows an example of the circuit of the encoder 10 according to the first embodiment of the present invention. The encoder 10 inputs the data inputs N112 and N113 and the one-bit clock input N100 that uses positive and negative edges and performs an encode process for them. The encoded result is output as three-bit data to encoder outputs N187, N188, and N189.

The encoder 10 is made up of a first three-bit two-input one-output multiplexer, a first three-bit latch, a second three-bit two-input one-output multiplexer, a second three-bit latch, and a third three-bit two-input one-output multiplexer. The first three-bit latch and the second three-bit latch alternately becomes the hold state at timings of leading edges and trailing edges of the clock input N100.

The first three-bit two-input one-output multiplexer and the first three-bit latch make up a first state transition section. The first state transition section changes the state at leading edges of the clock input N100. The first state transition section changes the states of the three-bit signals N154 to N156 in the direction corresponding to the value of the data input 112, holds the states corresponding to the clock, inverts the results, and outputs the inverted results to the first latch outputs N134 to N136.

The first three-bit two-input one-output multiplexer is a first combination logic circuit made up of AND gates A121 to A126 and OR gates A127 to A129. Since one of the data input N112 and N113, which are selectable inputs, is always "1", they function as a multiplexer. Thus, a combination of inputs and outputs varies. An output of the first three-bit two-input one-output multiplexer is supplied to the first three-bit latch.

The first three-bit latch is a three-bit three-stable NAND type transparent latch and is made up of OR gates A131 to A133 and NAND gates A134 to A136. The first three-bit latch is made up by adding a hold circuit made up of the OR gates A131 to A133 to an input of a first three-stable sequential logic circuit made up of the three NAND gates A134 to A136. FIG. 12 shows a truth table of the three-stable sequential logic circuit made up of the NAND gates A134 to A136. The truth table shows the relationship of current input states (t) and immediately preceding input states (t−1) of data N127 to N129 and output states of data outputs N147 to N149 when a clock N102 supplied to the OR gates A131 to A133 is "0" (enabled).

When the clock N102 is enabled and any two of the data N127 to N129 are "0", the first three-stable sequential logic circuit outputs inverted signals of the inputs as data outputs N147 to N149. When one of two values "0's" of the data N127 to N129 changes from "0" to "1" and the number of "0's" of the values of the data N127 to N129 changes from "2" to "1", the first three-stable sequential logic circuit holds the immediately preceding state. In contrast, when the number of "0's" of the values of the data N127 to N129 changes from "1" to "2", the first three-stable sequential logic circuit outputs inverted signals of the inputs to the data outputs N147 to N149. Thus, the first three-stable sequential logic circuit can obtain three stable states (0, 1, 1), (1, 0, 1), and (1, 1, 0) as output states shown in the truth table.

When the clock N102 supplied to the OR gates A131 to A133 changes from "0" to "1", the first three-stable sequential logic circuit holds the stable state. When the first three-stable sequential logic circuits holes the stable state, it holds one of three stable states of which only one of the three outputs of the data outputs N147 to N149 is "0" and the other two are "1". When the clock N102 is enabled, the first three-stable sequential logic circuit operates according to the truth table shown in FIG. 12. When only one bit of the data inputs N127 to N129 is "0" and the other two are "1's", the first three-stable sequential logic circuit inverts the values of the data inputs N127 to N129 and output them as data outputs N134 to N136, respectively.

The outputs of the first three-bit latch are supplied to the second three-bit two-input one-output multiplexer and the third three-bit two-input one-output multiplexer.

The second three-bit two-input one-output multiplexer and the second three-bit latch make up a second state transition section. The second state transition section changes states at a leading edge of the clock input N100. The second state transition section changes the states of the three-bit signals N134 to N136 in the direction corresponding to the value of the data input 113, holds the results at an edge of the clock, inverts the result, and outputs the inverted result to first latch outputs N154 to N156.

The second three-bit two-input one-output multiplexer is a second combination logic circuit and is made up of AND gates A141 to A146 and OR gates A147 to A149. Since only one of the data inputs N112 and N113, which are selectable inputs, is always "1", the second three-bit two-input one-output multiplexer functions as a multiplexer and changes a combination of inputs and outputs. An output of the second three-bit two-input one-output multiplexer is supplied to the second three-bit latch.

The second three-bit latch is a three-bit three-stable NOR type transparent latch and is made up of AND gates A151 to A153 and NOR gates A154 to A156. The first three-bit latch is made up by adding a hold circuit made up of the AND gates A151 to A153 to an input of the second three-stable sequential logic circuit made up of the three NOR gates A154 to A156. The second three-bit obtains an output of which the logic of the first three-bit latch is inverted. FIG. 13 shows a truth table of the second three-stable sequential logic circuit made up of the NOR gates A154 to A156. The truth table represents the relationship of the current input states (t) and the immediately preceding input states (t−1) of the AND gates A151 to A153 and output states of the data outputs N154 to N156 when the clock N102 supplied to the AND gates A151 to A153 is "0" (enabled).

When the clock N102 is enabled and any two values of the data N147 to N149 are "1's", the second three-stable sequential logic circuit outputs inverted signals of inputs corresponding to the data outputs N154 to N156. When one of the two values "1's" of the data N147 to N149 changes from "0" to "1" and the number of "1's" of the data N147 to N149 changes from "2" to "1", the second three-stable sequential logic circuit holds the immediately preceding state. In contrast, when the number of "0's" of the data N147 to N149 changes from "1" to "2", the second three-stable sequential logic circuit outputs inverted signals of inputs to the data outputs N154 to N156. The second three-stable sequential logic circuit can obtain three stable three states (0, 0, 1), (0, 1, 0), and (1, 0, 0) as output states shown in the truth table.

When the clock N102 supplied to the AND gates A151 to A153 changes from "1" to "0", the second three-stable sequential logic circuit holds the stable state. When the second three-stable sequential logic circuit holds the stable state, it holds one of three stable states of which one of the data outputs N154 to N156 is "1" and the other two are "0". When the clock N102 is enabled, the second three-stable sequential logic circuit operates according to the truth table shown in FIG. 13. When only one bit of the data inputs N147 to N149 is "1" and the other two bits are "0", the second three-stable sequential logic circuit inverts the values of the data inputs N147 to N149 and outputs them as data outputs N154 to N156.

An output of the second three-bit latch is supplied to the third three-bit two-input one-output multiplexer and the first three-bit two-input one-output multiplexer.

The third three-bit two-input one-output multiplexer is a third combination logic circuit and is made up of OR gates A181 to A186 and AND gates A187 to A189. The third three-bit two-input one-output multiplexer makes up an output selection section. The third three-bit two-input one-output multiplexer selects one of an output of the first three-bit latch and an output of the second three-bit latch whichever it changes later according to the clocks N102 and N103 and supplies the selected output to the encode outputs N187 to N189 as the last outputs of the encoder 10.

As shown in FIG. 8, a predetermined state number conversion circuit converts the encode outputs N187 to N189 to a corresponding state number N187S.

2-1-3. Operation of Encoder

Figure 14:
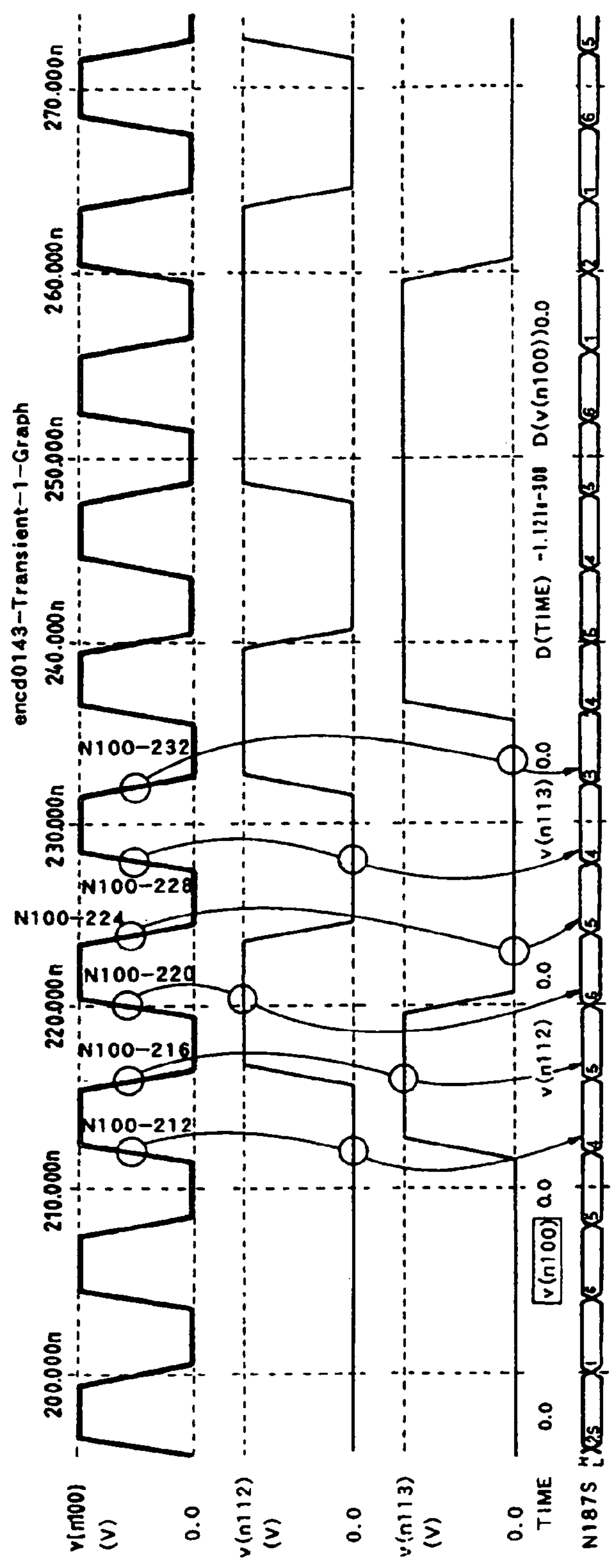
FIG. 14 is a timing chart describing an example of an operation of the encoder.

Next, with reference to a timing chart shown in FIG. 14, an example of the operation of the encoder 10 will be described. The timing chart shown in FIG. 14 and other timing charts described in the embodiments of the present invention are obtained by simulating the operation of each circuit of the encoder 10 using software B2Spice A/D Release 4.26, Baige Bag Software and XSpice digital gate model accompanied thereby. The delays of all the accompanied digital gate models are 100 ps.

The timing chart plots the relationship of a voltage v (n100) of the input clock input N100 of the encoder 10, a voltage v (n112) of the data input N112, a voltage v (n113) of the data input N13, state number N187S corresponding to the data outputs N187 to N189 that are output from the encoder 10, and the time axis. State number N187S changes according to the state transition chart shown in FIG. 9.

At timing of a leading edge N100-212 of the clock input N100, the data input 112 is sampled. The sampled result is logic "0". Thus, the immediately preceding state number N187S is decremented from "5" by "1". Thus, state number N187S becomes "4". At timing of the next trailing edge N100-216 of the clock input N100, the data input N113 is sampled. The sampled result is logic "1". Thus, the immediately preceding state number N187S is decremented from "4" by "1". As a result, state number N187S becomes "5".

At timing of the next leading edge N100-220 of the clock input N100, the data input N112 is sampled. The sampled result is logic "1". Thus, the immediately preceded state number N187S is incremented from "5" by "1". Thus, the state number becomes "6". At timing of the next trailing edge N100-224 of the clock input N100, the data input N113 is sampled. The sampled result is logic "0". Thus, the immediately preceding state number N187S "6" is decremented from "6" by 1. As a result, state number N187S becomes "5".

The encoder 10 repeats the sampling and state transitions so as to cause the sequential logic circuit to perform an encode operation.

2-2. Modification of First Embodiment of Present Invention

Figure 15:
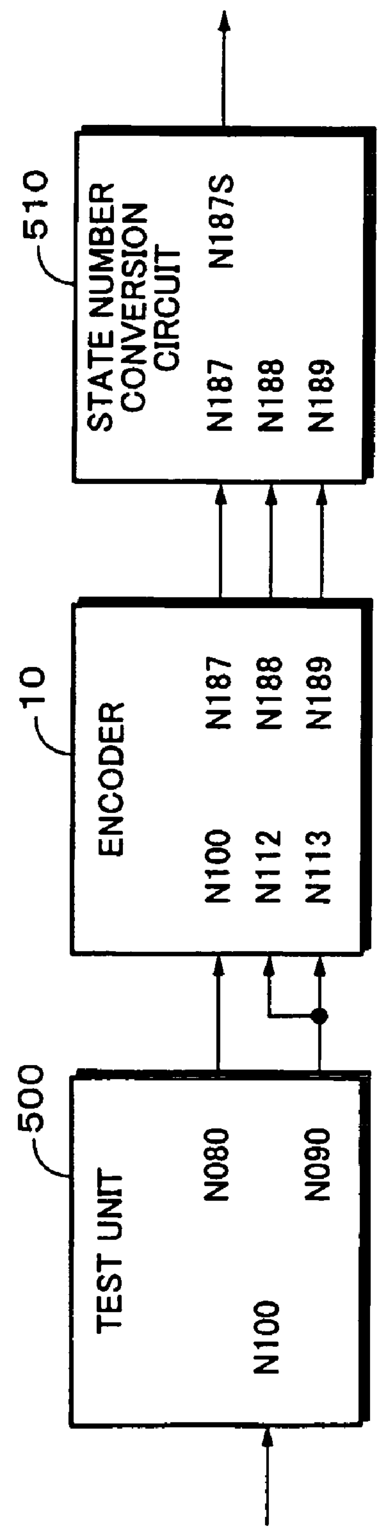
FIG. 15 is a block diagram showing an outline of another simulation model according to a modification of the first embodiment of the present invention.

Next, a modification of the first embodiment of the present invention will be described. This modification is an example of which another simulation model is used in the encoder 10 of the first embodiment of the present invention. FIG. 15 shows an outline of the other simulation model according to the modification of the first embodiment of the present invention. The structural elements of the other simulation model are the same as those of the simulation model shown in FIG. 8. An encoder of the modification of the first embodiment is the same as that shown in FIG. 11. In the other simulation model shown in FIG. 15, in a test unit 500, a data output N090 from which one-bit pseudo random numbers are extracted is connected to data inputs N112 and N113 of the encoder 10 in common. The data output N090 is output at timing pseudo random numbers are sampled at positive and negative edges of the clock N080.

Figure 16:
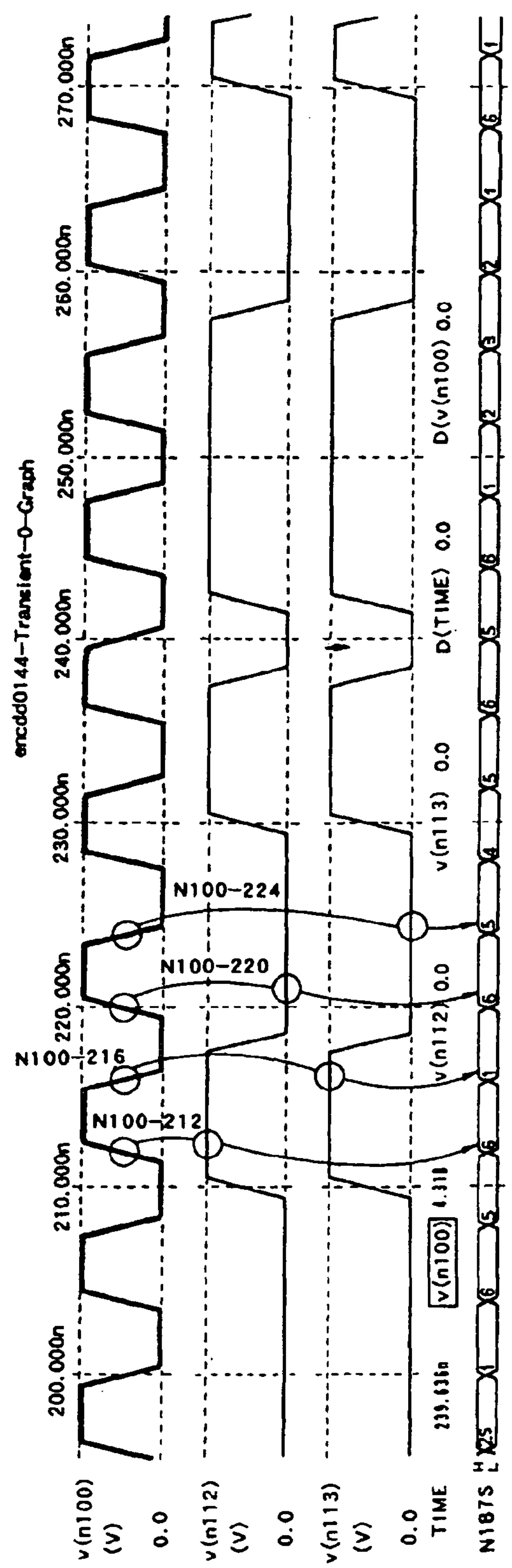
FIG. 16 is a timing chart describing an example of the operation of the encoder in the case of the other simulation model according to the modification of the first embodiment of the present invention.

FIG. 16 is a timing chart showing an example of a simulation result of an operation of the encoder 10 using the other simulation model and the foregoing simulation software. Like the timing chart shown in FIG. 14, the timing chart shown in FIG. 16 plots the voltage v (n100) of the input clock input N100 of the encoder 10, the voltage v (n112) of the data input N112, the voltage v (n113) of the data input N113, and the encoder, state number N187S corresponding to the data outputs N187 to N189 of the encoder 10, and the time axis. State number N187S changes according to the state transition chart shown in FIG. 9.

In FIG. 16, at timing of the leading edge N100-212 of the clock input N100, the data input N112 is sampled. Since the sampled result is logic "1", state number N187S is incremented from "5" by "1". As a result, state number N187S becomes "6". At timing of the next trailing edge N100-216 of the clock input N100, the data input N113 in common with the data input N112 is sampled. The sampled result is logic "1". Thus, state number N187S is incremented from "6" by "1". As a result, the state number becomes "1".

At timing of the next leading edge N100-220 of the clock input N100, the data N112 is sampled. Since the sampled result is logic "0", state number N187S is decremented from "1" by "1". Thus, state number N187S becomes "6". At timing of the next trailing edge N100-224 of the clock input N100, the data input 113 is sampled. Since the sampled result is logic "0", state number N187S is decremented from "6" by "1". As a result, state number N187S becomes "5".

The encoder 10 repeats the sampling and state transitions to cause the first and second three-stable sequential logic circuit to perform the encode operation.

According to the first embodiment of the present invention and the modification of the first embodiment, since input data are sampled at positive and negative edges of a clock, even if the maximum operation frequencies of logic circuits and latch circuits are the same, data can be transmitted at higher speed.

In addition, since three-bit latch circuits that are stable in three states are used, it is not necessary to use an initialization circuit. In addition, an improper state transition due to noise or the like can be suppressed.

In addition, since data inputs of two systems are independently disposed, timing margins of latches can be increased.

3-1. Second Embodiment

Next, a second embodiment of the present invention will be described. According to the second embodiment of the present invention, an encoder 11 (see FIG. 17) corresponding to the encoder 6 shown in FIG. 7 samples data at both leading edges and trailing edges of two clocks whose phases are different by 90 degrees and transmits data that represent six types of state transitions through three transmission lines.

3-1-1. Simulation Model

Figure 17:
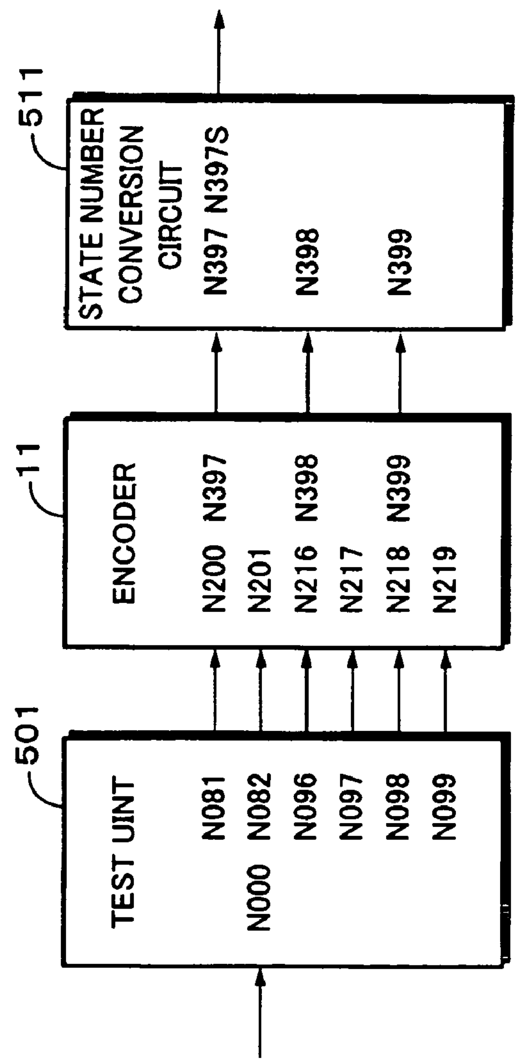
FIG. 17 is a block diagram showing an outline of a simulation model used to verify an operation of an encoder according to a second embodiment of the present invention.

FIG. 17 shows an outline of a simulation model used to verify the operation of the encoder 11 according to the second embodiment of the present invention. A test unit 501 generates clock signals N081 and N082 whose phases are different by 90 degrees to operate the encoder 11. In addition, the test unit 501 generates data signals N096, N097, N098, and N099 corresponding to pseudo random numbers. The clock signals N081 and N092 are added to clock inputs N200 and N201 of the encoder 11. The data signals N096, N097, N098, and N099 are added to data inputs N216, N217, N218, and N219 of the encoder 11.

When outputs N397, N398, and N399 of the encoder 11 are input to a state number conversion circuit 511 that generates an operation description state number, a state number output NN397 of the state number conversion circuit 511 is obtained. The state number will be described later. The state number is an integer number ranging from “1” to “6”. Whenever the state transitions, the state number is incremented or decremented by “1”. When the state number is “6”, if it is incremented by “1”, it becomes “1”. When the state number is “1”, if it is decremented by “1”, it becomes “6”.

FIG. 18 shows an example of a truth table of the state number conversion circuit 511. The state number conversion circuit 511 performs the same conversion as the state number conversion circuit 510 of the first embodiment. In other words, when three bits (x, x, x) that represent six states are input to the state number conversion circuit 511, it converts the input six states into state numbers ranging from “1” to “6” and outputs the state numbers. In the example, when the three bits are (0, 0, 1), they represent state number “1”. When the three bits are (0, 1, 1), they represent state number “2”. When the three bits are (0, 1, 0), they represent state number “3”. When the three bits are (1, 1, 0), they represent state number “4”. When the three bits are (1, 0, 0), they represent state number “5”. When the three bits are (1, 0, 1), they represent state number “6”. In FIG. 18, when the state number “0”, the three bits are (0, 0, 0). When the state number “7”, the three bits are (1, 1, 1). However, states of which all three bits are the same are not used.

Figure 19:
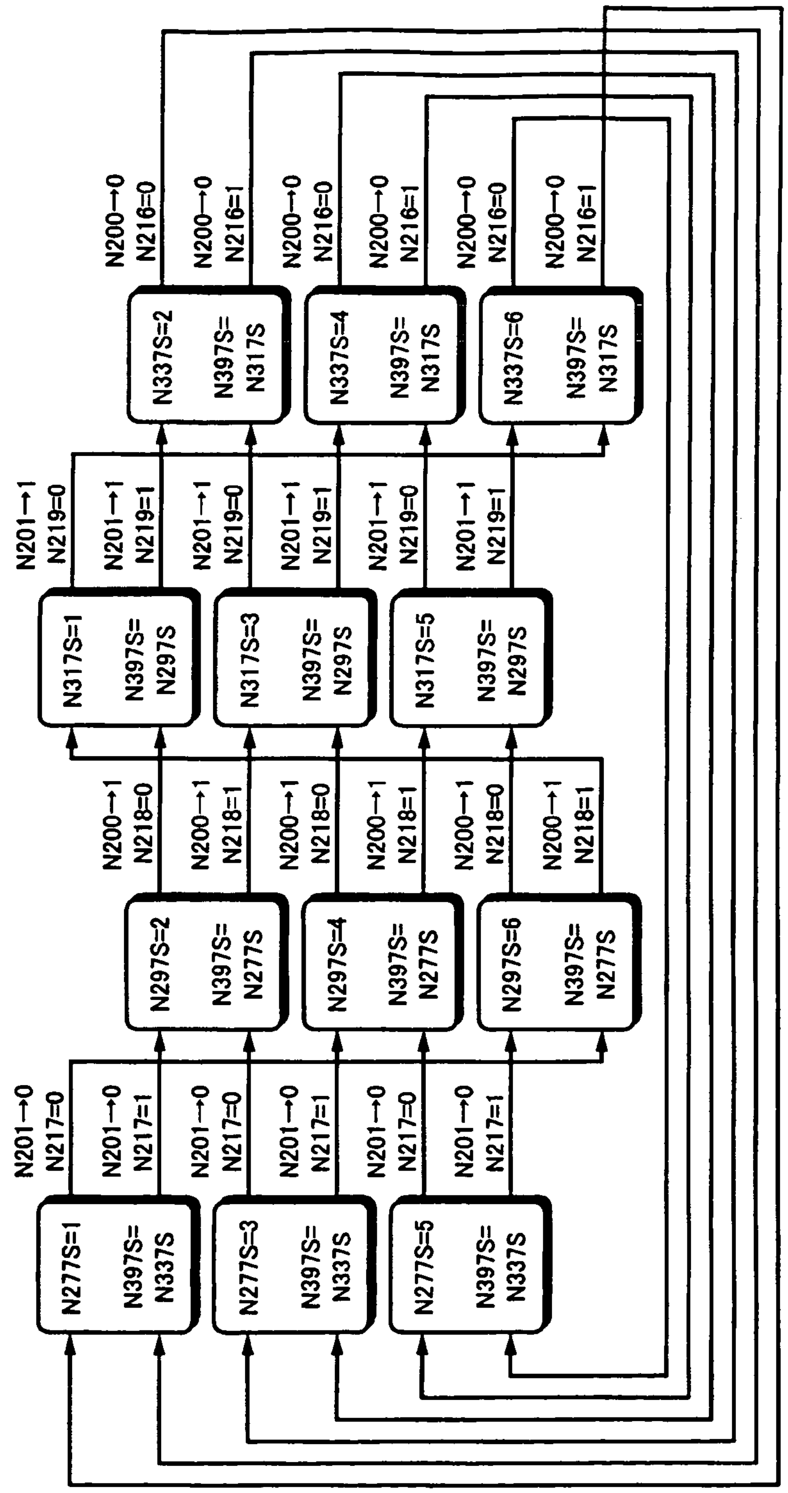
FIG. 19 is a state transition chart showing an example of inputs and outputs of three bits and six states according to the second embodiment of the present invention.

FIG. 19 shows an example of a state transition chart of inputs and outputs of three bits and six states according to the second embodiment of the present invention. State number N397S represents a state number of an output of the encoder 11. When a clock input N200 goes low (represented by “N200→0” in FIG. 19), the result of the state transition of state number N337S of an internal state corresponding to the data input N216 is input to state number N277S. When the data input N216 is “1”, the state number is incremented for example from state number N337S=“4” to state number N277S=“5”. In contrast, when the data input N216 is “0”, the state number is decremented for example from state number N337S=“4” to state number N277S=“3”. In these cases, the resultant state number is an odd number. When a state number changes, three bits that decide state number N337S are output as an encoded result.

Next, at timing the clock input N201 goes low (represented by “N201→0” in FIG. 19), the result of the state transition of state number N277S of an internal state corresponding to the data input N217 is input to state number N297S. When the data input N217 is “1”, the state number is incremented for example from state number N277S=“5” to state number N277S=“6”. When the data input N217 is “0”, the state number is decremented for example from state number N277S=“5” to state number N277S=“4”. In these cases, the resultant state number is an even number. When a state number changes, three bits that decide state number N277S are output as an encoded result.

At timing the clock input N200 goes high (represented by “N200→1” in FIG. 19), the result of the state transition of state number N297S of an internal state corresponding to the data input N218 is input to state number N317S. When the data input N218 is “1”, the state number is incremented for example from state number N297S=“4” to state number S317S=“5”. When the data input N218 is “0”, the state number is decremented for example from state number N297S=“4” to state number N317S=“5”. In these cases, the resultant state number is an odd number. When a state number changes, three bits that decide state number N297S are output as an encoded result.

At timing the clock input N201 goes high (represented by “N201→1” in FIG. 19), the result of the state transition of state number N317S of an internal state corresponding to the data input N219 is input to state number N337S. When the data input N219 is “1”, the state number is incremented for example from state number N317S=“3” to state number N337S=“4”. When the data input N219 is “0”, the state number is decremented for example from state number N317S=“3” to state number N337S=“2”. In these case, the resultant state number is an even number. When a state number changes, three bits that decide state number N317S are output as an encoded result.

The encoder 11 repeats the foregoing four types of state transitions to encode input data and output them.

3-1-2. Structure of Encoder

Figure 20:
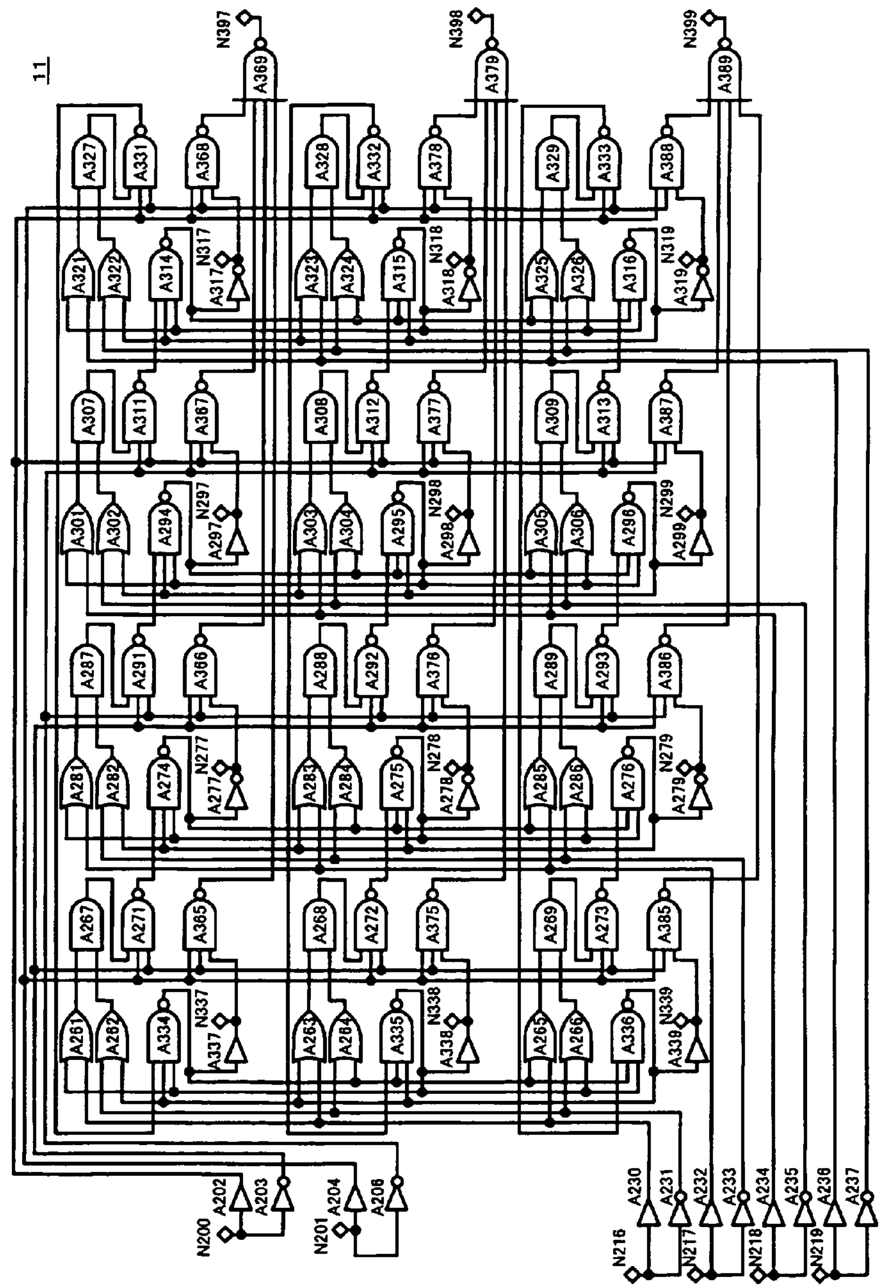
FIG. 20 is a circuit diagram showing an example of the circuit of the encoder according to the second embodiment of the present invention.

FIG. 20 shows an example of the circuit of the encoder 11 according to the second embodiment of the present invention. The encoder 11 inputs four-bit data inputs N216 to N219 and two-bit clock inputs N200 and N201 at positive and negative edges, encodes four-bit inputs N216 to N219, and outputs the encoded results to encoder outputs N397, N398, and N399 as three-bit data.

The encoder 11 is made up of first to fourth three-bit two-input one-output multiplexers, first to fourth three-bit three-stable latches (three-bit latches), and first to third three-bit four-input one-output multiplexers.

The first three-bit two-input one-output multiplexer is made up of OR gates 261 to 266 and AND gates 267 to 269. The first three-bit two-input one-output multiplexer decides the next state number corresponding to an output of the fourth three-bit three-stable latch and the data input N216. When the data input N216 is “1”, the first three-bit two-input one-output multiplexer outputs a state number incremented by “1”. When the data input N216 is “0”, the first three-bit two-input one-output multiplexer outputs a state number decremented by “1”. An output of the first three-bit two-input one-output multiplexer is supplied to the first three-bit three-stable latch.

The first three-bit three-stable latch is a circuit that is the same as the foregoing three-bit three-state NAND type transparent latch described with the truth table shown in FIG. 12 in the first embodiment of the present invention. The first three-bit three-stable latch is made up by adding a hold circuit made up of NAND gates A271 to A273 to a three-stable sequential logic circuit made up of NAND gates A274, A275, and A276. The first three-bit three-stable latch is enabled when the clock input N200 is “0” and the clock input N201 is “1”. In other states, the first three-bit three-stable latch is operated in a hold state. An output of the first three-bit three-stable latch is inverted and supplied to the three-bit four-input one-output multiplexer.

The first three-bit two-input one-output multiplexer and the first three-bit three-stable latch make up a first state transition control section.

The second three-bit two-input one-output multiplexer is made up of OR gates A281 to A286 and AND gates A287 and A289. The second three-bit two-input one-output multiplexer decides the next state number corresponding to the output of the first three-bit three-stable latch and the data input N217. When the data input N217 is “1”, the second three-bit two-input one-output multiplexer outputs a state number incremented by “1”. When the data input N217 is “0”, the second three-bit two-input one-output multiplexer outputs a state number decremented by "1". An output of the second three-bit two-input one-output multiplexer is supplied to the second three-bit three-stable latch.

The second three-bit three-stable latch is made up by adding a hold circuit made up of NAND gates A291 to A293 to a three-stable sequential logic circuit made up of NAND gates A294, A295, and A296. When the clock input N200 is "0" and the clock input N201 is "0", the second three-bit three-stable latch is enabled. In other states, the second three-bit three-stable latch is operated in a hold state.

The second three-bit two-input one-output multiplexer and the second three-bit three-stable latch make up a second state transition control section.

The third three-bit two-input one-output multiplexer is made up of OR gates A301 to A306 and AND gates A307 to A309. The third three-bit two-input one-output multiplexer decides the next state number corresponding to an output of the second three-bit three-stable latch and the data input N218. When the data input N218 is "1", the third three-bit two-input one-output multiplexer outputs a state number incremented by "1". When the data input N218 is "0", the third three-bit two-input one-output multiplexer outputs a state number decremented by "1".

The third three-bit three-stable latch is made up by adding a hold circuit made up of NAND gates A311 to A313 to a three-stable sequential logic circuit made up of NAND gates A314, A315, and A316. When the clock input N200 is "1" and the clock input N201 is "0", the third three-bit three-stable latch is enabled. In the other states, the third three-bit three-stable latch is operated in a hold state.

The third three-bit two-input one-output multiplexer and the third three-bit three-stable latch make up a third state transition control section.

The fourth three-bit two-input one-output multiplexer is made up of OR gates A321 to A326 and AND gates A327 to A329. The fourth three-bit two-input one-output multiplexer decides the next state number corresponding to an output of the third three-bit three-stable latch and the data input N219. When the data input N219 is "1", the fourth three-bit two-input one-output multiplexer outputs a state number incremented by "1". When the data input N218 is "0", the fourth three-bit two-input one-output multiplexer outputs a state number decremented by "1".

The fourth three-bit three-stable latch is made up by adding a hold circuit made up of NAND gates A331 to A333 to a three-stable sequential logic circuit made up of NAND gates A334, A335, and A336. When the clock input N200 is "1" and the clock input N201 is "1", the fourth three-bit three-stable latch is enabled. In the other states, the fourth three-bit three-stable latch is operated in a hold state.

The fourth three-bit two-input one-output multiplexer and the fourth three-bit three-stable latch make up a fourth state transition control section.

An output selection section is made up of the first to third three-bit four-input one-output multiplexers. The first three-bit four-input one-output multiplexer is made up of three-input NAND gates A365, A366, A367, and A368 and a four-input NAND gate A369. The second three-bit four-input one-output multiplexer is made up of three-input NAND gates A375, A376, A377, and A378 and a four-input NAND gate A379. The third three-bit four-input one-output multiplexer is made up of three-input NAND gates A385, A386, A387, and A388 and a four-input NAND gate A389. The first to third three-bit four-input one-output multiplexers receive outputs of the first to fourth three-bit three-stable latches. The first to third three-bit four-input one-output multiplexers select one set from the outputs of the first to fourth three-bit three-stable latches corresponding to a combination of the clock inputs N200 and N201 and output the selected set to the encode outputs N397, N398, and N399.

In other words, when the clock input N200 is "0" and the clock input N201 is "0", the output selection section selects outputs N277 to N279 of the first three-bit three-stable latch. When the clock input N200 is "1" and the clock input N201 is "0", the output selection section selects inverted outputs N297 to N299 of the second three-bit three-stable latch. When the clock input N200 is "1" and the clock input N201 is "1", the output selection section selects outputs N317 to N319 of the third three-bit three-stable latch. When the clock input N200 is "0" and the clock input N201 is "1", the output selection section selects inverted outputs N337 to N339 of the fourth three-bit three-stable latch.

A predetermined state number conversion circuit converts the encode outputs N397 to N399 into corresponding state number N397S as shown in FIG. 18.

3-1-3. Operation of Encoder

Next, an example of a simulation result of the operation of the encoder 11 using the foregoing simulation software will be described with reference to timing charts shown in FIG. 21 and FIG. 22. The timing charts plot the relationship of voltages v (n200) and v (n201) of the clock inputs N200 and N201 of the encoder 11, voltages v (n216), v (n217), v (n218), and v (n219) of the data inputs N216, N217, N218, and N219, and the time axis. Corresponding to them, the timing charts plot the relationship of state numbers N277S, N297S, N317S, and N337S as three-bit values in the encoder 11 and the time axis. In addition, the timing charts plot the relationship of state number N397S represented by a three-bit value that is output from the encoder 11 and the time axis.

Figure 21:
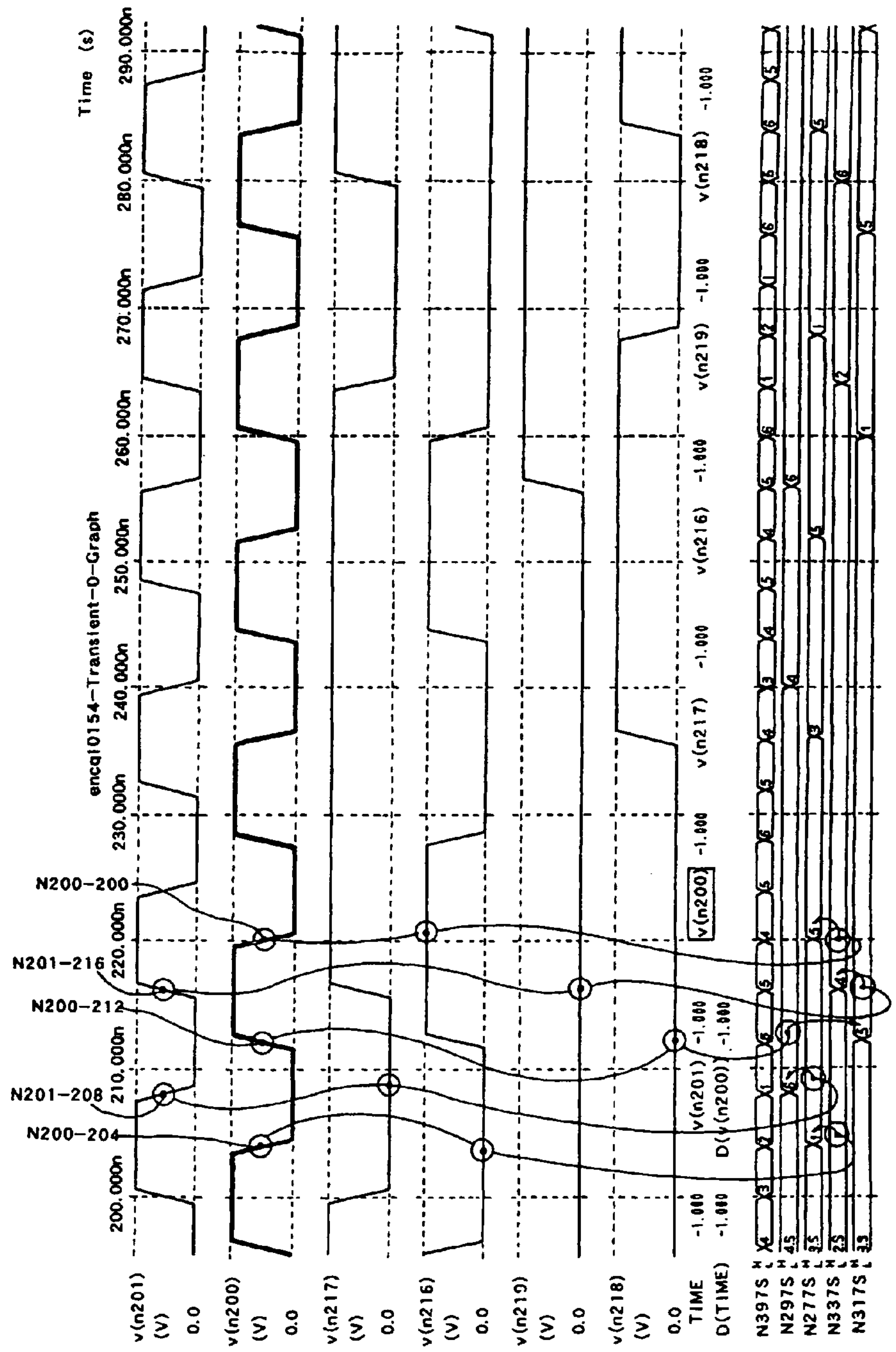
FIG. 21 is a timing chart describing an example of the state transition operation corresponding to inputs of clocks and data in the encoder according to the second embodiment of the present invention.
Figure 22:
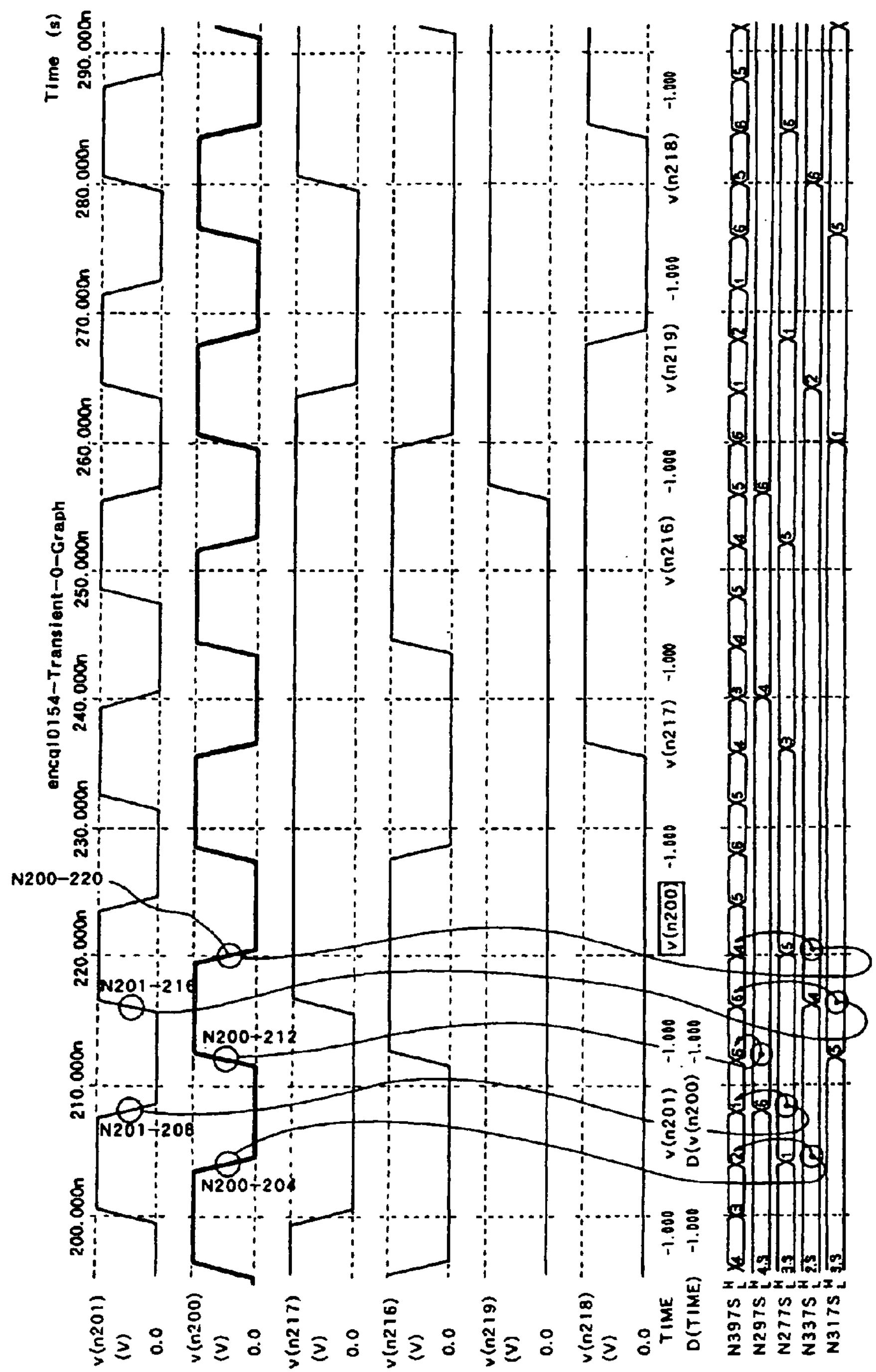
FIG. 22 is a timing chart describing an example of an output selection operation of the encoder according to the second embodiment of the present invention.

The timing charts of FIG. 21 and FIG. 22 are the same except for reference numerals and so forth.

Next, with reference to FIG. 21, a state transition corresponding to clock inputs and data inputs will be described. At timing of a trailing edge N200-204 of the clock input N200, the result of the state transition of the data input N216 is sampled. In the example shown in FIG. 21, state number N337S immediately before the trailing edge N200-204 is "2". The value of the data input N216 sampled at the trailing edge N200-204 is "0". Thus, the state number is decremented in the state transition chart shown in FIG. 19. As a result, state number N277S sampled at the trailing edge N200-204 becomes "1".

At timing of the next trailing edge N201-208 of the clock input N201, the result of the state transition of the data input N217 is sampled. Since state number N277S immediately before the trailing edge N201-208 is "1" and the value of the data input N217 is "0", the state number is decremented. As a result, state number N297S sampled at the trailing edge N201-208 becomes "6".

At timing of a leading edge N200-212 of the clock input N200, the result of the state transition of the data input N218 is sampled. Since the immediately preceding state number N297S is "6" and the data input N218 is "0", the state number is decremented. As a result, state number N317S sampled at the trailing edge N200-212 becomes "5".

Likewise, at timing of the next leading edge N201-216 of the clock input N201, the result of the state transition of the data input 219 is sampled. Since the immediately preceding state number N317S is "5" and the value of the data input N219 is "0", the state number is decremented. As a result, state number N337S sampled at the leading edge N201-216 becomes "4".

As a result, the operations of the first to fourth state transition control sections are completed. State numbers sampled as results of state transitions of the first to fourth state transition control sections are held at least until a corresponding clock input changes.

In FIG. 21, after one cycle, at a leading edge N200-220 of the clock input N200, the result of the state transition of the data input N216 is sampled. Since the immediately preceding state number N337S is "4" and the value of the data input N216 is "1", the state number is incremented. As a result, state number N277S sampled at the leading edge N200-220 becomes "5". Likewise, the sequential logic circuit repeats the sampling and state transitions to perform an encode operation.

Next, with reference to the timing chart shown in FIG. 22, the output selection operation of the encoder 11 will be described. The output selection operation is performed by the three-bit four-input one-output multiplexer, which makes up the foregoing output selection section.

When the clock input N200 is "0" and the clock input N201 is "1", a three-bit internal state of internal state number N337S is selected and output. As a result, output state number N397S becomes the same value as internal state number N337S ("2" in the example shown in FIG. 22).

When the clock input N200 is "0" and the clock input N201 is "0", a three-bit internal state of internal state number N277S is selected and output. As a result, output state number N397S becomes the same value as internal state number N277S ("2" in the example shown in FIG. 22).

When the clock input N200 is "1" and the clock input N201 is "0", a three-bit internal state of internal state number N297S is selected and output. As a result, output state number N397S becomes the same value as internal state number N297S ("2" in the example shown in FIG. 22).

When the clock input N200 is "1" and the clock input N201 is "1", a three-bit internal state of internal state number N317S is selected and output. As a result, output state number N397S becomes the same value as internal state number N317S ("2" in the example shown in FIG. 22).

By repeating the foregoing operations, the three-bit four-input one-output multiplexer successively selects four types of internal states and outputs a combination of three bits corresponding to output state number N397S.

3-2. Modification of Second Embodiment of Present Invention

Figure 23:
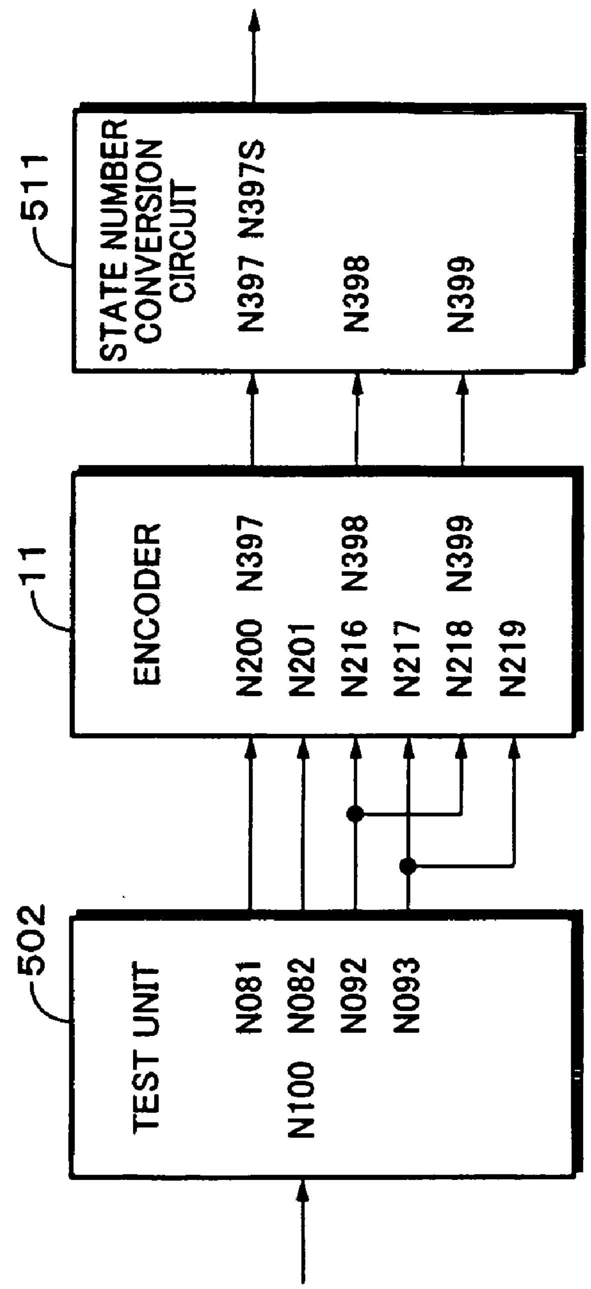
FIG. 23 is a block diagram showing an outline of a simulation model used to verify the operation of the encoder according to a modification of the second embodiment of the present invention.

Next, a modification of the second embodiment of the present invention will be described. FIG. 23 shows an outline of a simulation model used to verify the operation of the encoder 11 according to a modification of the second embodiment of the present invention. A test unit 502 generates clock signals N081 and N082 whose phases are different by 90 degrees to operate an encoder 11. In addition, the test unit 502 generates data signals N092 and N093 corresponding to pseudo random numbers. At this point, the test unit 502 outputs values of pseudo random numbers at timing of which the data signal N092 is sampled at both positive and negative edges of the clock signal N082 and the data signal N093 is sampled at both positive and negative edges of the clock signal N083.

According to the modification of the second embodiment of the present invention, the encoder 11 inputs a data signal N092 of four-phase data inputs from the test unit 502 as data inputs N216 and N218 that are connected. Likewise, the encoder 11 inputs a data signal N093 of the pour-phase data inputs from the test unit 502 as data inputs N218 and N219 that are connected. The encoder 11 may have the same circuit structure as that of the second embodiment shown in FIG. 20.

Next, an example of a simulation result of the operation of the encoder 11 according to the modification of the second embodiment of the present invention using the foregoing simulation software will be described with reference to timing charts shown in FIG. 24 and FIG. 25. The timing charts plot the relationship of voltages v (n200) and v (n201) of the clock inputs N200 and N201 of the encoder 11, voltages v (n216), v (n217), v (n218), and v (n219) of the data inputs N216, N217, N218, and N219, and the time axis. Corresponding to them, the timing charts plot the relationship of state numbers N277S, N297S, N317S, and N337S as three-bit values in the encoder 11 and the time axis. In addition, the timing charts plot the relationship of state number N397S represented by a three-bit value that is output from the encoder 11 and the time axis.

Figure 24:
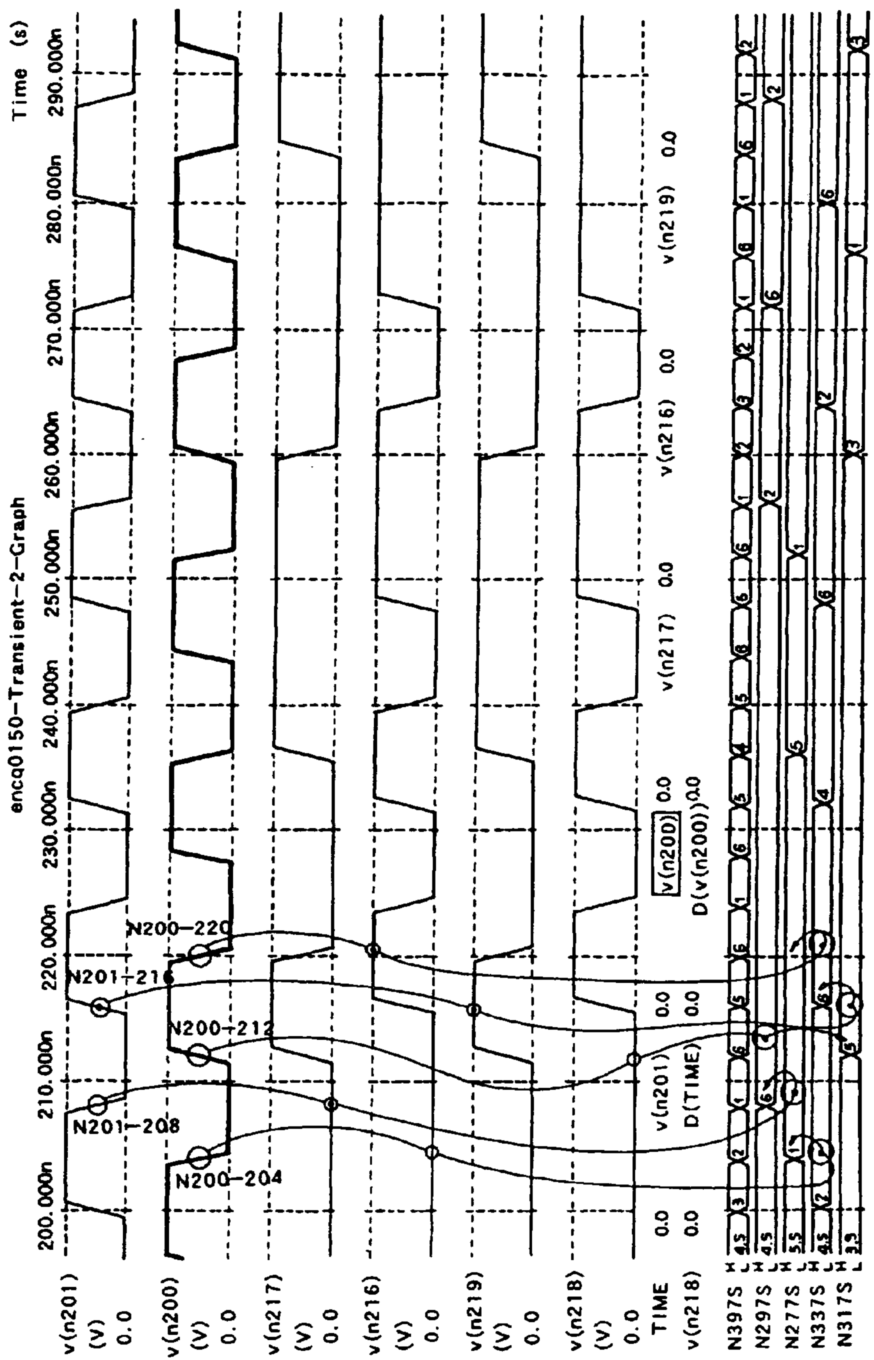
FIG. 24 is a timing chart describing an example of the state transition operation corresponding to clock signals and a data input in the encoder according to the modification of the second embodiment of the present invention.
Figure 25:
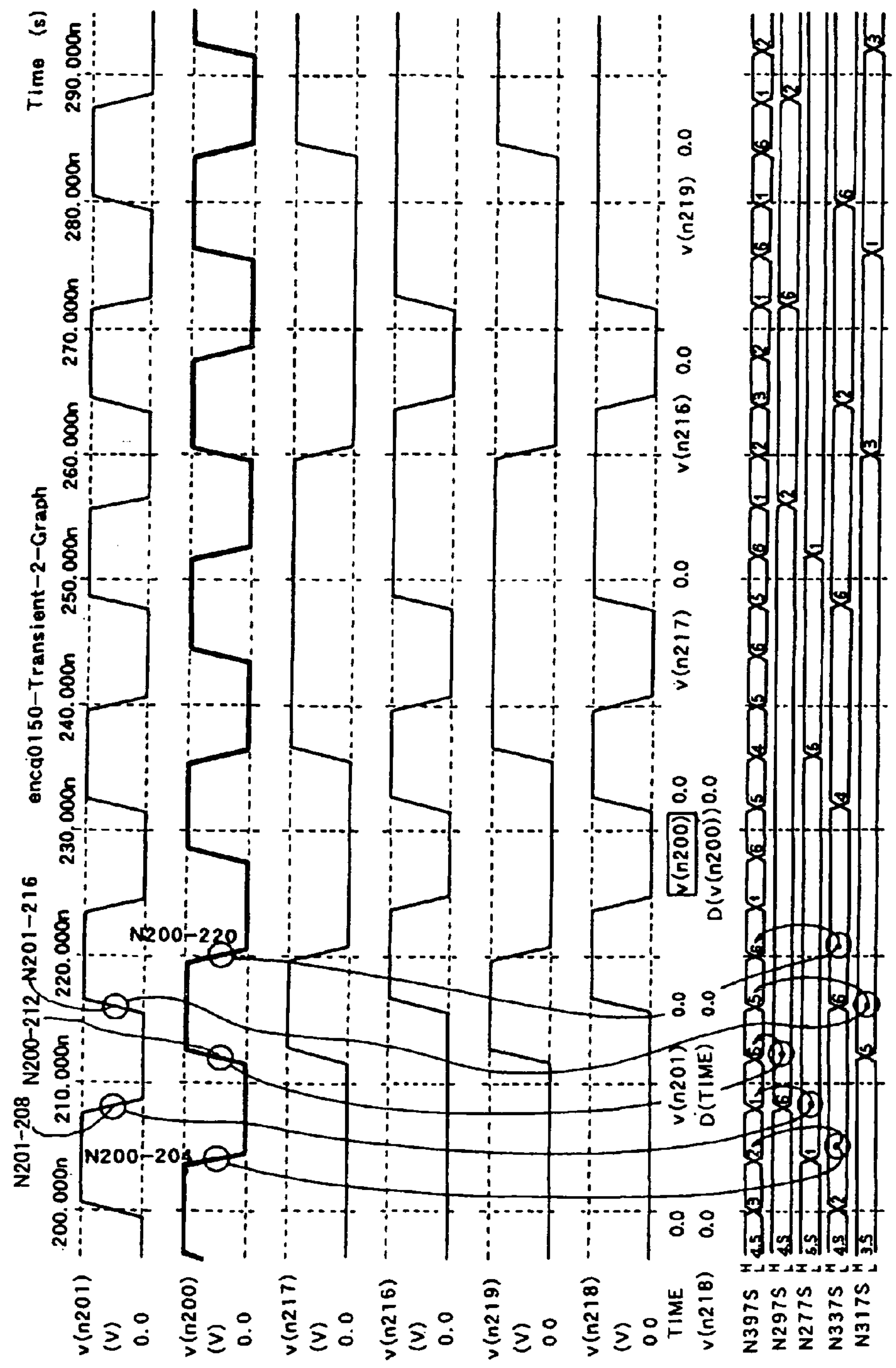
FIG. 25 is a timing chart describing an example of an output selection operation of the encoder according to the modification of the second embodiment of the present invention.

The timing charts of FIG. 24 and FIG. 25 are the same except for reference numerals and so forth.

Next, with reference to FIG. 24, a state transition corresponding to clock signals and data inputs will be described. A state transition corresponding to clock signals and data inputs shown in FIG. 24 is the same as that shown in FIG. 21 except for two pairs of data inputs and the relationship of data inputs and clock timing.

At timing of a trailing edge N200-204 of a clock input N200, the result of the state transition of the data input N216 is sampled. In the example shown in FIG. 24, state number N337S immediately before the trailing edge N200-204 is "2". The value of the data input N216 sampled at the trailing edge N200-204 is "0". Thus, the state number is decremented. As a result, state number N277S sampled at the trailing edge N200-204 becomes "1".

At timing of the next trailing edge N201-208 of the clock input N201, the result of the state transition of the data input N217 is sampled. Since state number N277S immediately before the trailing edge N201-208 is "1" and the value of the data input N217 is "0", the state number is decremented. As a result, state number N297S sampled at the trailing edge N201-208 becomes "6".

At timing of a leading edge N200-212 of the clock input N200, the result of the state transition of the data input N218 is sampled. Since state number N297S immediately before the leading edge N200-212 is "6" and the data input N218 is "0", the state number is decremented. As a result, state number N317S sampled at the leading edge N200-212 of the clock input N200 becomes "5".

Likewise, at timing of the next leading edge N201-216 of the clock input N201, the result of the state transition of the data input 219 is sampled. Since state number N317S immediately before the leading edge N201-216 is "5" and the value of the data input N219 is "1", the state number is incremented. As a result, state number N297S sampled at the leading edge N201-216 of the clock input N201 becomes "6".

As a result, the operations of the first to fourth state transition control sections are completed. State numbers sampled as results of state transitions of the first to fourth state transition control sections are held at least until a corresponding clock input changes.

In FIG. 24, after one cycle, at timing of a leading edge N200-220 of the clock input N200, the result of the state transition of the data input N216 is sampled. Since the immediately preceding state number N337S is "6" and the value of the data input N216 is "1", the state number is incremented. As a result, state number N277S sampled at the leading edge N200-220 becomes "1". Likewise, the sequential logic circuit repeats the sampling and state transitions to perform an encode operation.

Next, with reference to FIG. 25, the output selection operation of the encoder 11 will be described. Like the operation shown in FIG. 22, the output selection operation is performed by the three-bit four-input one-output multiplexer, which makes up the output selection section shown in FIG. 20. The timing chart shown in FIG. 25 is the same that shown in FIG. 24 except for reference numerals and so forth.

When the clock input N200 is "0" and the clock input N201 is "1", a three-bit internal state of internal state number N337S is selected and output. As a result, output state number N397S becomes the same value as internal state number N337S ("2" in the example shown in FIG. 25).

When the clock input N200 is "0" and the clock input N201 is "0", a three-bit internal state of internal state number N277S is selected and output. As a result, output state number N397S becomes the same value as internal state number N277S ("1" in the example shown in FIG. 25).

When the clock input N200 is "1" and the clock input N201 is "0", a three-bit internal state of internal state number N297S is selected and output. As a result, output state number N397S becomes the same value as internal state number N297S ("6" in the example shown in FIG. 25).

When the clock input N200 is "1" and the clock input N201 is "1", a three-bit internal state of internal state number N317S is selected and output. As a result, output state number N397S becomes the same value as internal state number N317S ("5" in the example shown in FIG. 25).

According to the second embodiment and the modification of the second embodiment, since four-phase clocks are used, when the same speed logic circuits are used, they can be operated at higher speed. In addition, for the same transmission speed, lower speed logic circuits can be used. Thus, the power consumption and cost can be reduced.

Since the four-phase clocks are used, a period in which signals do not change before and after they are sampled becomes long. Thus, a wider timing margin can be obtained.

3-3. Supplement of First and Second Embodiments of Present Invention

The encoders 10, 10', and 11 of the first embodiment, the modification of the first embodiment, the second embodiment (and the modification of the second embodiment) are accomplished by adding a three-bit two-input one-output multiplexer, AND gates, and OR gates. However, these embodiments and modifications are not limited to these examples. For example, the encoders 10, 10', and 11 may be accomplished by adding a three-bit two-input one-output multiplexer, a transfer gate circuit, and a three-state buffer gate circuit.

In addition, the encoders 10, 10', and 11 of the first embodiment, the modification of the first embodiment, the second embodiment (and the modification of the second embodiment) use three-bit latches that are three-stable sequential logic circuits. However, the encoders 10, 10', and 11 of these embodiments and modifications are not limited to these examples. For example, regular transparent latches and their inverted outputs may be used. In this case, it is necessary to add a proper initialization circuit or a booby trap circuit to the transparent latches.

When a differential driver circuit or the like disclosed in a prior patent of the applicant of the present invention, Japanese Patent No. 3360861, is connected to the encode outputs N187 to N189 of the encoders 10 and 10' and the encode outputs N397 to N399 of the encoder 11 of the first embodiment, the modification of the first embodiment, and the second embodiment (and the modification of the second embodiment) of the present invention, three-value three-differential transmission can be performed.

Figure 26:
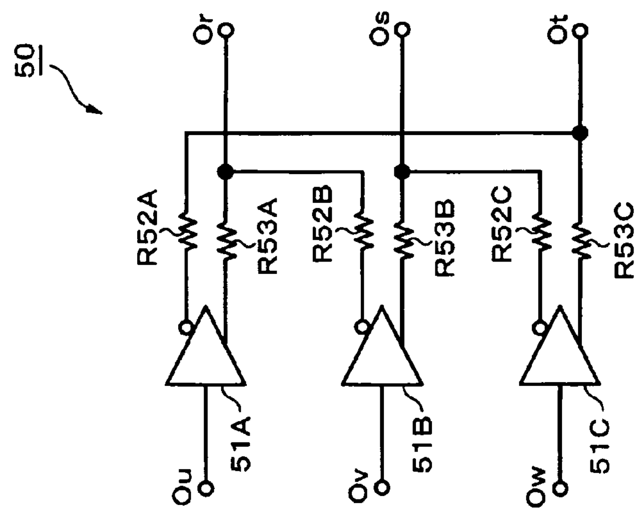
FIG. 26 is a circuit diagram showing an example of the structure of a differential driver circuit.

FIG. 26 shows the structure of the differential driver circuit disclosed in Japanese Patent No. 3360861. FIG. 27 shows a truth table of inputs and outputs of the differential driver circuit. The differential driver circuit designated by reference numeral 50 has three differential line drivers 51A, 51B, and 51C, six resistors 52A, 52B, and 52C, and resistors 53A, 53B, and 53C. Positive driver output terminals of the differential drivers 51A, 51B, and 51C and negative driver output terminals thereof are connected to output terminals through respective resistors. A positive driver output terminal of the differential line driver 51A is connected to an output terminal Or through a resistor R53A. A negative driver output terminal of the differential line driver 51B is connected to the output terminal Or through a resistor R52B. These relations apply to an output terminal Os and output terminal Ot. When driver inputs of the truth table shown in FIG. 27 are input to the input terminals Ou, Ov, and Ow, driver outputs take place at the output terminals Or, Os, and Ot.

4-1. Third Embodiment of Present Invention

Next, a third embodiment of the present invention will be described. The third embodiment is a decoding apparatus that decodes a three-value three-differential logic signal that represents six types of state transitions and that is transmitted through three transmission lines and obtains a two-phase serial digital signal.

Figure 28:
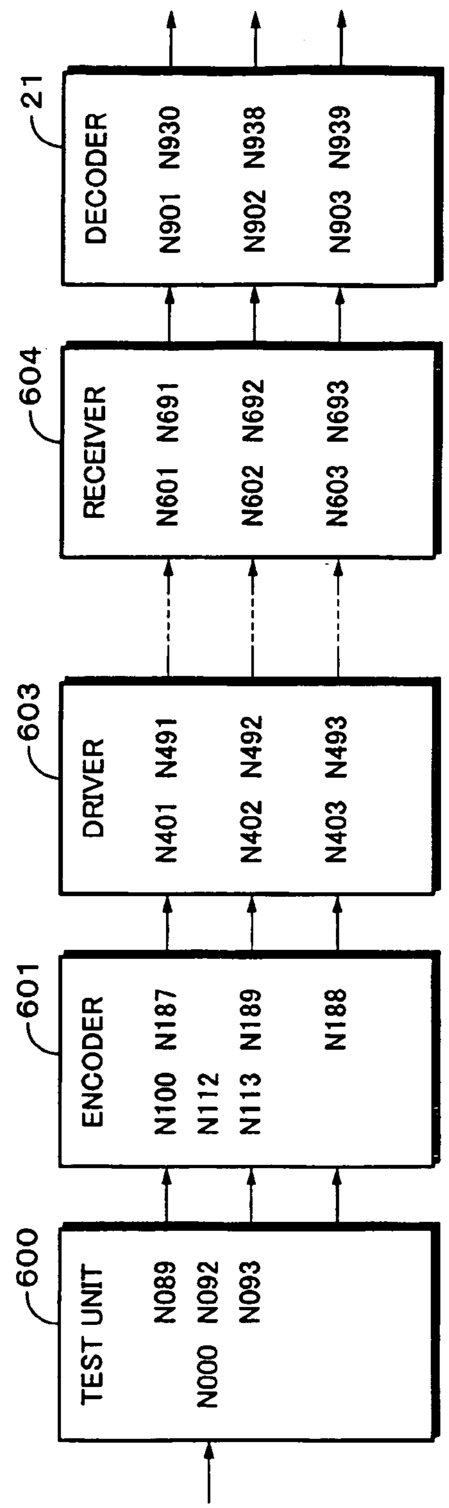
FIG. 28 is a block diagram showing an example of the system structure according to a third embodiment of the present invention.

FIG. 28 shows an example of the system structure according to the third embodiment of the present invention. An encoder 601 converts two-phase serial digital signals N112 and N113 into three-bit six-state signals N187 to N189. A driver 603 converts the voltage levels of the signals N187 to N189. In addition, the driver 603 converts single end signals into differential signals. The driver 603 supplies the converted signal to the three transmission lines. The signals N187 to N189 are received by a receiver 604 through the transmission lines. The receiver 604 converts the voltage levels of the signals N187 to N189. In addition, the receiver 604 converts differential signals into single end signals. The receiver 604 outputs the converted signals as a three-bit six-state transition signal from data outputs N691 to N693 to data inputs N901 to N903 of a decoder 21. The decoder 21 of the third embodiment separates the input three-bit six-state transition signal into data and a clock signal. The obtained clock signal is output from a clock output N930. Two-phase data whose phases are different are output to data outputs N938 and N939.

The test unit 600 generates a test signal. In addition, the test unit 600 generates a clock that operates an encoder 602, outputs the clock from a clock output N089, and outputs two-phase data signals generated corresponding to pseudo random numbers from data outputs N092 to N093.

4-1-1. Simulation Model

Figure 29:
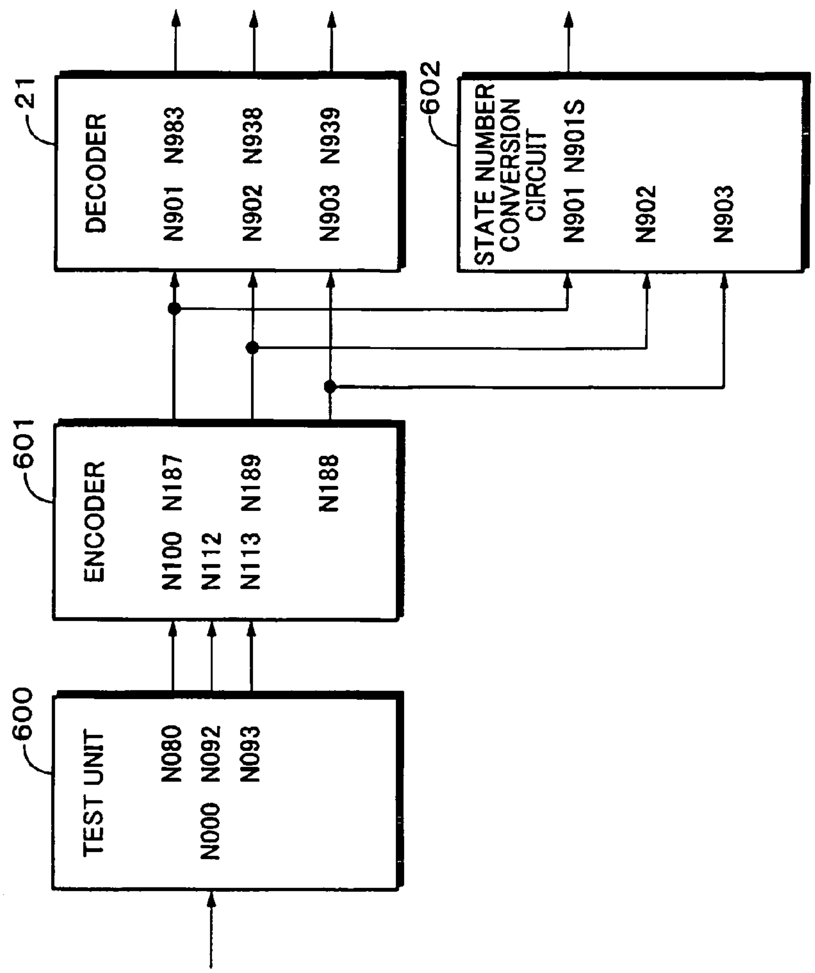
FIG. 29 is a block diagram showing an outline of a simulation model used to verify the operation of the decoder according to the third embodiment of the present invention.

FIG. 29 shows an outline of a simulation model used to verify the operation of the decoder 21 of the third embodiment of the present invention. In the simulation model, the relationship of inputs and outputs of the decoder 21 are verified. Thus, a driver on the transmission side and a receiver on the reception side are omitted. A simulation is performed by directly connecting the encoder 601 and the decoder 21. The encoder 601 may be the encoder 10 according to the first embodiment or the encoder 11 according to the second embodiment, respectively. As long as two-phase serial digital data are converted into a three-value three-differential logic signal that represents six types of state transitions and transmitted through three transmission lines, another encoder may be used.

A test unit 600 outputs a clock signal N808 and two-phase serial digital signals N092 and N093. The two-phase serial digital signals N092 and N093 are generated corresponding to pseudo random numbers. The clock signal N080 and the two-phase serial digital signals N092 and N093 are input to the encoder 601. The encoder 601 converts the input two-phase serial digital signals into three-value three-differential logic signals that represent six types of state transitions according to the clock signal and outputs them as data outputs N187, N188, and N189 to three transmission lines.

The three outputs of the encoder 601 are input as data inputs N901, N902, and N903 to the decoder 21. In addition, the three outputs of the encoder 601 are input to a state number conversion circuit 602 that generates an operation description state number. The state number conversion circuit 602 obtains a state number output N901S corresponding to an input signal. The state number will be described later. The state number is an integer number ranging from "1" to "6". Whenever the state transitions, the state number is incremented or decremented by "1". When the state number is "6", if it is incremented by "1", it becomes "1". When the state number is "1", if it is decremented by "1", it becomes "6".

FIG. 30A shows an example of a truth table of the state number conversion circuit 602. When three bits (x, x, x) that represent six states are input to the state number conversion circuit 602, it converts the input six states into state numbers ranging from "1" to "6" and outputs the state numbers. In the example, when the three bits are (0, 0, 1), they represent state number "1". When the three bits are (0, 1, 1), they represent state number "2". When the three bits are (0, 1, 0), they represent state number "3". When the three bits are (1, 1, 0), they represent state number "4". When the three bits are (1, 0, 0), they represent state number "5". When the three bits are (1, 0, 1), they represent state number "6". In FIG. 30A, when the state number "0", the three bits are (0, 0, 0). When the state number "7", the three bits are (1, 1, 1). However, states of which all three bits are the same are not used.

In addition, FIG. 30A shows an example of a truth table of which hold outputs N924, N922, and N926 that take place as internal states of the decoder 21 are converted into state number N922S. FIG. 30B shows a truth table of which bits of the internal states N921, N925, and N923 are inverted and converted into state number N921S.

A conversion circuit such as the state number conversion circuit 602 and state numbers are used to describe waveforms of simulation results. The real operation of the decoder 21 is performed for original three-bit data input.

Figure 31:
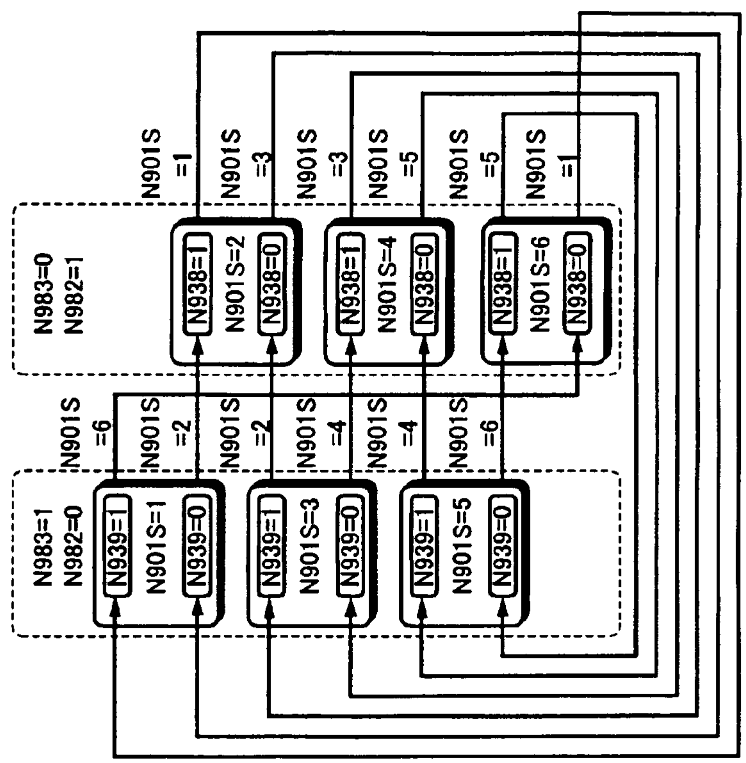
FIG. 31 is a schematic diagram showing examples of state transitions of the decoder according to the third embodiment of the present invention.

FIG. 31 shows examples of state transitions of the decoder 21 according to the third embodiment of the present invention. In the decoder 21, the clock N983 are inverted corresponding to the current value and the changed value of input data represented by state number N901S converted corresponding to the truth table shown in FIG. 30A with the input three bits. Thus, the data outputs N938 and N939 are alternately updated.

4-1-2. Structure of Decoder

Figure 32:
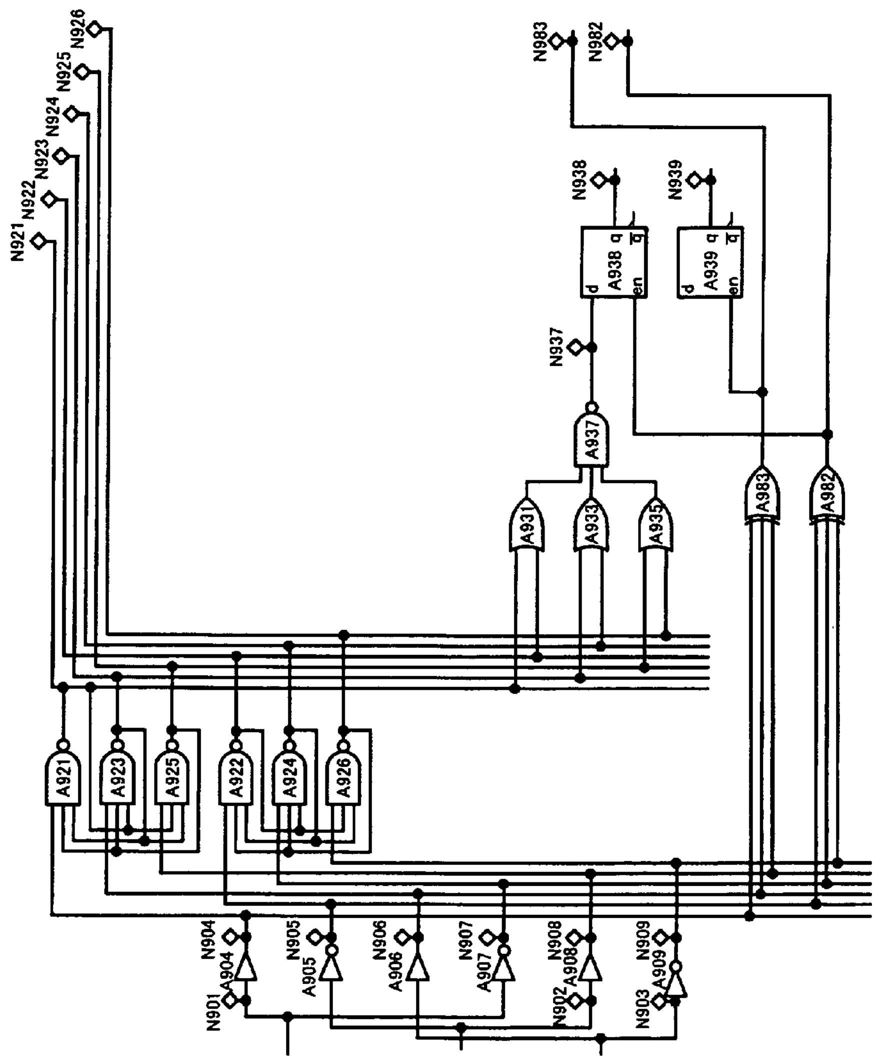
FIG. 32 is a circuit diagram showing an example of the circuit of the decoder according to the third embodiment of the present invention.

FIG. 32 shows a schematic diagram showing an example of the circuit of the decoder 21 according to the third embodiment of the present invention. The decoder 21 inputs two-value three-bit six-state transition signals to the decoder inputs N901, N902, and N903 and outputs a clock and an inverted clock to clock outputs N982 and N983. In addition, the decoder 21 outputs output data whose phases are different to the decode outputs N938 and N939.

The decode inputs N901, N902, and N903 are supplied to an input buffer circuit made up of gate circuits A904 to A909. The input buffer circuit generates an input signal and an inverted signal thereof. When a three-bit encode input and an inverted signal thereof are input to the decoder 21, the input buffer circuit can be omitted.

A first combination logic circuit is made up of EXOR gates A983 and A982. The circuits A983 and A982 detect whether the number of "1's" that are input is an odd number or an even number. Input signals of the decode inputs N901, N902, and N903 are input to the EXOR gate A983. On the other hand, inverted signals of the decode inputs N901, N902, and N903 are input to an EXOR gate A984.

In the three-value three-differential logic signals, as described in the first embodiment shown in FIG. 9 and FIG. 10 and the second embodiment shown in FIG. 18 and FIG. 19, when the state number is incremented by "1", the number of "1's" or "0's" of the three outputs of the encoder 10 or 11 alternately changes between an even number and an odd number. Thus, the EXOR gate A983 and the EXOR gate A984 output a clock output N982 and an inverted clock output N983 whose phases are inverted.

A first data hold circuit is made up of NAND gates A921, A923, and A925. The first data hold circuit and a second data hold circuit that will be described later are equivalent to the three-stable sequential logic circuit described with the truth table of the first embodiment shown in FIG. 12. When the state numbers of the data inputs N901 to N903 change from an even number to an odd number, the first data hold circuit holds a signal of which a pre-change state is inverted. FIG. 30B shows outputs of the first data hold circuit and corresponding state numbers. In FIG. 30B, outputs of the first data hold circuit are arranged in the order of the NAND gates A921, A925, and A923.

The second data hold circuit is made up of NAND gates A922, A924, and A926. when the state numbers of the input data N901 to N903 change from an even number to an odd number, the second data hold circuit holds a signal of which a pre-change state is inverted. FIG. 28A shows outputs of the second data hold circuit and corresponding state numbers. In FIG. 30A, outputs of the second data hold circuit are arranged in the order of the NAND gates N924, N922, and N926. The outputs of the first data hold circuit and the second hold circuit have relationship of inversion of state numbers.

A second combination logic circuit is made up of OR gates A931, A933, and A935 and an NAND gate A937. Three outputs of each of the first and second data hold circuits are paired and input to the OR gates A931, A933, and A935. Outputs of the OR gates A931, A933, and A935 are input to a three-input NAND gate. The second combination logic circuit compares the state immediately before one of the first and second data hold circuits is operated in a hold state and the current state that the other data hold circuit outputs and determines the state transition direction.

FIG. 33 shows an example of a truth table of the second combination logic circuit. The second combination logic circuit compares the first data hold circuit that holds the state of an odd state number and the second data hold circuit that holds the state of an event state number. When the odd state number is larger than the event state number, "1" is output from the NAND gate A937 (namely, the second combination logic circuit). When the even state number is larger than the odd state number, "0" is output from the NAND gate A937. When state number "6" is compared with state number "1", it is determined that state number "6" is smaller than state number "1".

When an odd state number changes to an even number sate, if the output of the NAND gate A937 is "1", it is determined that the state number be decremented. When the output of the NAND gate A937 is "0", it is determined that the state number be incremented. On the other hand, when an even state number changes to an odd state number, if the output of the NAND gate A937 is "1", it is determined that the state number be incremented. When the output of the NAND gate A937 is "0", it is determined that the state number be decremented.

First and second output latch circuits are made up of latch circuits A938 and A939, respectively. An output of the second combination logic circuit is supplied to a latch input of each of the first and second latch circuits and the clocks N982 and N983 whose phases are reverse and that are output from the first combination logic circuit are input as enable signals to the first and second latch circuits. These first and second latch circuits alternately latch the determined state transitions and output them as decode outputs N938 and N939. Depending on the phase of the clock, the result that takes place in the second combination logic circuit becomes reverse. Thus, the second latch circuit A939 uses the inverted output N939 as a decode output.

4-1-3. Operation of Decoder

Figure 34:
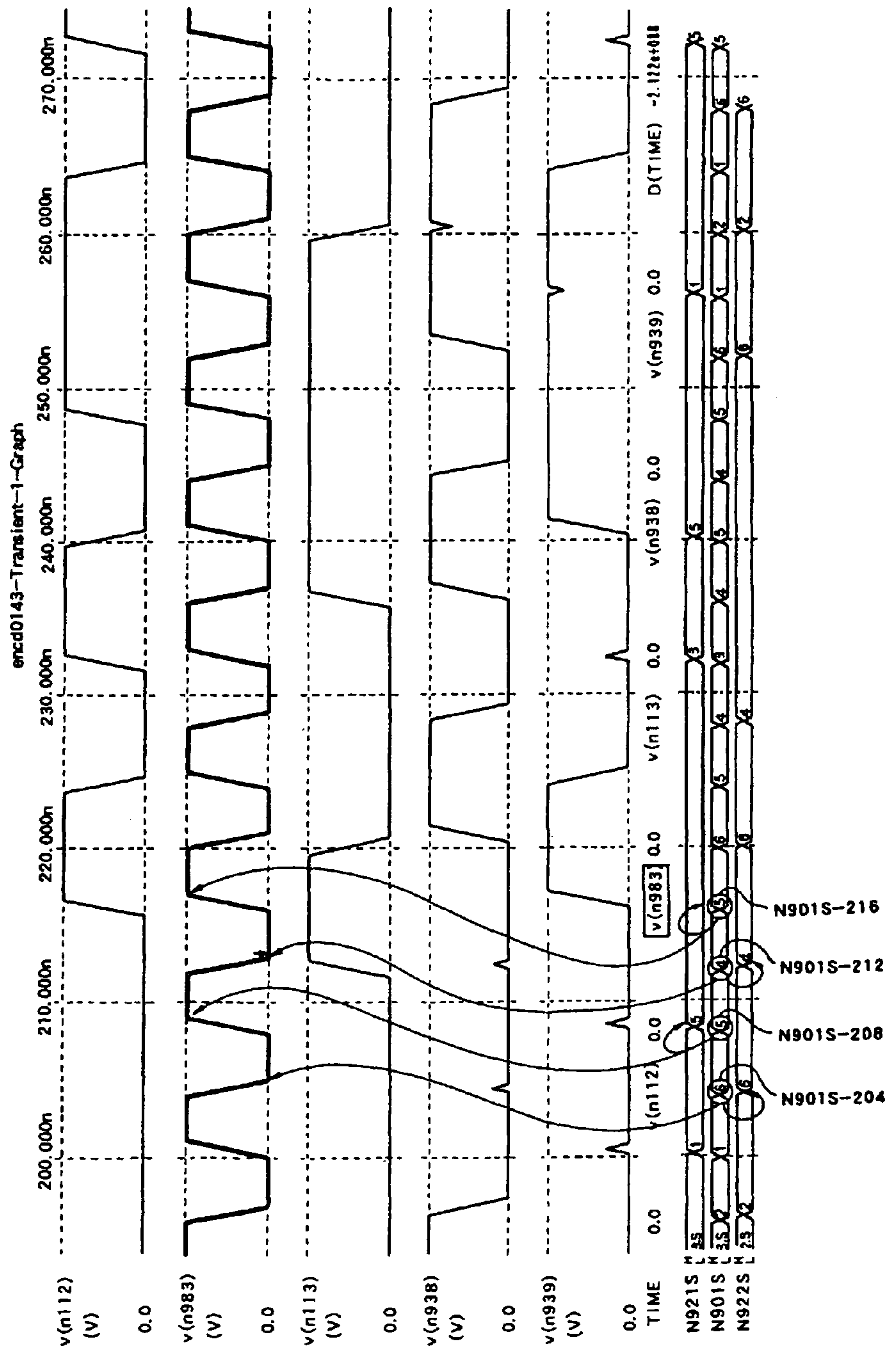
FIG. 34 is a timing chart describing examples of a clock reproduction operation and a data hold operation of the decoder according to the third embodiment of the present invention.
Figure 35:
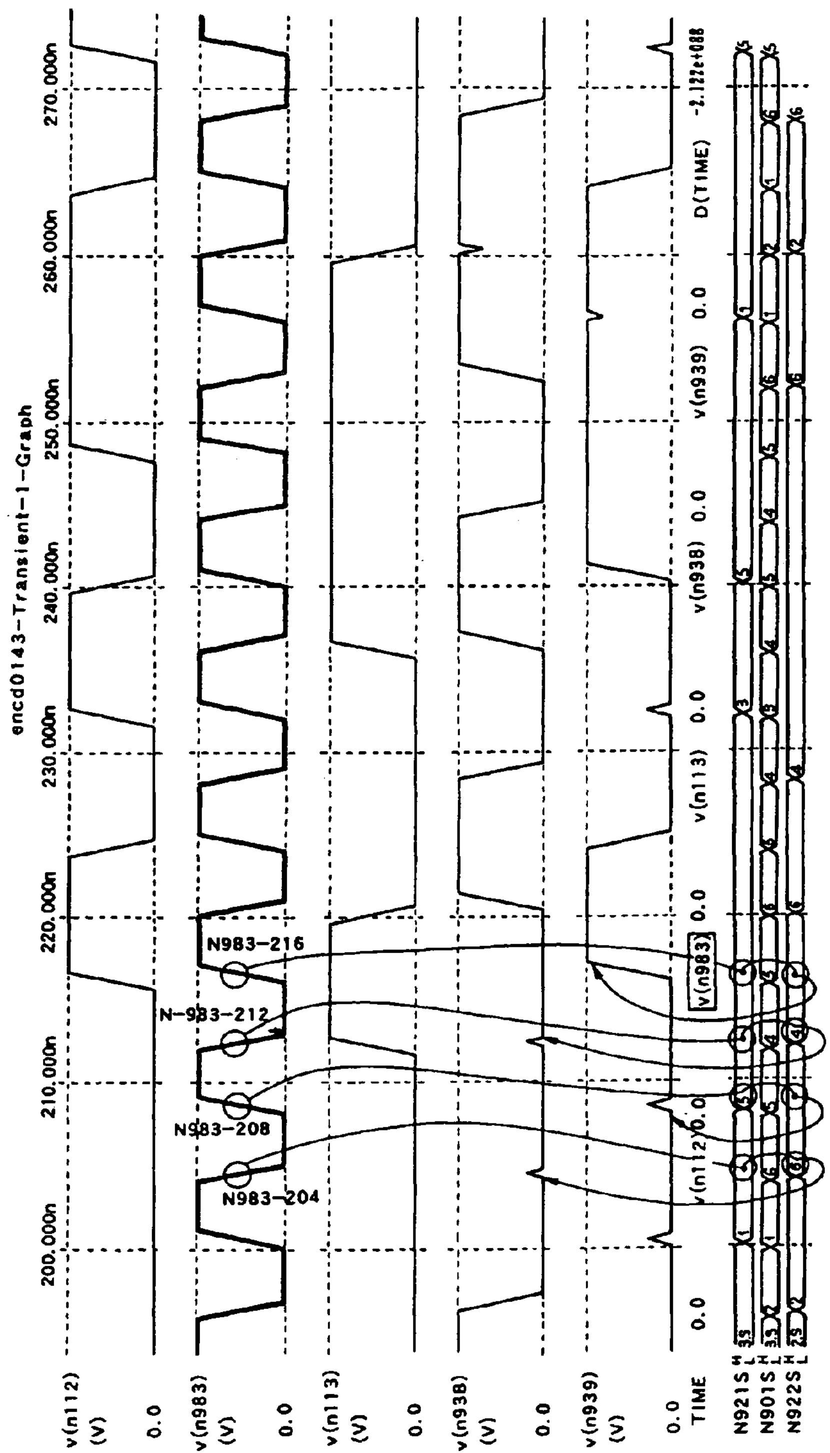
FIG. 35 is a timing chart describing an example of a data reproduction operation of the decoder according to the third embodiment of the present invention.

Next, an example of the operation of the decoder 21 according to the third embodiment will be described with reference to timing charts shown in FIG. 34 and FIG. 35. The timing charts shown in FIG. 34 and FIG. 35 show an example of a simulation result of the operation of the decoder 21 using the foregoing simulation software. The timing charts plot the relationship of data output signal voltages N938 and N939, a clock signal N983 reproduced by the decoder 21, data inputs v (n112) and v (n113) of a reference encoder for the simulation, and the time axis. Corresponding to them, the timing charts plot the relationship of state numbers N921 and N922 of the decoder 21 and the time axis. In addition, the timing charts plot the relationship of state number N901 that represents an input signal of the decoder 21 and the time axis.

The timing charts shown in FIG. 34 and FIG. 35 are the same except for reference numerals and so forth.

First, with reference to the timing chart shown in FIG. 34, a clock reproduction operation and a data hold operation of the decoder 21 will be described. When the clock reproduction operation is preformed, if the state numbers of the decode inputs N901, N902, and N903 are odd numbers, "1" is input to the clock output N983. If the state numbers of the decode inputs N901, N902, and N903 are even numbers, "0" is input to the clock output N983. In other words, with reference to FIG. 30, when the state number is an even number, the number of "1's" of the input signals is two. When the state number is an odd number, the number of "1's" of the input signals is one. With reference to FIG. 31, since the state numbers change between an even number and an odd number. Thus, with an output of the EXOR gate N938, the clock is reproduced.

The data hold operation is performed by the first data hold circuit and the second data hold circuit. The first data hold circuit holds an odd state number that is the latest state as an internal state N921S. The second data hold circuit stores an even state number that is the latest state as an internal state N922S.

On the timing chart shown in FIG. 34, at a state transition N901S-204, input state number N901 changes from "1" to "6". As a result, input state number N901S is an even number and the clock N983 becomes "0" level. In addition, since the latest even state number is "6", the state number held as the internal state N922S is "6".

Next, at a state transition N901S-208, input state number N901S changes from "6" to "5". As a result, input state number N901S is an even number. The clock N983 becomes "1" level. In addition, since the latest odd state number is "5", the state number held as the internal state N921S is "5".

Likewise, at a state transition N901S-212, input state number N901S changes from "5" to "4". As a result, input state number N901S is an even number. The clock N983 becomes "0" level. In addition, since the latest odd state number is "4", the state number held as the internal state N922S is "4".

Likewise, at a state transition N901S-216, input state number N901S changes from "4" to "5". As a result, input state number N901S is an odd number. The clock N983 becomes "1" level. In addition, since the latest odd state number is "5", the state number held as the internal state N921S does not change from "5".

The clock reproduction operation and the state number hold operation are repeated whenever the state of an input signal changes.

With reference to FIG. 35, the data reproduction operation of the decoder 21 will be described. Since the reproduction of the clock N983 has been described in FIG. 34, the decode operation corresponding to the clock N983 and the internal states N921S and N922S held in the first and second data hold circuits will be described.

The first and second latch circuits sample the output of the second combination logic circuit, namely the compared results of the internal states N921S and N922S, at timing of a trailing edge N983-204 of the clock N983. At the trailing edge N983-204 of the clock N983, the state number changes from an odd number ("1") to an even number ("6"). Since the internal state N921S is "1" and the internal state N922S is "6", the state number is decremented. Thus, logic value "0" is output to the data output N938.

Likewise, at timing of a leading edge N983-208 of the clock N983, the compared result of the internal states N921S and N922S is sampled. At the leading edge of the clock N983, the state number changes from an even number ("6") to an odd number ("5"). Since the internal state N921S is "5" and the internal state N922S is "6", it is determined that the state number be decreased. Thus, logic value "0" is output to the data output N939.

Likewise, at timing of a trailing edge N983-212 of the clock N983, the compared result of the internal states N921S and N922S is sampled. At the trailing edge of the clock N983, the state number changes from an odd number ("5") to an even number ("4"). Since the internal state N921S is "5" and the internal state N922S is "4", it is determined that the state number be decremented. Thus, logic value "0" is output to the data output N938.

Likewise, before a leading N983-216 of the clock N983, the state number changes from an even number "4" to an odd number "5". The state number of the internal state N921S is "5" that is the same as that of the preceding timing. In addition, the state number of the internal state N922S is "4". Thus, it is determined that the state number be incremented. As a result, logic value "1" is output to the data output N939.

On the timing chart, it looks like the clock N983 and the internal states N921S and N922S change nearly at the same time. Actually, when timing is in a predetermined permissible range, due to delay of the gate circuits, the decoder 21 can be operated.

The encoded result of the simulator contains glitches to some extent. The encoded result nearly matches delayed waveforms of the data inputs v (n112) and v (n113) of the encoder. Thus, it is confirmed that the simulator normally operates.

4-2. Modification of Third Embodiment of Present Invention

Figure 36:
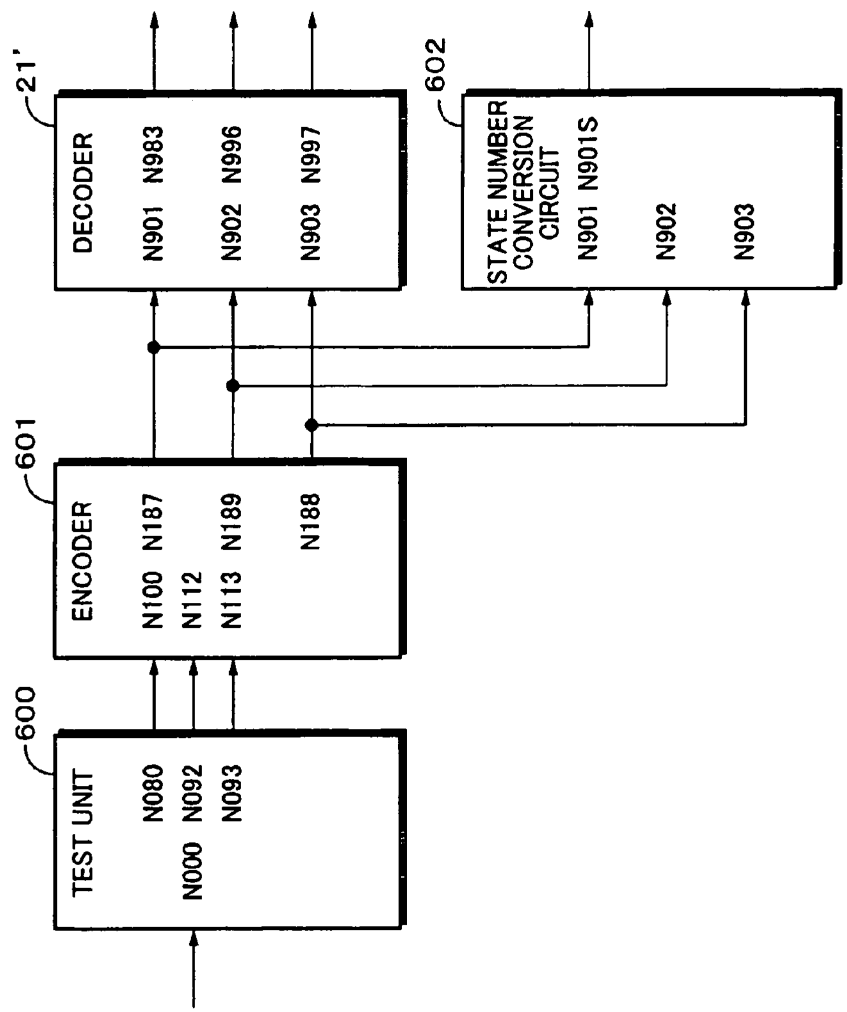
FIG. 36 is a block diagram showing a simulation model used in a modification of the third embodiment of the present invention.

Next, a modification of the third embodiment of the present invention will be described. The modification of the third embodiment is different from the third embodiment. FIG. 36 shows a simulation model used in the modification of the third embodiment. A decoder designated by reference numeral 21' is a decoder apparatus according to the modification of the third embodiment of the present invention. According to the modification of the third embodiment, since a test unit 600, an encoder 601, a state number conversion circuit 602, and a truth table of the state number conversion circuit 602 are the same as those of the third embodiment, their detailed description will be omitted.

Three outputs of the encoder 601 are input as decode inputs N901, N902, and N903. Outputs of the decoder 21' are supplied from decode outputs N996 and N997. A reproduced clock signal is supplied from a clock output N983. An inverted clock is supplied from an inverted clock output N982 (not shown).

4-2-1. Structure of Decoder

Figure 37:
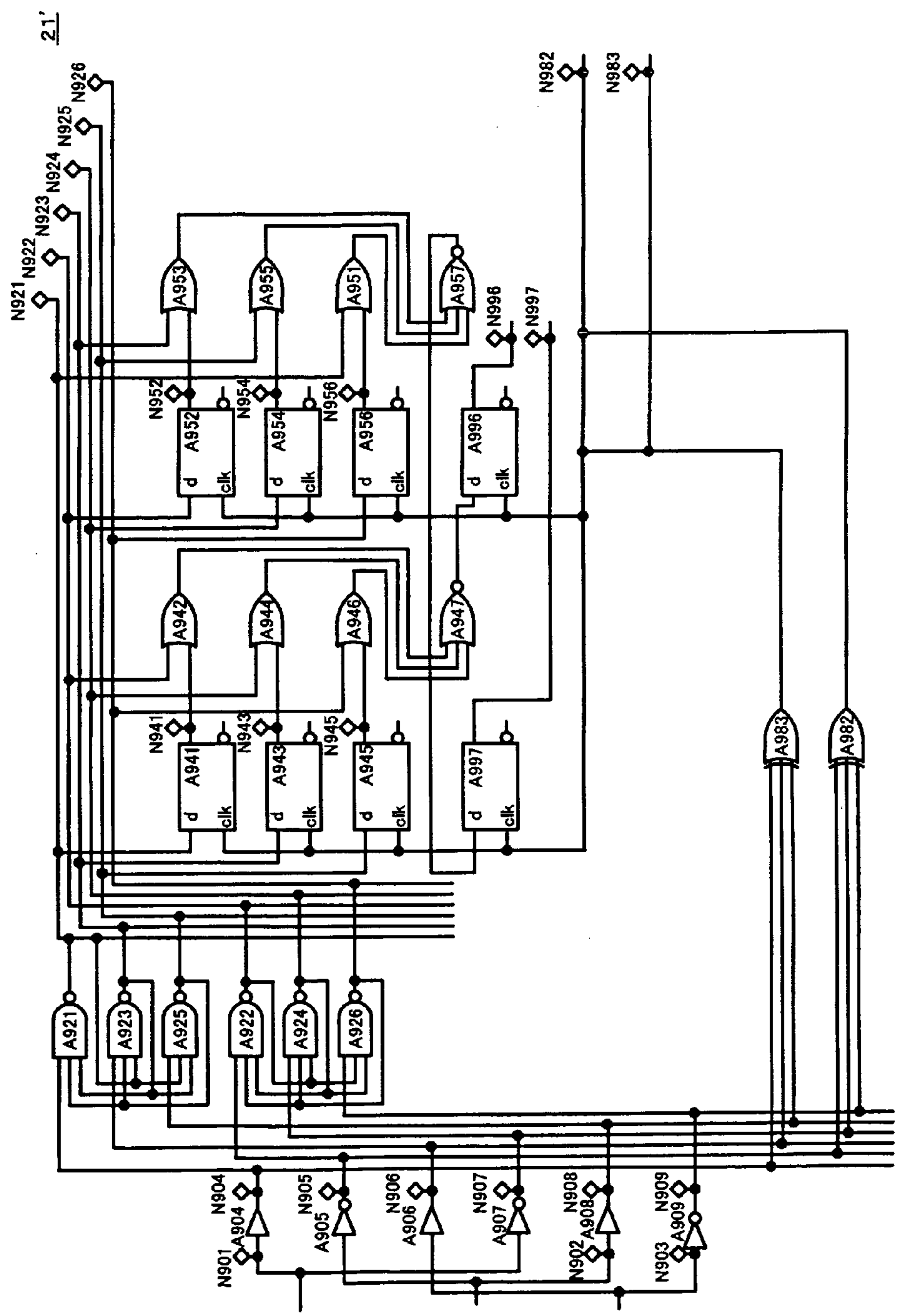
FIG. 37 is a circuit diagram showing an example of the circuit of the decoder according to the modification of the third embodiment of the present invention.

FIG. 37 shows an example of the circuit of the decoder 21' according to the modification of the third embodiment of the present invention. As described above, the decoder 21' inputs two-value three-bit six-state transition signals to the decode inputs N901, N902, and N903 and outputs a clock and an inverted clock to the clock outputs N982 and N983, respectively. In addition, the decoder 21' outputs output data whose phase are different from each other to the decode outputs N996 and N997.

The decode inputs N901, N902, and N903 are supplied to an input buffer circuit made up of gate circuits A904 to A909. The input buffer circuit generates input signals and their inverted signals. The input signals and the inverted signals that are output from the input buffer circuit are input to EXOR gates A983 and A982 of a first combination logic circuit. The first combination logic circuit detects whether the number of "1's" of each of the non-inverted input signals and the inverted input signals is an odd number or an even number and outputs a clock output N982 and an inverted clock output N983 that are clock outputs whose phases are opposite to each other from EXOR gates A983 and A982.

The non-inverted input signals that are output from the input buffer circuit are input to a first data hold circuit made up of NAND gates A921, A923, and A925. The first data hold circuit is a three-stable sequential logic circuit. Like the foregoing third embodiment, when the state numbers of the non-inverted signals of the data inputs N901 to N903 change from an odd number to an even number, the first data hold circuit holds a signal of which a pre-change state is inverted. The inverted input signals that are output from the input buffer circuit are input to a second data hold circuit that is a three-stable sequential logic circuit made up of NAND gates A922, A924, and A926. The second data hold circuit holds a pre-change state signal when the state number of the inverted signals of the data inputs N901 to N903 changes from an even number to an odd number.

Outputs of the first and second data hold circuits are supplied to first and second intermediate latch circuits, respectively. The first and second intermediate latch circuits alternately repeat a hold operation at leading edges and trailing edges of clock outputs supplied from the EXOR gates A982 and A983.

The first latch circuit is a three-bit edge trigger D flip-flop and is an intermediate latch circuit made up of latch circuits A941, A943, and A945. When the clock N982 changes from "1" to "0", the first latch circuit samples outputs N921, N923, and N925 of the first data hold circuit (outputs of NAND gates A921, A923, and A925). An output of the first intermediate latch circuit is supplied to a second combination logic circuit.

The second combination logic circuit is a circuit equivalent to the second combination logic circuit according to the foregoing third embodiment. The second combination logic circuit is made up of OR gates A942, A944, and A946 and an NAND gate A947. Outputs of the latch circuits A941, A943, and A945 that make up the first intermediate latch circuit are input to first input terminals of the OR gates A942, A944, and A946. Three outputs of the second data hold circuit are input to the other input terminals of the OR gates A942, A944, and A946. The second combination logic circuit compares an output of the first latch circuit and an output of the second hold circuit and determines the state transition direction. When the state number increases, the second combination logic circuit outputs "1". When the state number decreases, the second combination logic circuit outputs "0".

An output of the second combination logic circuit is supplied to a third latch circuit A996. The third latch circuit A996 is an output latch circuit and is a one-bit edge trigger D flip-flop. The third latch circuit A996 samples an output of the NAND gate A947 as the clock N983 changes and obtains a decode output N996 as the result.

The second latch circuit is a three-bit edge trigger D flip-flop and is an intermediate latch circuit made up of latch circuits A952, A954, and A956. When the clock N983 changes from "1" to "0", the second latch circuit samples outputs N922, N924, and N926 of the second data hold circuit (outputs of NAND gates A922, A924, and A926). An output of the second intermediate latch circuit is supplied to a third combination logic circuit.

The third combination logic circuit is a circuit equivalent to the second combination logic circuit. The third combination logic circuit is made up of OR gates A951, A953, and A955 and an NAND gate A957. Outputs of the latch circuits A952, A954, and A956 that make up the second intermediate latch circuit are input to first input terminals of the OR gates A953, A955, and A951. Three outputs of the first data hold circuit are input to the other input terminals of the OR gates A953, A955, and A957. The third combination logic circuit compares an output of the second latch circuit and an output of the first hold circuit and determines the state transition direction. When the state number increases, the third combination logic circuit outputs "1". When the state number decreases, the third combination logic circuit outputs "0".

An output of the third combination logic circuit is supplied to a fourth latch circuit A997. The fourth latch circuit A997 is an output latch circuit and is a one-bit edge trigger D flip-flop. The fourth latch circuit A997 samples an output of the NAND gate A957 as the clock N982 changes and obtains a decode output N997 as the result.

4-2-2. Operation of Decoder

Figure 38:
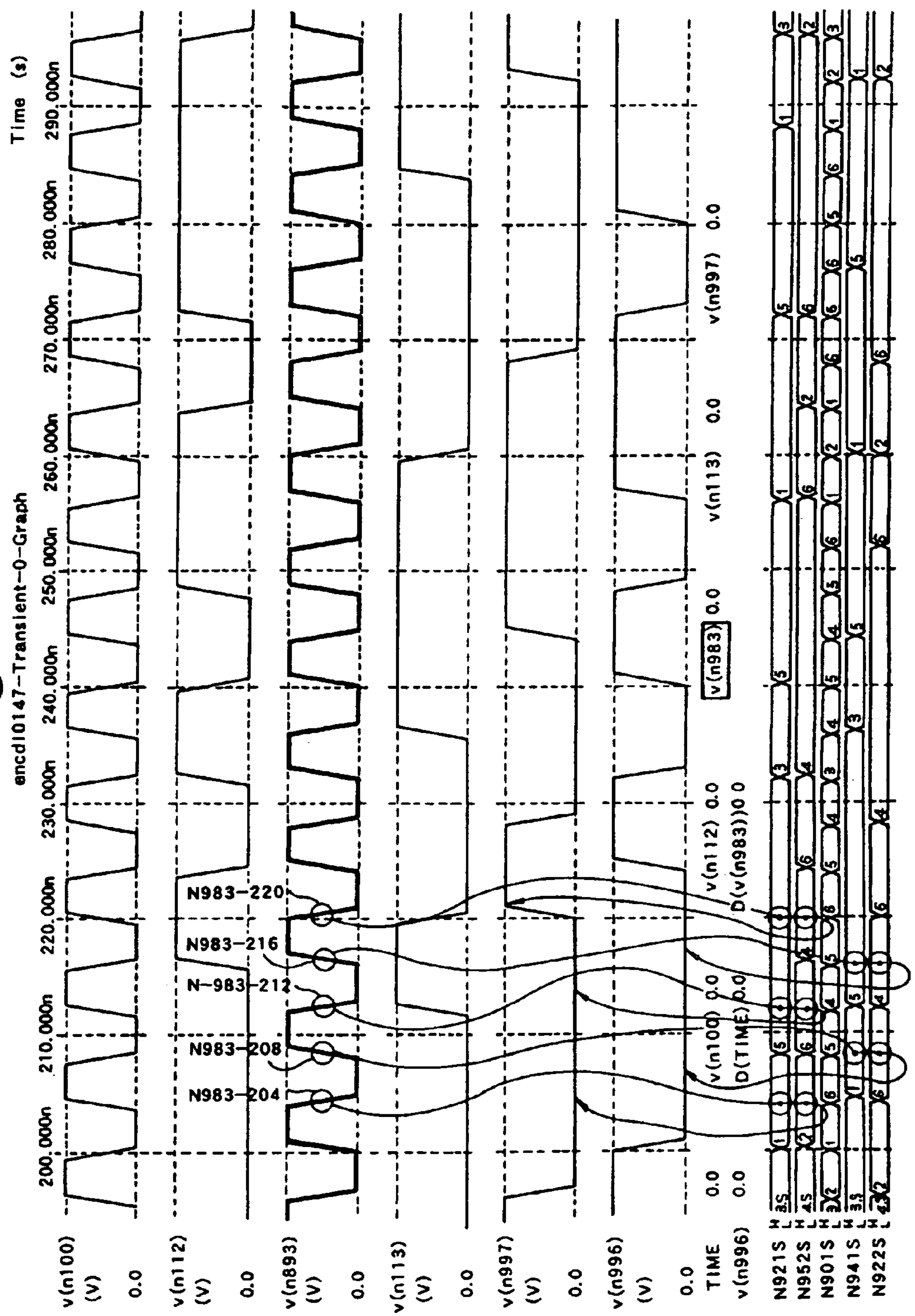
FIG. 38 is a timing chart describing an example of the operation of the decoder according to the modification of the third embodiment of the present invention.

Next, with reference to a timing chart shown in FIG. 38, the operation of the decoder 21' according to the modification of the third embodiment will be described. FIG. 38 shows an example of a simulation result of the operation of the decoder 21' using the foregoing simulation software. The timing chart plots the relationship of data output signal voltages N992 and N993, a clock signal N983 reproduced by the decoder 21', a clock v (n100) of a reference encoder for the simulation, data inputs v (n112) and v (n113), and the time axis. Corresponding to them, the timing chart plots the relationship of state numbers N921 and N922 of the decoder 21 and the time axis.

In addition, the timing chart plots the relationship of state number N901 that represents an input signal of the decoder 21 and the time axis.

Since the clock reproduction operation and the data hold operation according to the modification of the third embodiment are the same as those of the foregoing third embodiment shown in FIG. 34, their description will be omitted. In the following, an intermediate latch operation followed by a data reproduction operation will be described.

An output N941S of the first intermediate latch circuit (outputs N941, N943, and N945 of the latch circuits A941, A943, and A945) is a signal of which an output N921S of the first data hold circuit (outputs N921, N923, and N925 of the NAND gates A921, A923, and A925) is sampled and delayed by a half period. An output N952S of the second intermediate latch circuit (outputs N952, N954, and N956 of the latch circuits A952, A954, and A956) is a signal of which an output N922S of the second data hold circuit (outputs N922, N924, and N926 of the NAND gates A922, A924, and A926) is sampled and delayed by a half period.

In FIG. 38, at timing of a trailing edge N983-204 of the clock N983, an output of the third combination logic circuit, namely the compared result of the internal states N952S and N921S, is sampled. At the trailing edge N983-204 of the clock N983, the state number changes from “2” to “1”. Thus, it is determined that the state number be decremented. Logic value “0” is output to the data output N996.

At timing of a leading edge N983-208 of the clock N983, an output of the second combination logic circuit, namely the compared result of the internal states N941S and N922S, is sampled. At the leading edge N983-208 of the clock N983, the state number changes from “6” to “1”. Thus, it is determined that the state number be decremented. Logic value “0” is output to the data output N997.

At timing of a trailing edge N983-212 of the clock N983, the compared result of the internal states N952S and N921S is sampled. At the trailing edge N983-212 of the clock N983, the state number changes from “6” to “5”. Thus, it is determined that the state number be decremented. Logic value “0” is output to the data output N996.

At timing of a leading edge N983-216 of the clock N983, the compared result of the internal states N952S and N921S is sampled. At the leading edge N983-216 of the clock N983, the state number changes from “5” to “4”. Thus, it is determined that the state number be decremented. Logic value “0” is output to the data output N997.

At timing of a trailing edge N983-220 of the clock N983, the compared result of the internal states N952S and N921S is sampled. At the trailing edge N983-220 of the clock N983, the state number changes from “4” to “5”. Thus, it is determined that the state number be incremented. Logic value “1” is output to the data output N996.

In the modification of the third embodiment, signals sampled by the third and fourth latch circuits A996 and A997 do not change during a half clock period. Thus, the timing margin of the sampling of the modification of the third embodiment is larger than that of the foregoing third embodiment. On the other hand, timing of a data output of the modification of the third embodiment has a delay of a half clock period against that of the foregoing third embodiment.

In FIG. 38, when the reference encoder input v (n112) is compared with the decoder output N996 (v (n996) in FIG. 38) in the modification of the third embodiment, it is clear that the signal that is input to the encoder does not contain glitches and that the signal that is input to the encoder is nearly faithfully decoded in comparison with the foregoing third embodiment (see FIG. 34 and FIG. 35). This applied to the compared result of the reference encoder input v (n113) and the decoder output v (n997).

4-3. Another Modification of Third Embodiment of Present Invention

Figure 39:
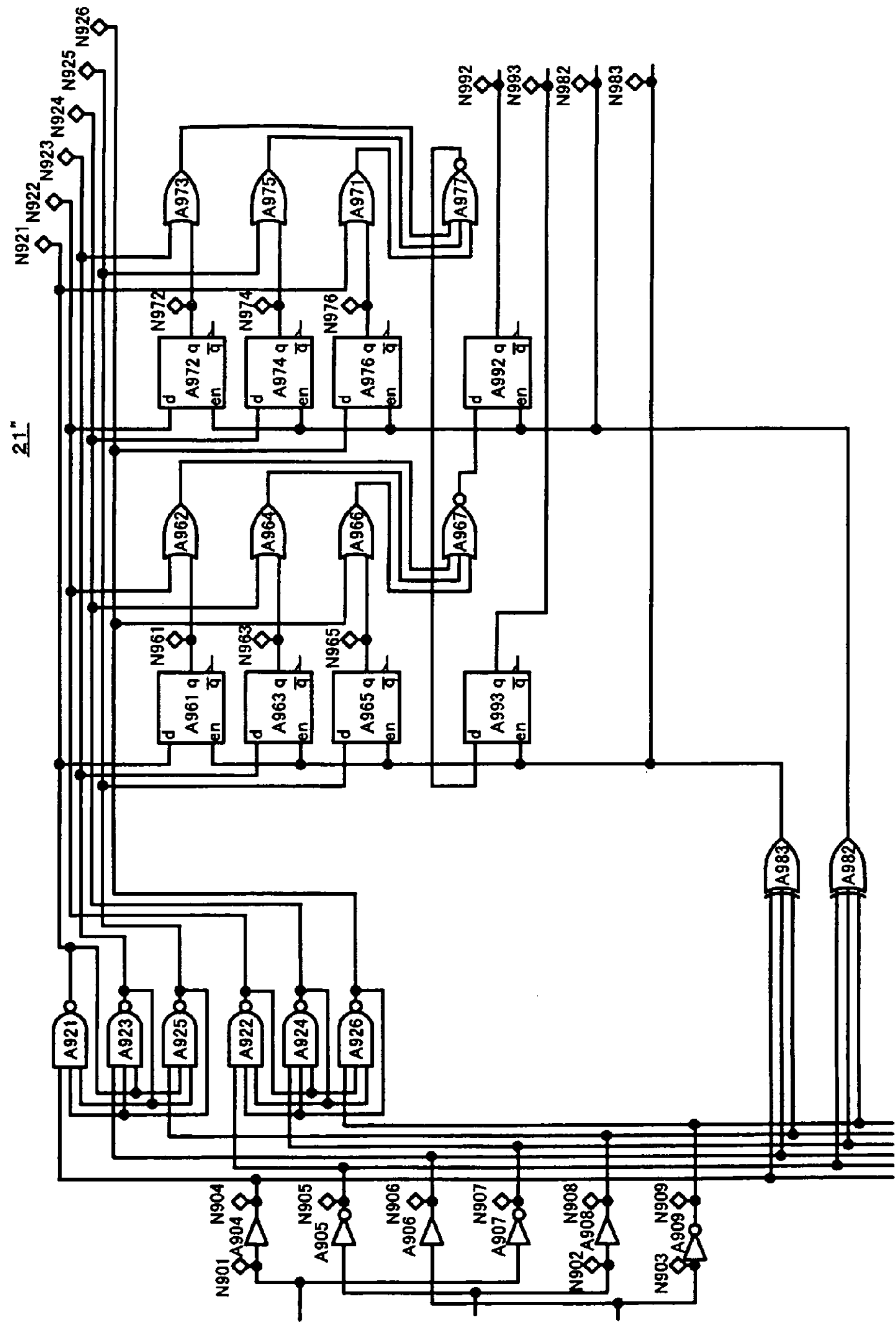
FIG. 39 is a circuit diagram showing an example of the circuit of a decoder according to another modification of the third embodiment of the present invention.

FIG. 39 shows an example of the circuit of a decoder 21" according to another modification of the third embodiment of the present invention. A simulation model of the other modification (referred to as the second modification) of the third embodiment is the same as that of the forgoing third embodiment and the foregoing modification (referred to the first modification) of the third embodiment. A decoded signal is obtained from decode outputs N992 and N993.

In the decoder 21" according to the second modification of the third embodiment, the edge trigger D flip-flops used in the decoder 21' according to the first modification of the third embodiment are replaced with transparent latches. In other words, with reference to FIG. 37, the latch circuits A941, A943, and A945 of the edge trigger D flip-flops, which make up the first intermediate latch circuit according to the first modification of the third embodiment are replaced with latch circuits A961, A963, and A945 of transparent latches. Likewise, the latch circuits A952, A954, and A956 of edge trigger D flip-flops, which make up the second intermediate latch circuit in FIG. 37, are replaced with latch circuits A972, A974, and A976 of transparent latches. In addition, the latch circuits A996 and A997 of edge trigger D flip-flops, which make up the third and fourth latch circuits in FIG. 37, are replaced with latch circuits A992 and A993 of transparent latches. Decode outputs are obtained from the latch circuits A992 and A993.

The structure of connections and so forth shown in FIG. 39 is common with that shown in FIG. 37. Thus, the detailed description of the structure will be omitted.

In the second modification of the third embodiment of the present invention, since the latch circuits of the first and second latch circuits and the third and fourth latch circuits of edge trigger D flip-flops are replaced with transparent latches, a hold time for which the first and second intermediate latches hold data is short. Thus, the data output timing of the second modification of the third embodiment becomes the same as that of the third embodiment.

Figure 40:
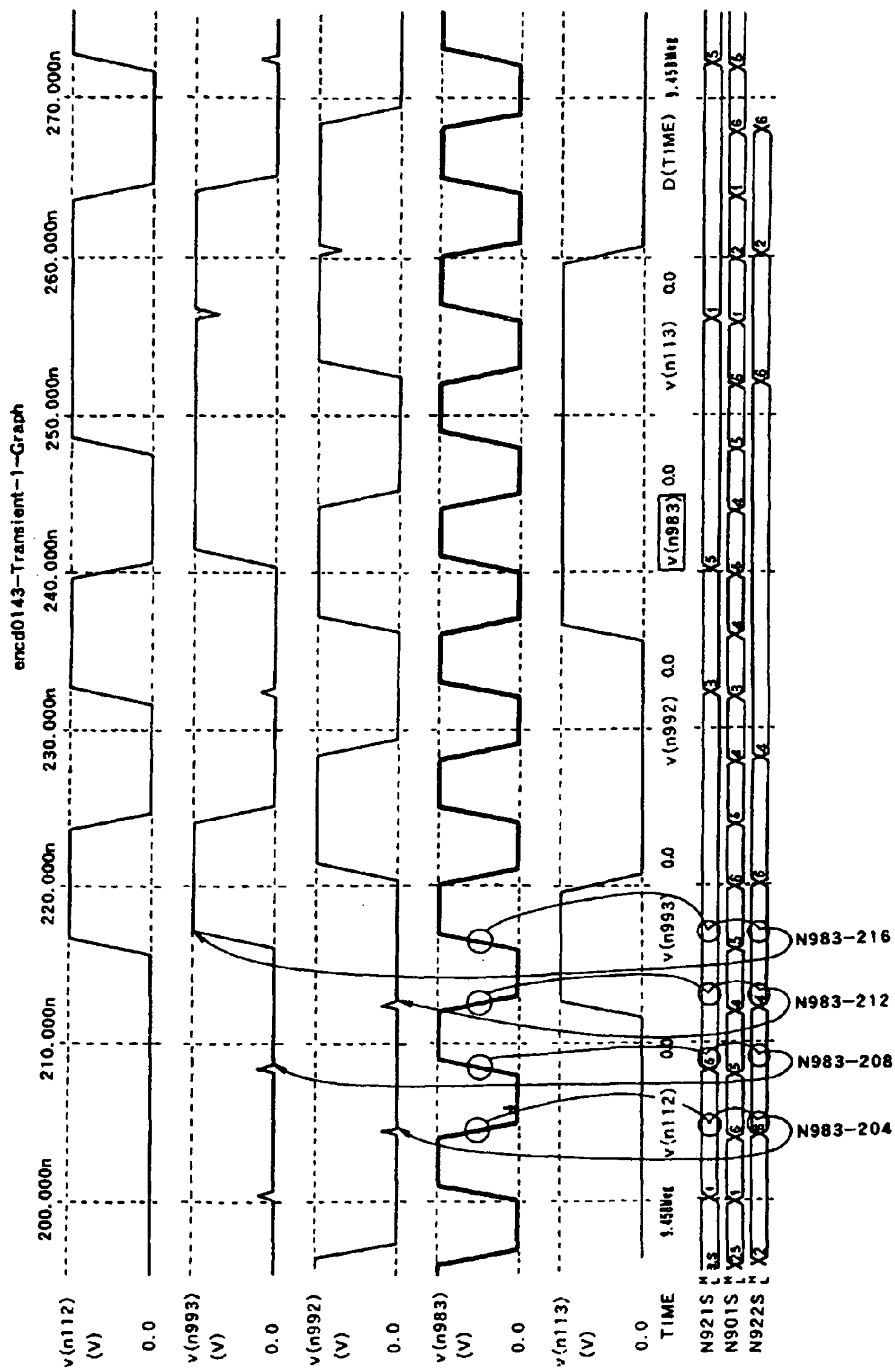
FIG. 40 is a timing chart describing an example of the operation of the decoder according to the other modification of the third embodiment of the present invention.

FIG. 40 shows an example of a simulation result of the operation of the decoder 21" according to the second modification of the third embodiment using the foregoing simulation software. When the timing chart shown in FIG. 40 and the timing chart of the decoder 21 according to the third embodiment shown in FIG. 34 are compared, it is clear that decode outputs v (n992) and v (n993) shown in FIG. 40 are nearly the same as decode outputs v (n938) and v (n939) shown in FIG. 34.

According to the third embodiment, the first modification of the third embodiment, and the second modification of the third embodiment, the decoders 21, 21', and 21" are made up of only ordinary digital circuits. Thus, it is not necessary to use a differentiation circuit that reproduces a clock and other circuits. As a result, the decode speed range becomes wider.

In addition, since encode data are input to a data hold circuit before they are sampled, the minimum inversion interval of a signal to be sampled becomes long. As a result, the timing margin increases. When the operation speeds of the logic circuits, the latch circuits, and so forth are the same, the maximum transmission band becomes wider. When the maximum transmission band is the same, the decoder can be made up of logic circuits that operate at lower speed. As a result, the power consumption and cost of the decoder can be reduced.

In addition, since intermediate latch circuits that latch outputs of data hold circuits that hold input data with a clock are disposed, the internal timing margin increases. As a result, regardless of whether the delays of combination logic circuits that are necessary to determine a state transition are large or small, the decode operation can be stably performed.

In addition, since three-bit three-stable latch circuits that keep stable in three states are used for data hold circuits that hold input data, an improper state transition due to noise or the like can be suppressed.

In addition, since inputs and outputs of data hold circuits that hold input data, inputs and outputs of combination logic circuits, and inputs and outputs of latch circuits are differential, a decrease of the timing margin due to internal asymmetry of the logic circuits and the latch circuits can be minimized. In this example, the internal asymmetry represents asymmetry of a leading time and a trailing time of a clock or asymmetry of a leading drive performance and a trailing drive performance of the clock.

4-4. Supplement of Third Embodiment of Present Invention

According to the third embodiment, the first modification of the third embodiment, and the second modification of the third embodiment, in the first and second data hold circuits, NAND type data hold circuits are used. Instead of NAND type data hold circuits, NOR type circuits may be used. In this case, when logics of inputs and outputs are inverted, the same operation as the NAND type data hold circuits may be performed:

The same operation as the first data hold circuit may be performed when a positive logic encode input is connected to an NAND type data hold circuit, a negative logic encode input is connected to an NOR type data hold circuit, and a data hold output is a differential output. Likewise, the same operation as the second data hold circuit may be performed when a negative logic encode input is connected to an AND type data hold circuit, a negative type encode input is connected to an NOR type data hold circuit, and a data hold output is a differential output.

The same operation as the first combination logic circuit and the second combination logic circuit may be performed when they have differential inputs and the differential first and second data hold outputs are connected.

On the state transition charts, regardless of whether the first and second combination logic circuits detect an increase of a state number, a decrease of a state number, or both an increase and a decrease of state numbers, the same operation may be performed.

In addition, when latches or sense amplifiers that have both positive inputs and negative inputs are used as the first latch circuit and the second latch circuit are used and they are connected to differential outputs of the combination logic circuits, the same operation may be performed.

In the foregoing, the first latch circuit and the second latch circuit are made up of transparent latches. Instead, when the first and second latch circuits are made of three-state latch circuits, the same operation may be performed.

Instead, when the third latch circuit and the fourth latch circuit are omitted, a decode output is input to another module, and the module samples the decode data with a clock, the same operation may be performed. In addition, when the third latch circuit and the fourth latch circuit are replaced with edge trigger D flip-flop circuits or the like, the same operation may be performed.

When the differential receiver circuit disclosed by the applicant of the present invention as Japanese Patent No. 3360861 is connected to the decoder inputs N901 to N903 of the decoder according to the third embodiment, the first modification of the third embodiment, and the second modification of the third embodiment, three-value three-differential inputs can be performed.

Figure 41:
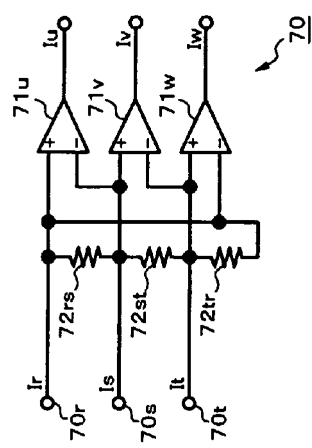
FIG. 41 is a circuit diagram showing an example of the structure of a differential receiver device.

FIG. 41 shows the structure of the differential receiver device disclosed in Japanese Patent No. 3360861. The differential receiver device is designated by reference numeral 70. FIG. 42 shows a truth table of inputs and outputs of the differential receiver device 70. The differential receiver device 70 has three input terminals 70*r*, 70*s*, and 70*t* connected to three transmission lines through which three-value three-differential logic signals are transmitted. The differential receiver device 70 has three termination resistors 72*rs*, 72*st*, and 72*tr* that are delta connected to the input terminals 70*r*, 70*s*, and 70*t* and that match impedance for the three transmission lines and three voltage comparators 71*u*, 71*v*, and 71*w* that input terminal voltages of the termination resistors 72*rs*, 72*st*, and 72*tr*, respectively. The voltage comparators 71*u*, 71*v*, and 71*w* compare voltages of signals that are input to positive and negative input terminals with for example differential amplifier circuits. When transmission line inputs of the truth table of FIG. 42 are input to the input terminals 70*r*, 70*s*, and 70*t*, outputs such as receiver outputs take place at output terminals Ou, Ov, and Ow, respectively.

Figure 1:
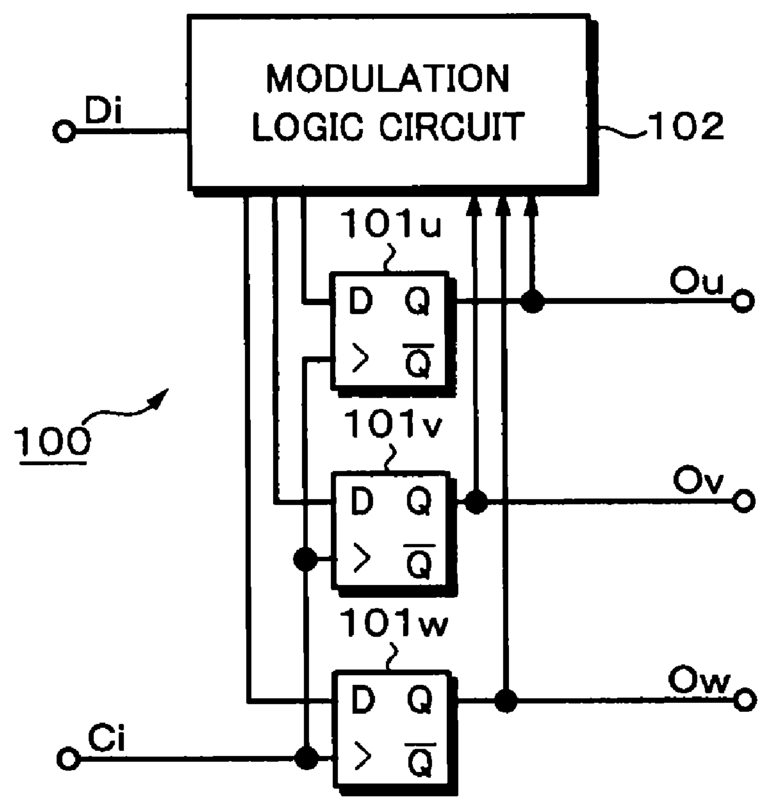
FIG. 1 is a circuit diagram showing an example of the structure of a modulator according to the related art.
Figure 4:
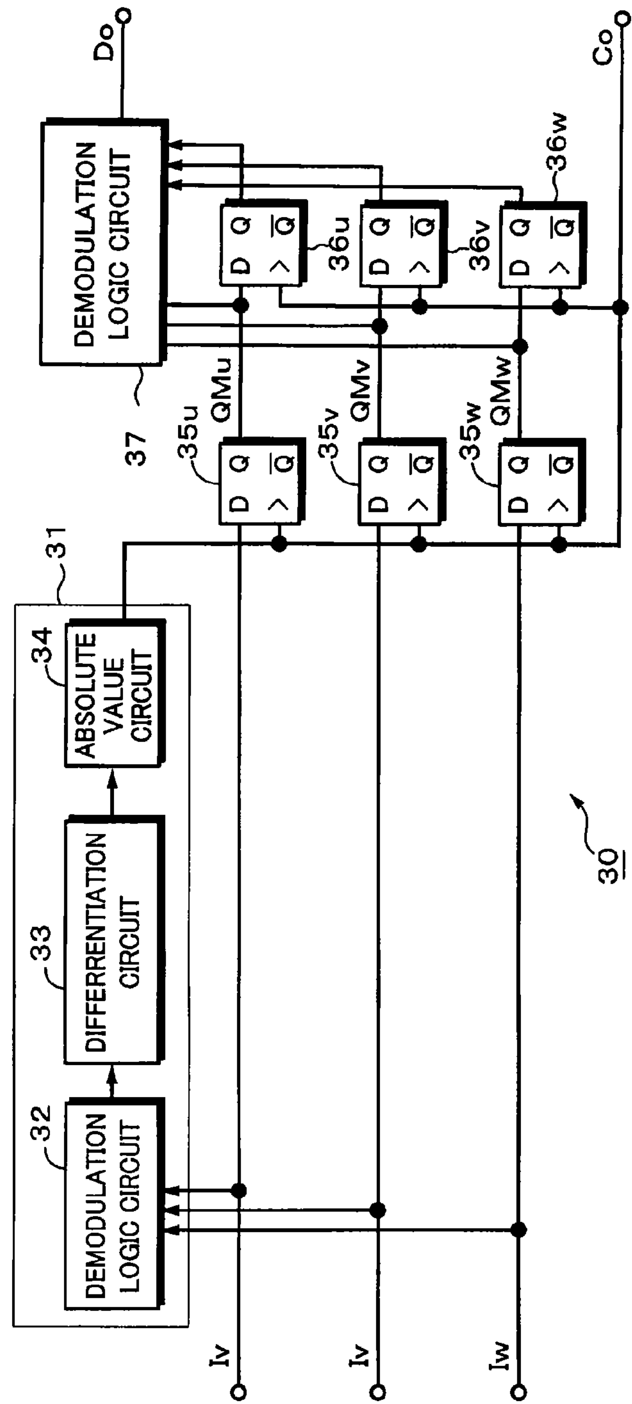
FIG. 4 is a circuit diagram showing an example of the structure of a demodulator according to the related art.

In the simulations of the third embodiment, the first modification of the third embodiment, and the second modification of the third embodiment, the encoder used in the first embodiment and the modification of the first embodiment was used. However, the encoder may not be limited to that. In other words, the decoder according to the third embodiment, the first modification of the third embodiment, and the second modification of the third embodiment may be driven with an output of the encoder apparatus of the related art shown in FIG. 1 or an output of another encoder apparatus described in the modification of the second embodiment.

5. Fourth Embodiment of Present Invention

Next, a fourth embodiment of the present invention will be described. The fourth embodiment of the present invention is a decoding apparatus that decodes three-value three-differential logic signals that represent six types of state transitions and that are transmitted through three transmission lines and obtains four-phase serial digital signals.

Figure 43:
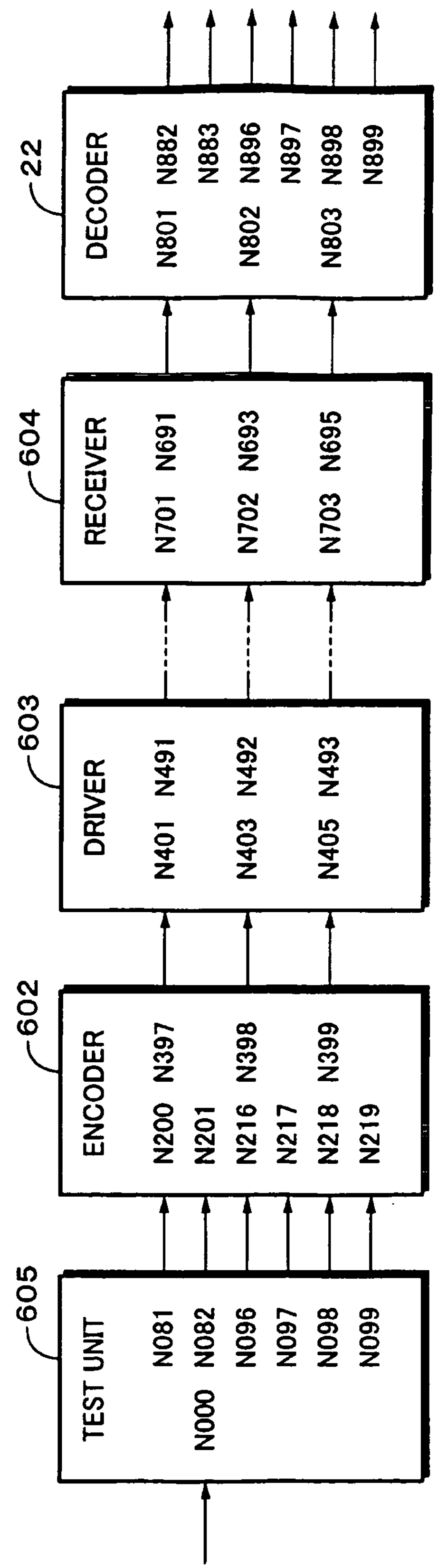
FIG. 43 is a block diagram showing an example of the system structure according to a fourth embodiment of the present invention.

FIG. 43 shows an example of the system structure according to the fourth embodiment of the present invention. An encoder 602 converts four-phase serial digital signals N216 to N219 into three-bit six-state transitions as signals N397 to N399 with clock inputs N200 and N201. A driver 603 converts voltage levels of signals N397 to N399 and single end signals thereof into differential signals and transmits the converted signals to the three transmission lines. The signals N397 to N399 are received by a receiver 604 through the transmission lines. The receiver 604 converts the voltages and differential signals into single end signals. As a result, three-bit six-state transition signals are output from the data outputs N691 to N693 and input to data inputs N801 to N803 of a decoder 22. The decoder 22 corresponding to the decoder 9 shown in FIG. 7 separates the input three-bit six-state transition signals into data signals and clock signals. The obtained clock signals are output from clock outputs N882 and N883.

In addition, four-phase data whose phases are different are output to outputs N896 to N899.

A test unit 605 generates a test signal. The test unit 605 generates a clock that operates a state number conversion circuit 602, outputs the clock from clock output N081 and N082, and outputs four-phase data signals generated corresponding to pseudo random numbers from data outputs N096 to N099.

5-1-1. Simulation Model

Figure 44:
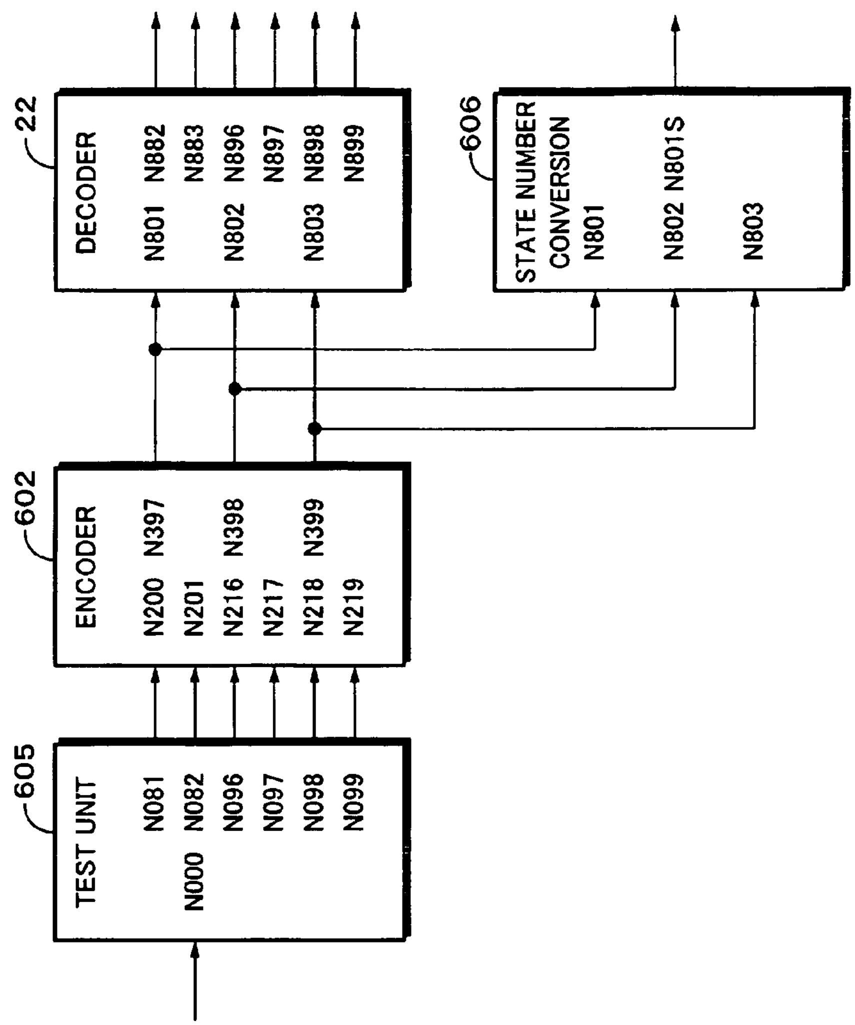
FIG. 44 is a block diagram showing an outline of a simulation model used to verify the operation of a decoder according to the fourth embodiment of the present invention.

FIG. 44 shows an outline of a simulation model used to very the operation of the decoder 22 according to the fourth embodiment of the present invention. Since the simulation model is to verify the relationship of inputs and outputs of the decoder 22, the driver 603 on the transmission side and the receiver 604 on the reception side are omitted. The encoder 602 and the decoder 22 are directly connected to simulate the decoder 22. Output signals N397 to N399 of the encoder 602 are input to the decoder 22 and branched to inputs N801 to N803 of a state number conversion circuit 606 that generates an operation description state number. The state number change circuit 606 converts an input signal into a state number and obtains a state number output N801S. As described above, the state number is an integer number that ranges from "1" to "6". Whenever the state transitions, the state number is incremented or decremented by "1". The state number is a cyclic value. When the state value is "6", if it is incremented by "1", it becomes "1". When the state value is "1", if it is decremented by "1", it becomes "6".

FIG. 45A shows an example of a truth table of the state number conversion table 606. The state number conversion table 606 converts input six states into state values ranging from "1" to "6", and outputs the converted state numbers. In this example, when the three bits are (0, 0, 1), they represent state number "1". When the three bits are (0, 1, 1), they represent state number "2". When the three bits are (0, 1, 0), they represent state number "3". When the three bits are (1, 1, 0), they represent state number "4". When the three bits are (1, 0, 0), they represent state number "5". When the three bits are (1, 0, 1), they represent state number "6". State numbers "0" and "7" are not used because all three bits are the same.

FIG. 45A shows a truth table for which hold outputs N824, N822, and N826 (see FIG. 47) of a first data hold circuit (that will be described later) as internal states of the decoder 22 are converted into state number N822S. FIG. 45B shows a truth table for which hold outputs N821, N825, and N823 of a second hold circuit against the first data hold circuit are bit-inverted and converted into state number N821S.

Conversion circuits such as the state number conversion circuit 606 and state numbers are used to describe waveforms of simulation results. The real operation for the decoder 22 is performed for original three-bit data input that is converted into a state number.

Figure 46:
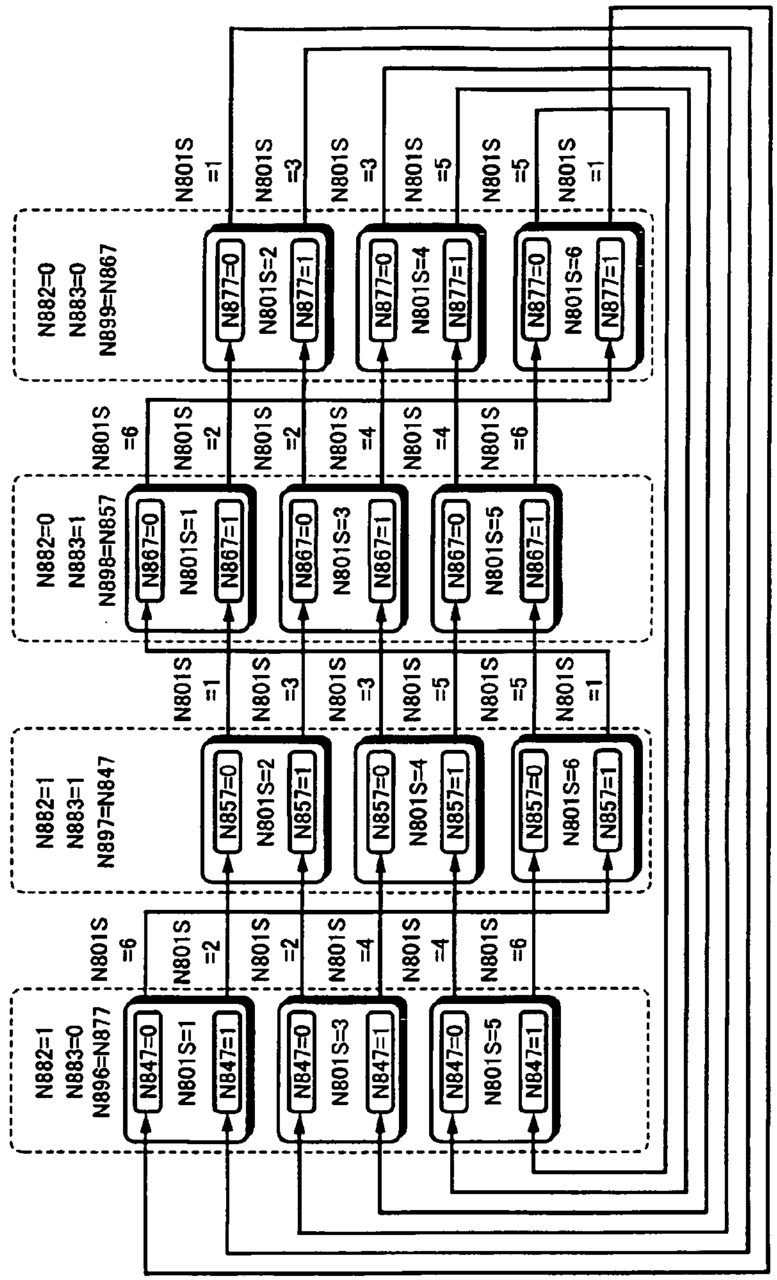
FIG. 46 is a schematic diagram showing examples of state transitions of the decoder according to the fourth embodiment of the present invention.

FIG. 46 shows an example of state transitions of the decoder 22 according to the fourth embodiment of the present invention. The decoder 22 alternately inverts a first clock output N882 and a second clock output N883 corresponding to the current value and the changed value of input data of state number N801S converted corresponding to the truth table shown in FIG. 45A and successively updates the data outputs N836 to N839.

5-1-2. Structure of Decoder

Figure 47:
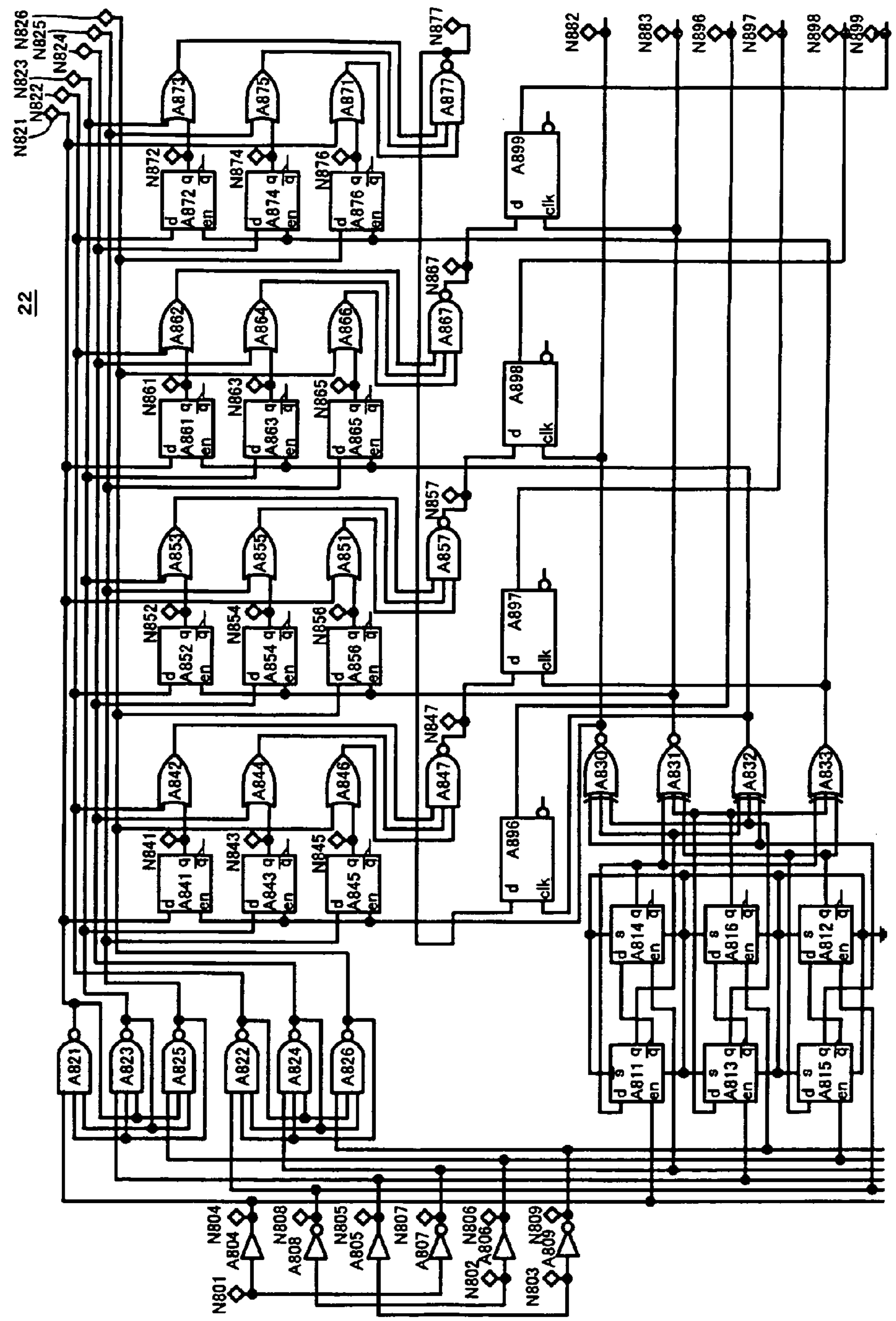
FIG. 47 is a circuit diagram showing an example of the circuit of the decoder according to the fourth embodiment of the present invention.

FIG. 47 shows an example of the circuit of the decoder 22 according to the fourth embodiment of the present invention. Two-value three-bit six-state transition signals are input to decode inputs N801, N802, and N803 and clock signals whose phases are different by 90 degrees are output to clock outputs N882 and N883. In addition, output data whose phases are different are output to decode outputs N836 to N839.

The decode inputs N801, N802, and N803 are supplied to an input buffer circuit made up of gate circuits A804 to A809. The input buffer circuit generates input signals and their inverted signals. When a three-bit encode input and its inverted signal are input to the decoder 22, the input buffer circuit can be omitted.

A non-inverted signal and an inverted signal of the decode input N801 are supplied to a first sequential logic circuit made up of transparent latches A811 and A814. The transparent latch A811 and A814 make up a T flip-flop. With outputs of the latches, an output that is inverted at timing of a leading edge of the decode input N801 and an output that is inverted at timing of a trailing edge of the decode input N801 are obtained.

A non-inverted signal and an inverted signal of the decode input N802 are supplied to a second sequential logic circuit made up of transparent latches A815 and A812. The transparent latch A815 and A812 make up a T flip-flop. With outputs of the latches, an output that is inverted at timing of a leading edge of the decode input N802 and an output that is inverted at timing of a trailing edge of the decode input N802 are obtained.

Likewise, a non-inverted signal and an inverted signal of the decode input N803 are supplied to a third sequential logic circuit made up of transparent latches A813 and A816. The transparent latch A813 and A816 make up a T flip-flop. With outputs of the latches, an output that is inverted at timing of a leading edge of the decode input N803 and an output that is inverted at timing of a trailing edge of the decode input N803 are obtained.

The non-inverted outputs of the transparent latch A814 and A816 are supplied to a first combination logic circuit made up of an EX-NOR gate A831 and an EX-OR gate A833. The non-inverted outputs of the transparent latches A811, A813, and A915 are supplied to a second combination logic circuit made up of an EX-NOR gate A830 and an EX-OR gate A832.

In other words, each of the first and second combination logic circuits is made up of an EX-OR gate and an EX-NOR gate having three inputs that are inverted at timing of a leading edge of any of the decode inputs N801 to N803 and an EX-OR gate and an EX-NOR gate having three inputs that are inverted at timing of a trailing edge of any of the decode inputs N801 to N803. The first combination logic circuit generates a first clock N883. The second combination logic circuit generates a second clock N882 whose phase are different by 90 degrees from the first clock N883.

A first data hold circuit is made up of NAND gates A821, A823, and A825. The first data hold circuit and a second data hold circuit (that will be described later) are circuits equivalent to the three-stable sequence logic circuit described with reference to the truth table according to the first embodiment shown in FIG. 12. Non-inverted signals of the decode inputs N801 to N803 are input to the first data hold circuit. When the state number of any of the decode inputs N801 to N803 changes from an odd number to an even number, the first data hold circuit holds a signal of which a pre-change state is inverted. FIG. 45B shows state numbers corresponding to outputs of the first data hold circuit. In FIG. 45B, outputs of the first data hold circuit are arranged in the order of the NAND gates A821, A825, and A823.

The second data hold circuit is made up of NAND gates A822 A824, and A826. Inverted signals of the decode inputs N801 to N803 are input to the second data hold circuit. When the state number of any of the decode inputs N801 to N803 changes from an even number to an odd number, the second data hold circuit holds pre-change data. FIG. 45A shows state numbers corresponding to outputs of the second data hold circuit. In FIG. 45A, outputs of the second data hold circuit are arranged in the order of the NAND gates A824, A822, and A826. The outputs of the first data hold circuit and the outputs of the second data hold circuit have relationship of inversion of state numbers.

The outputs of the first data hold circuit are supplied to a first intermediate latch circuit, a third intermediate latch circuit, a fourth combination logic circuit, a sixth combination logic circuit. The outputs of the second data hold circuit are supplied to a second intermediate latch circuit, a fourth intermediate latch circuit, a third combination logic circuit, and a fifth combination logic circuit.

The first intermediate latch circuit is made up of transparent latches A841, A843, and A845. With a clock that is output from the EX-NOR gate A830, the first intermediate latch circuit samples the outputs of the first data hold circuit. The sampled outputs are supplied to the third combination logic circuit.

The third combination logic circuit is made up of OR gates A842, A844, and A846 and an NAND gate A847. The third combination logic circuit compares the immediately preceding state that the first intermediate latch circuit holds with the current state that the second data hold circuit outputs and determines the state transition. An output of the third combination logic circuit is supplied to a flip-flop circuit A897.

The second intermediate latch circuit is made up of transparent latches A852, A854, and A856. With a clock that is output from the EX-NOR gate A831, the second intermediate latch samples the outputs of the second data hold circuit. The sampled outputs are supplied to the fourth combination logic circuit.

The fourth combination logic circuit is made up of OR gates A853, A855, and A857 and an NAND gate A857. The fourth combination logic circuit compares the pre-state that the second intermediate latch circuit holds with the current state that the first data hold circuit outputs and determines the state transition. An output of the fourth combination logic circuit is supplied to a flip-flop circuit A898.

The third intermediate latch circuit is made up of transparent latches A861, A863, and A865. With a clock that is output from the EX-NOR gate A832, the third intermediate latch circuit samples the outputs of the first data hold circuit. The sampled outputs are supplied to the fifth combination logic circuit.

The fifth combination logic circuit is made up of OR gates A862, A864, and A866 and an NAND gate A867. The fifth combination logic circuit compares the immediately preceding state that the third intermediate latch circuit holds with the current state that the second data hold circuit outputs and determines the state transition. An output of the fifth combination logic circuit is supplied to a flip-flop circuit A899.

The fourth intermediate latch circuit is made up of transparent latches A872, A874, and A876. With a clock that is output from the EX-NOR gate A833, the fourth intermediate latch circuit samples the outputs of the second data hold circuit. The sampled outputs are supplied to the sixth combination logic circuit.

The sixth combination logic circuit is made up of OR gates A873, A875, and A877 and an NAND gate A877. The sixth combination logic circuit compares the immediately preceding state that the fourth intermediate latch circuit holds with the current state that the first data hold circuit outputs and determines the state transition. An output of the sixth combination logic circuit is supplied to a flip-flop circuit A896.

The flip-flop circuit A896 makes up a first output latch circuit. With a clock that is output from the EX-OR gate A832, the flip-flop circuit A896 latches a logic value of the determined result of the sixth combination logic circuit and outputs the logic value as a decode output N896.

The flip-flop circuit A897 makes up a second output latch circuit. With a clock that is output from the EX-OR gate A833, the flip-flop circuit A897 latches a logic value of the determined result of the third combination logic circuit and outputs the logic value as a decode output N897.

The flip-flop circuit A898 makes up a third output latch circuit. With a clock that is output from the EX-OR gate A830, the flip-flop circuit A898 latches a logic value of the determined result of the fourth combination logic circuit and outputs the logic value as a decode output N898.

The flip-flop circuit A899 makes up a fourth output latch circuit. With a clock that is output from the EX-OR gate A831, the flip-flop circuit A899 latches a logic value of the determined result of the fifth combination logic circuit and outputs the logic value as a decode output N899.

5-1-3. Operation of Decoder

Figure 48:
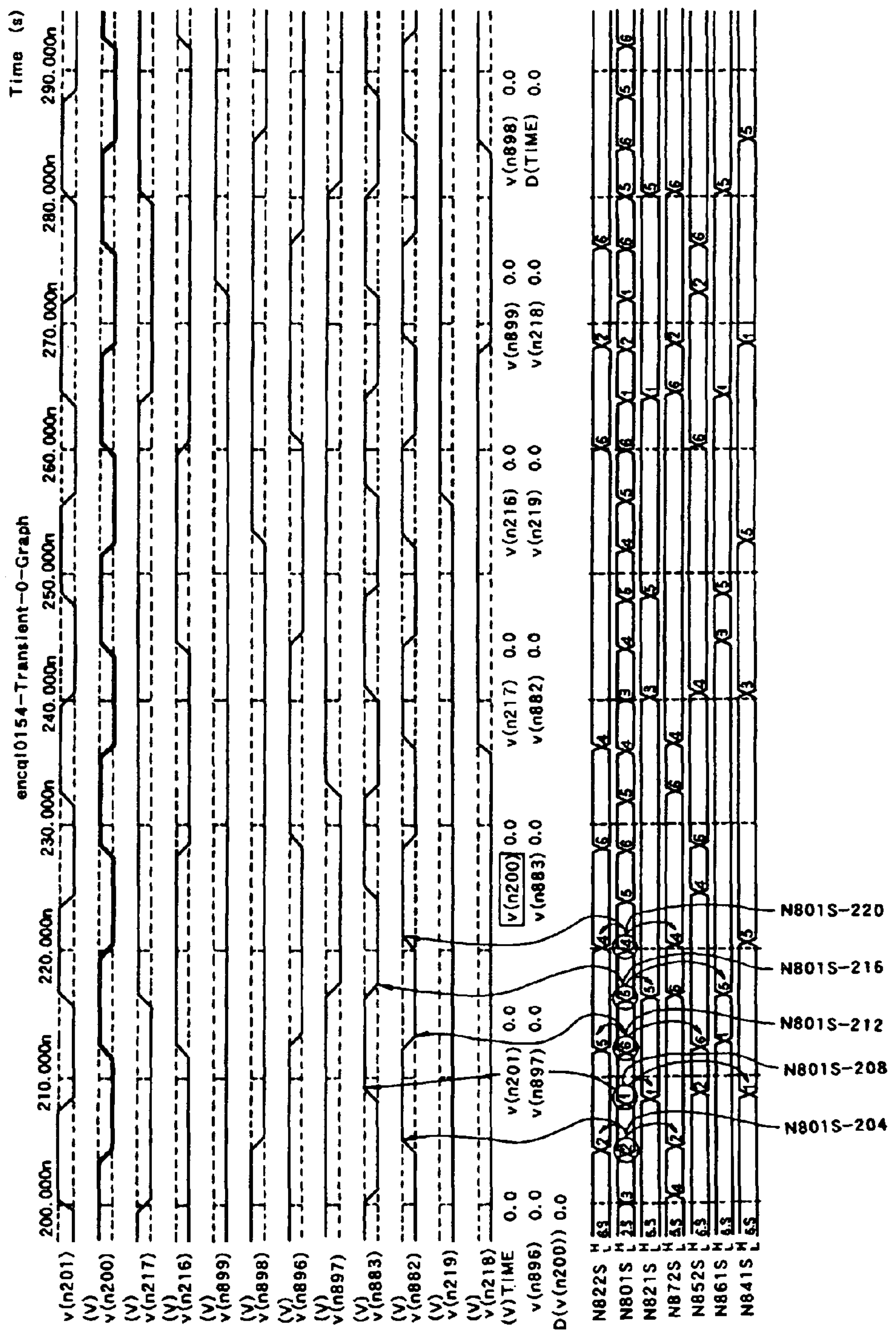
FIG. 48 is a timing chart describing examples of a clock reproduction operation and a data hold operation of the decoder according to the fourth embodiment of the present invention.
Figure 49:
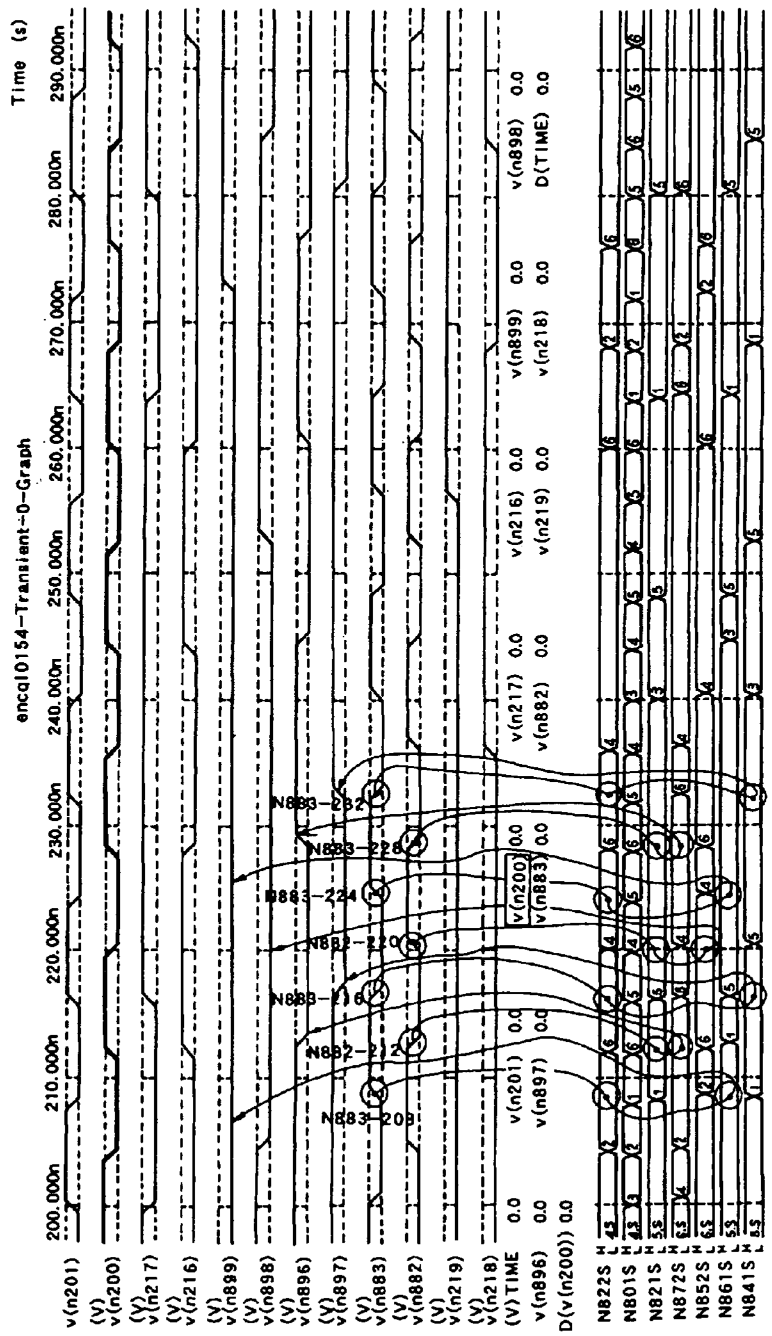
FIG. 49 is a timing chart describing an example of a data reproduction operation of the decoder according to the fourth embodiment of the present invention.

Next, with reference to timing charts shown in FIG. 48 and FIG. 49, an example of the operation of the decoder 22 according to the fourth embodiment of the present invention will be described. The timing charts shown in FIGS. 48 and 49 show an example of a simulation result of the operation of the decoder 22 using the foregoing simulation software. The timing charts plots the relationship of data output signal voltages N896 to N899, clock signals N882 and N883 reproduced by the decoder 22, data inputs v (n200), v (n201), v (n216), and v (n217) of a reference encoder for the simulation, a clock voltage v (n200), and the time axis. Corresponding to them, the timing charts plot the relationship of state numbers N821S, N822S, N841S, N852S, N861S, and N872S of the decoder 22 and the time axis. In addition, the timing charts plot the relationship of state number N801S that represents an input signal of the decoder 21 and the time axis.

The timing charts shown in FIG. 48 and FIG. 49 are the same except for reference numerals and so forth.

First, with reference to the timing chart shown in FIG. 48, a clock reproduction operation and a data hold operation of the decoder 22 will be described. In the clock reproduction operation, whenever state number N801S of the decode inputs N801 to N803 changes from an odd number to an even number, the clock signal N882 is inverted. Whenever state number N801S of the decode inputs N801 to N803 changes from an even number to an odd number, the clock signal N883 is inverted. As a result, two types of clock signals whose phases are different by 90 degrees are reproduced.

The data hold operation is preformed by the first and second data hold circuits. When state number N801S of the input signal becomes an even number, the first data hold circuit holds the state as the internal state N821S and keeps the state until state number N801S becomes an even number again. When state number N801S of the input signal becomes an odd number, the second data hold circuit holds the state as the internal state N822S and keeps the state until state number N801S becomes an odd number again. A state number that take place as a state transitions is copied to one of four internal states N841S, N852S, N861S, and N872S. The copied state number is kept while the clock changes at least three times.

On the timing chart shown in FIG. 48, at a state transition N801S-204, input state number N801S changes from "3" to "2". As a result, input state number N801S becomes an even number. The clock signal N882 is inverted and becomes "1" level. In addition, since the latest even state number becomes "2", the state number held as the internal state N822S is "2".

The state number of the internal state N822S is copied to the internal state N872S. The internal state N872S is kept until the clock changes three times.

At the next state transition N801S-208, input state number N801S changes from “2” to “1”. As a result, input state number N801S becomes an odd number. The clock signal N883 is inverted and becomes “1” level. Since the latest odd state number becomes “1”, the state number held as the internal state N821S is “2”. The state number of the internal state N821S is copied to the internal state N841S. The internal state N841S is kept until the clock changes three times.

Likewise, at a state transition N801S-212, input state number N801S changes from “1” to “6”. As a result, input state number N801S becomes an even number. The clock signal N882 is inverted and becomes “0” level. Since the latest even state number is “6”, the state number stored as an internal state N822S is “6”. The state number of the internal state N822S is copied to the internal state N852S. The internal state N852S is kept until the clock changes three times.

At a state transition N801S-216, input state number N801S changes from “6” to “5”. As a result, input state number N801S becomes an odd number. The clock signal N883 is inverted and becomes “0” level. In addition, since the latest even state number becomes “5”, the state number stored as the internal state N821S is “5”. The state number of the internal state N821S is copied to the internal state N861S. The internal state N861S is kept until the clock changes three times.

The clock reproduction operation and the state number hold operation are repeated whenever the state of the input signal changes.

Next, with reference to FIG. 49, the data reproduction operation of the decoder 22 will be described. Since the reproduction of the clocks N882 and N883 has been described with reference to FIG. 48, the decode operation corresponding to the clocks N882 and N883, the internal states N821S and N822S held in the first and second hold circuits, and the internal states N841S, N852S, N861S, and N872S held in the first to fourth intermediate latch circuits will be described.

At timing of a leading edge N883-208 of the clock N883, the compared result of the two-clock-period prior internal state N861S and the immediately preceding internal state N822S is sampled. In other words, at timing of the leading edge N883-208 of the clock N883, the fourth latch circuit A899 latches the outputs of the fifth combination logic circuit. Since the state number of the internal state N861S is “3” and the state number of the internal state N822S is “2”, it is determined that the state number be decremented. As a result, logic value “0” is output to the data output N899.

At timing of a trailing edge N882-212 of the clock N882, the compared result of the two-clock-period prior internal state N872S and the immediately preceding internal state N821S is sampled. In other words, at timing of the trailing edge N882-212 of the clock N882, the first latch circuit A896 latches the outputs of the sixth combination logic circuit. Since the state number of the internal state N872S is “2” and the state number of the internal state N821S is “1”, it is determined that the state number be decremented. As a result, logic value “0” is output to the data output N896.

At timing of a trailing edge N883-216 of the clock N883, the compared result of the two-clock-period prior internal state N841S and the immediately preceding internal state N822S is sampled. In other words, at timing of the trailing edge N883-216 of the clock N883, the second latch circuit latches the outputs of the third combination logic circuit. Since the state number of the internal state N841S is “1” and the state number of the internal state N822S is “6”, it is determined that the state number be decremented. As a result, logic value “0” is output to the data output N897.

At timing of a leading edge N882-220 of the clock N882, the compared result of the two-clock-period prior internal state N852S and the immediately preceding internal state N821S is sampled. In other words, at timing of the leading edge N882-220 of the clock N882, the third latch circuit latches the outputs of the fourth combination logic circuit. Since the state number of the internal state N852S is “6” and the state number of the internal state N822S is “5”, it is determined that the state number be decremented. As a result, logic value “0” is output to the data output N898.

By repeating the same operation, logic values obtained as the decode results are successively output to the four data outputs N896, N897, N898, and N899.

Figure 50:
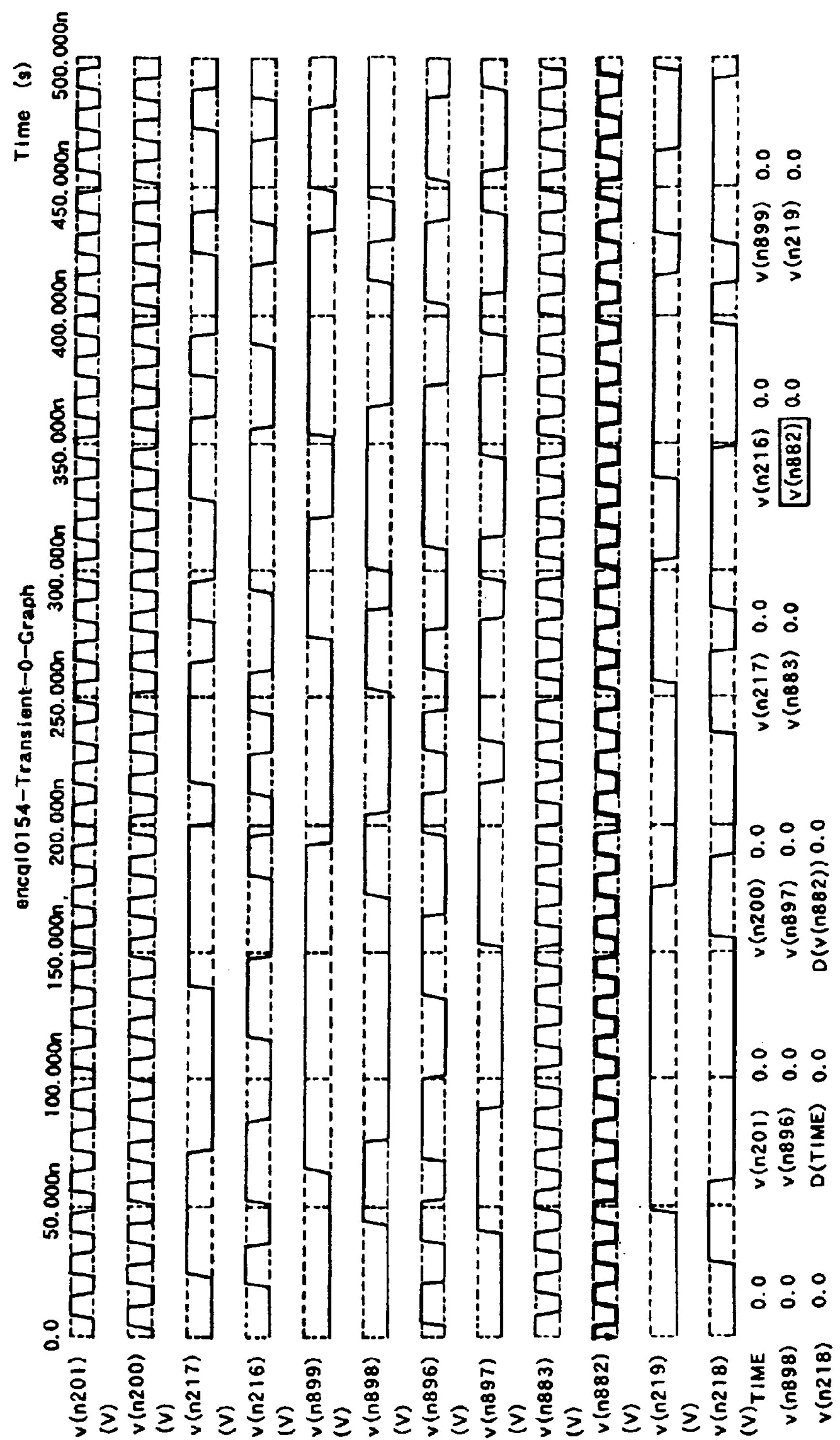
FIG. 50 is a timing chart showing a simulation result in a long time range of an operation of the decoder according to the fourth embodiment of the present invention.

FIG. 50 is a timing chart showing an example of the simulation result of the operation of the decoder 22 in a longer time range. In FIG. 50, state numbers are omitted. Except in an initial cycle (0 ns to 25 ns) in which the latches and flip-flops are not initialized, it is clear that the data inputs N216, N217, N218, and N219 that are input to the encoder 602 are deleted decoder outputs N896, N897, N898, and N899 as results of which they pass through the encoder 602 and the decoder 22.

Figure 51:
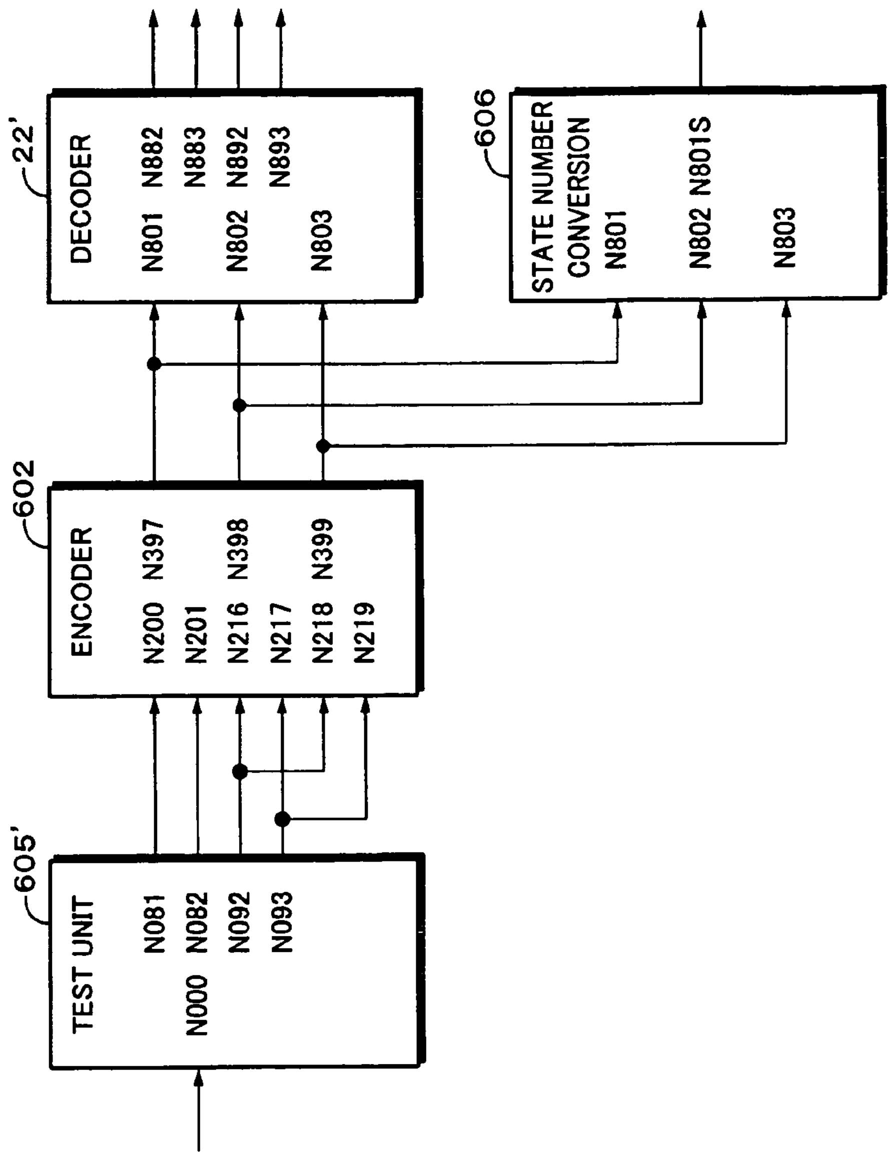
FIG. 51 is a block diagram showing an outline of a simulation model used to verify the operation of a decoder according to a modification of the fourth embodiment of the present invention.

5-2. Modification of Fourth Embodiment of Present Invention 5-2-1. Simulation Model Next, a modification of the fourth embodiment of the present invention will be described. FIG. 51 shows an outline of a simulation model used to verify the operation of a decoder 22' according to the modification of the fourth embodiment. An encoder 602, a state number conversion circuit 606, a truth table of the state number conversion circuit 606, and so forth of the modification of the fourth embodiment are the same as those of the foregoing fourth embodiment. A test unit 605' outputs clock signals that operate the encoder 602 from clock outputs N081 and N082. In addition, the test unit 605' outputs from data outputs N092 and N093 two-phase data signals that are generated corresponding to pseudo random numbers and whose phases are different. A data signal that is output from the data output N092 is supplied to encode inputs N216 and N218 of the encoder 602. A data signal that is output from the data output N093 is input to encode inputs N217 and N219 of the encoder 602.

Figure 52:
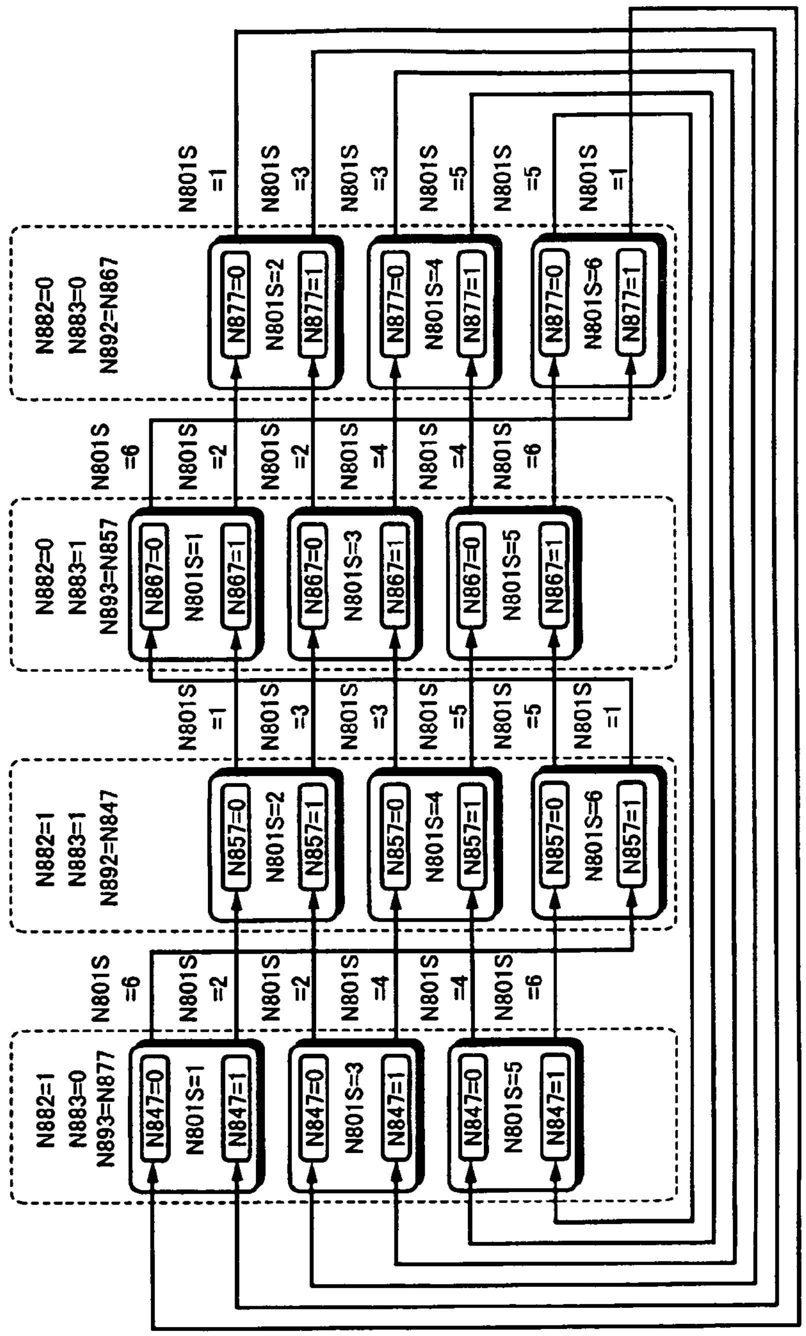
FIG. 52 is a schematic diagram showing examples of state transitions of the decoder according to the modification of the fourth embodiment of the present invention.
Figure 53:
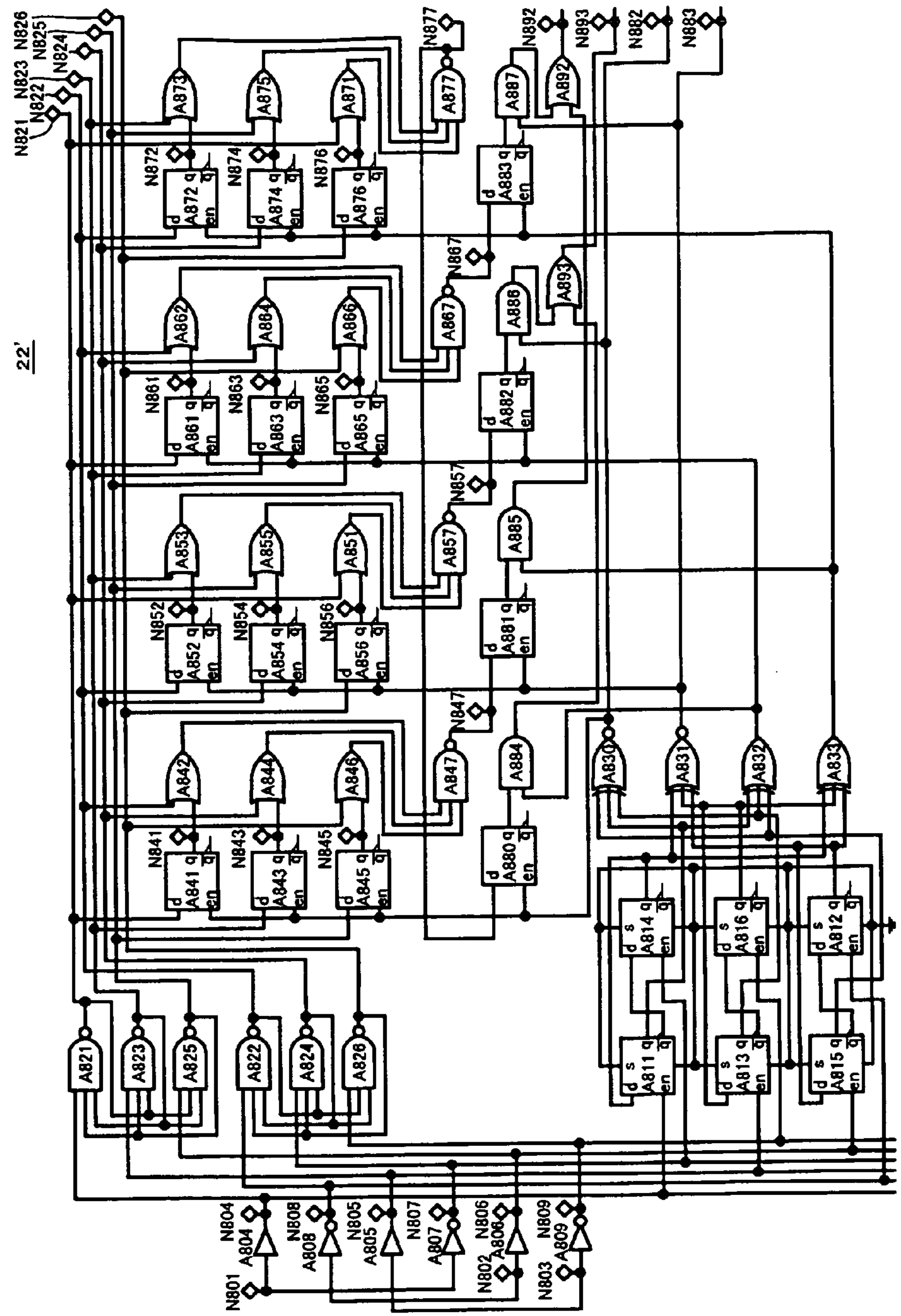
FIG. 53 is a circuit diagram showing an example of the circuit of the decoder according to the modification of the fourth embodiment of the present invention.

FIG. 52 shows examples of state transitions of the decoder 22' according to the modification of the fourth embodiment of the present invention. The decoder 22' alternately inverts a first clock output N882 and a second clock output N883 corresponding to the current value and the changed value of three-bit input data represented as state number N801S and converted with the truth table shown in FIG. 45. In addition, corresponding to the determined results of state transitions of the combination logic circuits, the states N847, N857, N867, and N868 are successively updated. The determined results cause alternately the decode output N893 or N892 to be updated at the next clock edge.

5-2-2. Structure of Decoder

FIG. 57 shows an example of the circuit of the decoder 22' according to the modification of the fourth embodiment of the present invention. The decoder 22' inputs a two-value three-bit six-state transition signals to the decode inputs N801 to N803, outputs a clock and an inverted clock to the clock outputs N882 and N883, and outputs output data whose phases are different to decode outputs N892 and N893.

The structure of the decoder 22' is different from that of the decoder 22 shown in FIG. 47 in the first to fourth output latch circuits (flip-flop circuits A896, A897, A898, and A899). The other sections are common in both the decoder 22' and the decoder 22. In the following, the description of the common sections will be omitted.

A transparent latch A880 makes up a first output latch circuit. The first output latch circuit latches a logic value of a state transition determined by a six combination logic circuit with a clock that is output from an EX-OR gate A832. An output of the first output latch circuit is supplied to a first output selection circuit.

A transparent latch A881 makes up a second output latch circuit. The second output latch circuit latches a logic value of a state transition determined by a third combination logic circuit with a clock that is output from an EX-OR gate A833. An output of the second output latch circuit is supplied to a second output selection circuit.

A transparent latch A882 makes up a third output latch circuit. The third output latch circuit latches a logic value of a state transition determined by a fourth combination logic circuit with a clock that is output from an EX-OR gate A830. An output of the third output latch circuit is supplied to a first output selection circuit.

A transparent latch A883 makes up a fourth output latch circuit. The fourth output latch circuit latches a logic value of a state transition determined by a fifth combination logic circuit with a clock that is output from an EX-OR gate A831. An output of the fourth output latch circuit is supplied to a second output selection circuit.

The transparent latches A880 to A883 are transparent latches that hold data when their input is "0". Instead, when negative edge trigger D flip-flops are used, the same effect as the transparent latches may be obtained.

The first output selection circuit is a one-bit two-input one-output multiplexer made up of AND gates A884 and A886 and an OR gate A893. The first output selection circuit alternately changes the output of the first output latch circuit and the output of the third output latch circuit with the clock N882 and outputs the selected output as a decode output N893.

The second output selection circuit is a one-bit two-input one-output multiplexer made up of AND gates A885 and A887 and an OR gate A892. The second output selection circuit alternately changes the output of the second output latch circuit and the output of the fourth output latch circuit with the clock N883 and outputs the selected output as a decode output N892.

5-2-3. Operation of Decoder

Figure 54:
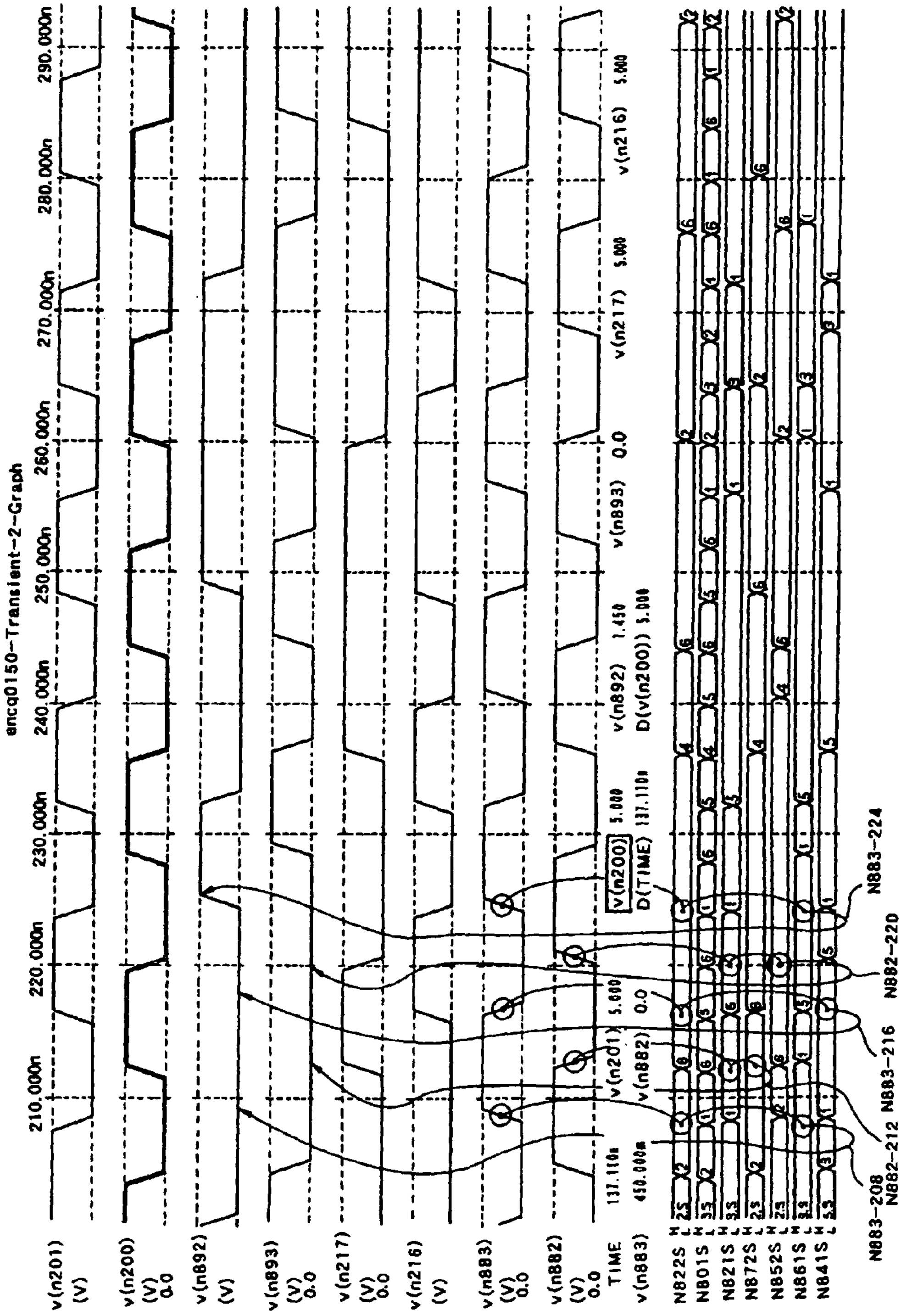
FIG. 54 is a timing chart describing an example of the operation of the decoder according to the modification of the fourth embodiment of the present invention.

An example of the operation of the decoder 22' according to the modification of the fourth embodiment will be described with reference to a timing chart shown in FIG. 54. The timing chart shown in FIG. 54 shows an example of a simulation result of the operation of the decoder 22' using the foregoing simulation software. The timing chart plots the relationship of data output signal voltages N892 and N893, a clock signal N893 reproduced by the decoder 22', data inputs v (n212) and v (n213) of a reference encoder for the simulation, a clock voltage v (n200), and the time axis. Corresponding to them, the timing chart also plots the relationship of internal state numbers N821S, N822S, N841S, N852S, N861S, and N872S of the decoder 22' and the time axis. In addition, the timing chart plots the relationship of state number N801S that represents an input signal of the decoder 21 and the time axis.

Since a clock reproduction operation, a data hold operation, a hold operation of which the intermediate latch circuits hold data hold results until a clock changes three times of the decoder 22' according to the modification of the fourth embodiment are the same as those of the decoder 22 according to the foregoing fourth embodiment, their description will be omitted. In the following, points in which the decoder 22' are different from the decoder 22, namely a data reproduction operation, operations of first to fourth output latch circuits, and operations of first and second output selection circuits will be described. The decoder 22' is different from the decoder 22 in logic values as decode outputs are alternately output to two systems by the first and second output selection circuits.

At timing of a leading edge N883-208 of the clock N883, the compared result of the internal state N861S and the internal state N822S is sampled. In other words, at timing of the leading edge N883-208 of the clock N883, the first output latch circuit latches the output of the sixth combination logic circuit. Since the state number of the internal state N861S is "3" and the state number of the internal state N822S is "2", it is determined that the state number be decremented. As a result, logic value "0" is output to the data output N892.

At timing of a trailing edge N882-212 of the clock N882, the compared result of the internal state N872S and the internal state N821S is sampled. In other words, at timing of the trailing edge N882-212 of the clock N882, the fourth output latch circuit latches the output of the fifth combination logic circuit. Since the state number of the internal state N872S is "2" and the state number of the internal state N872S is "2", it is determined that the state number be decremented. As a result, logic value "0" is output to the data output N893.

At timing of a trailing edge N883-216 of the clock N883, the compared result of the internal state N841S and the internal state N822S is sampled. In other words, at timing of the trailing edge N883-216 of the clock N883, the second output latch circuit latches the output of the third combination logic circuit. Since the state number of the internal state N841S is "1" and the state number of the internal state N822S is "6", it is determined that the state number be decremented. As a result, logic value "0" is output to the data output N892.

At timing of a leading edge N882-220 of the clock N882, the compared result of the internal state N852S and the internal state N821S is sampled. In other words, at timing of the leading edge N882-220 of the clock N882, the third output latch circuit latches the output of the fourth combination logic circuit. Since the state number of the internal state N852S is "6" and the state number of the internal state N821S is "5", it is determined that the state number be decremented. As a result, logic value "0" is output to the data output N893.

At timing of a leading edge N883-224 of the clock N883, the compared result of the internal state N861S and the internal state N822S is sampled. In other words, at timing of the leading edge N883-224 of the clock N883, the fourth output latch circuit latches the output of the fifth combination logic circuit. Since the state number of the internal state N861S is "5" and the state number of the internal state N822S is "6", it is determined that the state number be incremented. As a result, logic value "1" is output to the data output N892.

By repeating the state transition determination operation, logic values obtained as decode results are alternately output to the data outputs N892 and N893.

According to the fourth embodiment and the modification of the fourth embodiment, the first and second data hold circuits are made up of NAND gates. Instead, the first and second data hold circuits may be made up of NOR gates. In this case, when the logics of inputs and outputs are inverted, the same operation may be performed.

According to the fourth embodiment and the modification of the fourth embodiment, the decoder 22 and the decoder 22' are made up of only ordinary digital circuits. Thus, it is not necessary to use a differentiation circuit that reproduces a clock and other circuits. As a result, the range of a decodable transmission speed becomes wide.

In addition, since encode data are input to a data hold circuit before they are sampled, the minimum inversion interval of a signal to be sampled becomes long. As a result, the timing margin increases. When the operation speeds of the logic circuits, the latch circuits, and so forth are the same, the maximum transmission band becomes wider. When the maximum transmission band is the same, the decoder can be made up of logic circuits that operate at lower speed. As a result, the power consumption and cost of the decoder can be reduced.

In addition, since intermediate latch circuits that latch outputs of data hold circuits that hold input data with a clock are disposed, the internal timing margin increases. As a result, regardless of whether the delays of combination logic circuits that are necessary to determine a state transition are large or small, the decode operation can be stably performed.

In addition, since three-bit three-stable latch circuits that keep stable in three states are used for data hold circuits that hold input data, an improper state transition due to noise or the like can be suppressed.

In addition, since inputs and outputs of data hold circuits that hold input data, inputs and outputs of combination logic circuits, and inputs and outputs of latch circuits are differential, a decrease of the timing margin due to internal asymmetry of the logic circuits and the latch circuits can be minimized. In this example, the internal asymmetry represents asymmetry of a leading time and a trailing time of a clock or asymmetry of a leading drive performance and a trailing drive performance of the clock.

5-3. Supplement of Fourth Embodiment of Present Invention

According to the fourth embodiment and the modification of the fourth embodiment, in the first and second data hold circuits, NAND type data hold circuits are used. Instead of NAND type data hold circuits, NOR type circuits may be used. In this case, when logics of inputs and outputs are inverted, the same operation as the NAND type data hold circuits may be performed.

The same operation as the first and second data hold circuits may be performed when a positive logic encode input is connected to an NAND type data hold circuit, a negative logic encode input is connected to an NOR type data hold circuit, and a data hold output is a differential output.

The same operation as the third to sixth combination logic circuit may be performed when they have differential inputs and the differential first and second data hold outputs are connected.

On the state transition charts, regardless of whether the third to sixth combination logic circuits detect an increase of a state number, a decrease of a state number, or both an increase and a decrease of state numbers, the same operation may be performed.

In addition, when latches or sense amplifiers that have both positive inputs and negative inputs are used as the first to third sequential logic circuits and the first to fourth latch circuits are used and they are connected to differential outputs of the combination logic circuits, the same operation may be performed.

The first latch circuit and the second latch circuit are made up of transparent latches. Instead, when the first and second latch circuits are made of three-state latch circuits, the same operation may be performed.

Instead, when the third latch circuit and the fourth latch circuit are omitted, a decode output is input to another module, and the module samples the decode data with a clock, the same operation may be performed. In addition, when the third latch circuit and the fourth latch circuit are replaced with edge trigger D flip-flop circuits or the like, the same operation may be performed.

When the differential receiver circuit disclosed by the applicant of the present invention as Japanese Patent No. 3360861 is connected to the decoder inputs N801 to N803 of the decoder according to the fourth embodiment and the modification of the fourth embodiment, three-value three-differential inputs may be performed.

It should be understood by those skilled in the art that various modifications, combinations, sub-combinations and alternations may occur depending on design requirements and other factors insofar as they are within the scope of the appended claims or the equivalents thereof.

What is claimed is:

1. An encoding apparatus that converts input digital data and an input clock into three-bit, six-state transition, encoded outputs, comprising:
  - first state transition control means for changing a state of first data at a positive edge of the input clock, the first state transition control means including means for latching three bits, the means for latching three bits including means for obtaining, based on an immediately preceding state, only three stable states as a three-bit output state;
  - second state transition control means for changing a state of second data at a negative edge of the input clock; and
  - output selection means for selecting, based on the positive edge and the negative edge of the input clock, the three-bit output state of the first state transition control means and the state of the second state transition control means for supplying the outputs.

2. An encoding apparatus that converts input digital data and an input clock into three-bit, six-state transition, encoded outputs, comprising:
  - a first state transition control section that changes a state of first data at a positive edge of the input clock,
  - the first state transition control section including
    - a first latch circuit that holds a state after the input clock goes high,
    - a second latch circuit that holds a state after the input clock goes low, and
    - a first combination logic circuit that decides input data of the first latch circuit corresponding to an output of the first latch circuit, an output of the second latch circuit, and the input digital data;
  - a second state transition control section that changes a state of second data at a negative edge of the input clock,
  - the second state transition control section including a second combination logic circuit that decides input data of the second latch circuit corresponding to the output of the second latch circuit and the input digital data; and
  - an output selection section that alternately selects the state of the first state transition control section and the second state transition control section and that selects one of an output of the first state transition control section and an output of the second state transition control section corresponding to a value of the input clock and generates the encoded outputs; wherein
  - the first combination logic circuit is composed of a first three-bit two-to-one multiplexer that selects a plurality of inputs corresponding to the first data, the first combination logic circuit decides a relationship between three-bit outputs and inputs of the first three-bit two-to-one multiplexer so that states are changed corresponding to a value of the first data when the second latch circuit is changed to a hold state, the second combination logic circuit is composed of a second three-bit two-to-one multiplexer that selects a plurality of inputs corresponding to the second data, and the second combination logic circuit decides a relationship between three-bit outputs and inputs of the second three-bit two-to-one multiplexer so that states are changed corresponding to a value of the second data when the first latch circuit is changed to a hold state.

3. An encoding apparatus that converts input digital data and an input clock into three-bit, six-state transition, encoded outputs, comprising:

a first state transition control section that changes a state of first data at a positive edge of the input clock, the first state transition control section includes a first latch circuit that holds a state after the input clock goes high;

a second latch circuit that holds a state after the input clock goes low; and a first combination logic circuit that decides input data of the first latch circuit corresponding to an output of the first latch circuit, an output of the second latch circuit, and the input digital data;

a second state transition control section that changes a state of second data at a negative edge of the input clock, the second state transition control section includes a second combination logic circuit that decides input data of the second latch circuit corresponding to the output of the second latch circuit and the input digital data;

an output selection section that selects, based on the positive edge and the negative edge of the input clock, the state of the first state transition control section and the second state transition control section to supply the outputs, the output selection section selects one of an output of the first state transition control section and an output of the second state transition control section corresponding to a value of the input clock and generates the encoded outputs; and a third combination logic circuit composed of a third three-bit two-to-one multiplexer that selects one of the first data and the second data with the input clock, wherein the third combination logic circuit alternately selects three-bit outputs of the first latch circuit and three-bit outputs of the second latch circuit with the value of the input clock to generate the encoded outputs.

4. An encoding apparatus that converts input digital data and an input clock into three-bit, six-state transition, encoded outputs, comprising:

a first state transition control section that changes a state of first data at a positive edge of the input clock, the first state transition control section including a three-bit latch, the three-bit latch including a three-stable sequential logic circuit having a three-bit output;

a second state transition control section that changes a state of second data at a negative edge of the input clock; and an output selection section that selects, based on the positive edge and the negative edge of the input clock, the three-bit output of the first state transition control section and the state of the second state transition control section to supply the outputs.

5. The encoding apparatus as set forth in claim 4, wherein the first state transition control section includes a first latch circuit that holds a state after the input clock goes high, the second state transition control section includes a second latch circuit that holds a state after the input clock goes low, the first state transition control section includes a first combination logic circuit that decides input data of the first latch circuit corresponding to an output of the first latch circuit, an output of the second latch circuit, and the input digital data, the second state transition control section includes a second combination logic circuit that decides input data of the second latch circuit corresponding to the output of the second latch circuit and the input digital data, and the output selection section generates the encoded outputs.

6. An encoding apparatus that converts input digital data and an input clock into three-bit, six-state transition, encoded outputs, comprising:

a first state transition control section that changes a state of first data at a positive edge of the input clock;

a second state transition control section that changes a state of second data at a negative edge of the input clock; and an output selection section that selects, based on the positive edge and the negative edge of the input clock, the state of the first state transition control section and the second state transition control section to supply the outputs, wherein the first state transition control section includes a first combination logic circuit that functions as a first three-bit two-to-one multiplexer, the second state transition control section includes a second combination logic circuit that functions as a second three-bit two-to-one multiplexer, the first state transition control section further includes a first latch circuit that receives an output of the first three-bit two-to-one multiplexer, holds a state after the positive edge of the input clock, and supplies an output to the second combination logic circuit, and a second latch circuit that receives an output of the second three-bit two-to-one multiplexer and holds a state after the negative edge of the input clock, and the first latch circuit and the second latch circuit output the state of the first state transition control section and the second state transition control section to the output selection section.

* * * * *